United States Patent
Lee

(10) Patent No.: US 9,257,656 B2
(45) Date of Patent: Feb. 9, 2016

(54) ORGANIC LIGHT-EMITTING DIODES

(71) Applicant: SAMSUNG DISPLAY CO., LTD., Yongin, Gyeonggi-Do (KR)

(72) Inventor: Jung-Sub Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 142 days.

(21) Appl. No.: 14/203,457

(22) Filed: Mar. 10, 2014

(65) Prior Publication Data

US 2014/0319485 A1 Oct. 30, 2014

(30) Foreign Application Priority Data

Apr. 25, 2013 (KR) .................. 10-2013-0046214

(51) Int. Cl.
*H01L 51/50* (2006.01)
*H01L 51/00* (2006.01)

(52) U.S. Cl.
CPC ........ *H01L 51/0072* (2013.01); *H01L 51/0067* (2013.01); *H01L 51/0071* (2013.01); *H01L51/0052* (2013.01); *H01L 51/0081* (2013.01); *H01L 51/0085* (2013.01); *H01L 51/5016* (2013.01); *H01L 2251/308* (2013.01)

(58) Field of Classification Search
None
See application file for complete search history.

(56) References Cited

U.S. PATENT DOCUMENTS

| 2011/0156014 A1 | 6/2011 | Kim et al. |
| 2012/0181518 A1 | 7/2012 | Ogiwara et al. |
| 2013/0200339 A1 | 8/2013 | Lee et al. |
| 2014/0001443 A1 | 1/2014 | Lee et al. |

FOREIGN PATENT DOCUMENTS

| JP | 2011-178742 | * | 9/2011 | .............. H01L 51/50 |
| JP | 2011-210873 A | | 10/2011 | |
| JP | 2012-156499 A | | 8/2012 | |
| KR | 10-2010-0024340 A | | 3/2010 | |
| KR | 10-2012-0021215 A | | 3/2012 | |
| KR | 10-2012-0052879 A | | 5/2012 | |
| KR | 10-2012-0092910 A | | 8/2012 | |
| KR | 10-2013-0091542 | | 8/2013 | |
| KR | 10-2014-0003259 | | 1/2014 | |
| WO | WO 2012/067425 A1 | * | 5/2012 | .............. H01L 51/54 |

OTHER PUBLICATIONS

Treibs; Jerusalem Symposia on Quantum Chemistry and Biochemistry, 1971, STN abstract.*

* cited by examiner

*Primary Examiner* — Gregory Clark

(74) *Attorney, Agent, or Firm* — Christie, Parker & Hale, LLP

(57) ABSTRACT

Provided is an organic light-emitting diode including a first electrode, a second electrode, and an organic layer between the first electrode and the second electrode, the organic layer including an emission layer and at least one first material represented by Formula 1 and at least one second material represented by Formula 2.
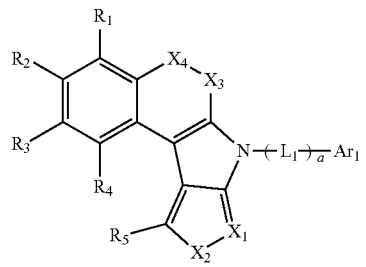
<Formula 1>
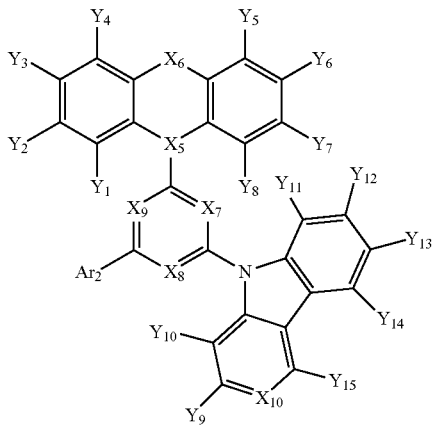
<Formula 2>
20 Claims, 1 Drawing Sheet

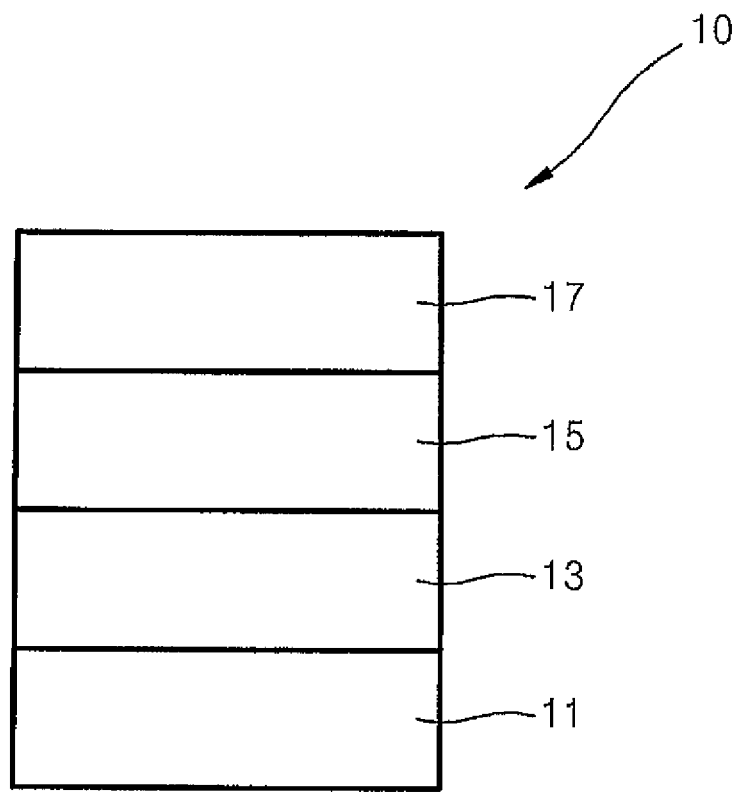

ORGANIC LIGHT-EMITTING DIODES

CROSS-REFERENCE TO RELATED APPLICATION

This application claims priority to and the benefit of Korean Patent Application No. 10-2013-0046214, filed on Apr. 25, 2013, in the Korean Intellectual Property Office, the disclosure of which is incorporated herein in its entirety by reference.

BACKGROUND

1. Field

Aspects of embodiments of the present invention relate to organic light-emitting diodes.

2. Description of the Related Art

Organic light-emitting diodes (OLEDs), which are self-emitting diodes, have advantages such as wide viewing angles, excellent contrast (e.g. high contrast), quick response, high brightness, excellent driving voltage characteristics (e.g. low driving voltage), and an ability to provide multicolored images.

A typical OLED has a structure that includes an anode, a hole transport layer (HTL), an emission layer (EML), an electron transport layer (ETL), and a cathode, which are sequentially stacked on a substrate. Herein, the HTL, the EML, and the ETL are organic thin films formed of organic compounds.

An operating principle of an exemplary OLED having the above-described structure is as follows:

When a voltage is applied between the anode and the cathode, electron holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY

One or more aspects of embodiments of the present invention are directed towards high definition organic light-emitting diodes.

According to an embodiment of the present invention, an organic light-emitting diode includes a first electrode, a second electrode, an organic layer between the first electrode and the second electrode, the organic layer including at least one first material represented by Formula 1 and at least one second material represented by Formula 2.

<Formula 1>

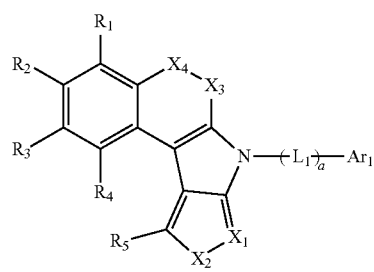

<Formula 2>

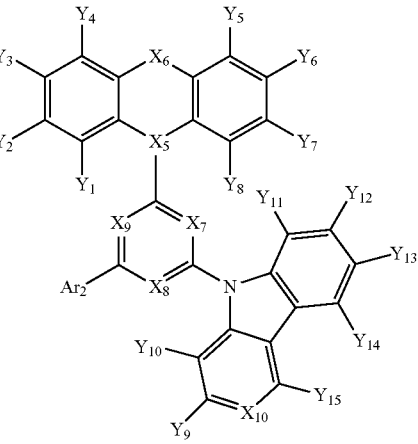

in Formulae 1 and 2:

$X_1$ is selected from $CR_{11}$ and N;

$X_2$ is selected from $C(R_{12})(R_{13})$, $NR_{14}$, S, and O;

$X_3$ and $X_4$ are each independently selected from $CR_{15}$ and N;

$R_1$ to $R_5$ and $R_{11}$ to $R_{15}$ are each independently selected from a hydrogen atom (a protium atom), a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, and a substituted or unsubstituted $C_2$-$C_{30}$ heteroaryl group;

$Ar_1$ is selected from a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, —$N(Q_1)(Q_2)$, and —$Si(Q_3)(Q_4)(Q_5)$ (where $Q_1$ to $Q_5$ are each independently selected from a hydrogen atom, a deuterium atom, a halogen atom, a hydroxyl group, a cyano group, an amino group, a nitro group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_2$-$C_{30}$ heteroaryl group);

$L_1$ is selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene, a substituted or unsubstituted $C_2$-$C_{10}$ heterocycloalkenylene, a substituted or unsubstituted $C_6$-$C_{60}$ arylene group, and a substituted or unsubstituted $C_2$-$C_{60}$ heteroarylene group;

a is an integer from 0 to 3;

X5 is N and X6 is selected from O and S;

$X_7$, $X_8$ and $X_9$ are each independently selected from N, O, S and $C(R_{20})$;

$X_{10}$ is selected from N and $C(R_{21})$;

$Y_1$ to $Y_{15}$, $R_{20}$, and $R_{21}$ are each independently selected from a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, and a substituted or unsubstituted $C_2$-$C_{30}$ heteroaryl group;

$Ar_2$ is selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{30}$ aryl group and a substituted or unsubstituted $C_2$-$C_{30}$ heteroaryl group; and $Y_{15}$ and $R_{21}$ may be connected with each other to form a ring.

BRIEF DESCRIPTION OF THE DRAWINGS

The accompanying drawings, together with the specification, illustrate embodiments of the present invention, and, together with the description, serve to explain the principles of the present invention.

The drawing is a schematic view of an organic light-emitting diode according to one or more embodiments of the present invention.

DETAILED DESCRIPTION

In the following detailed description, only certain embodiments of the present invention are shown and described, by way of illustration. As those skilled in the art would recognize, the invention may be embodied in many different forms and should not be construed as being limited to the embodiments set forth herein.

In the context of the present application, when a first element is referred to as being "on" a second element, it can be directly on the second element or it can be indirectly on the second element with one or more intervening elements interposed therebetween.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

As used herein, the expression "(organic layer) includes at least one first material represented by Formula 1" may be construed as "(organic layer) includes one kind of first material in the category of Formula 1 or two or more of kinds of first materials that are different from each other in the category of Formula 1".

As used herein, the expression "organic layer" refers to a single layer and/or multiple layers located between a first electrode and a second electrode in an organic light-emitting diode.

In the context of the present invention, "hydrogen atom" refers to a "protium atom".

An organic light-emitting diode, according to one embodiment, includes a first electrode, a second electrode, and an organic layer between the first electrode and the second electrode, the organic layer including an emission layer (EML), at least one first material represented by Formula 1 and at least one second material represented by Formula 2:

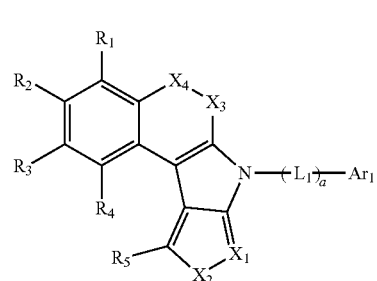

<Formula 1>

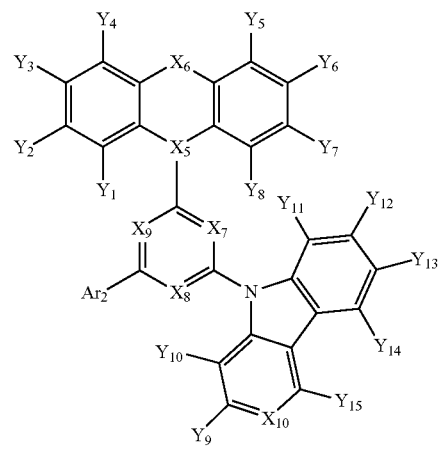

<Formula 2> in Formulae 1 and 2:

$X_1$ is selected from $CR_{11}$ and N;

$X_2$ is selected from $C(R_{12})(R_{13})$, $NR_{14}$, S, and O;

$X_3$ and $X_4$ are each independently selected from $CR_{15}$ and N;

$R_1$ to $R_5$ and $R_{11}$ to $R_{15}$ are each independently selected from a hydrogen atom (a protium atom), a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, and a substituted or unsubstituted $C_2$-$C_{30}$ heteroaryl group;

$Ar_1$ is selected from a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, —N($Q_1$)($Q_2$), and —Si($Q_3$)($Q_4$)($Q_5$);

$Q_1$ to $Q_5$ are each independently selected from a hydrogen atom, a deuterium atom, a halogen atom, a hydroxyl group, a cyano group, an amino group, a nitro group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_2$-$C_{30}$ heteroaryl group;

$L_1$ is selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene, a substituted or unsubstituted $C_2$-$C_{10}$ heterocycloalkenylene, a substituted or unsubstituted $C_6$-$C_{60}$ arylene group, and a substituted or unsubstituted $C_2$-$C_{60}$ heteroarylene group;

a is an integer from 0 to 3;

X5 is N and X6 is selected from O and S;

$X_7$, $X_8$, and $X_9$ are each independently selected from N, O, S, and C($R_{20}$);

$X_{10}$ is selected from N and C($R_{21}$); $Y_1$ to $Y_{15}$, $R_{20}$, and $R_{21}$ are each independently selected from a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, and a substituted or unsubstituted $C_2$-$C_{30}$ heteroaryl group;

$Ar_2$ is selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{30}$ aryl group, and a substituted or unsubstituted $C_2$-$C_{30}$ heteroaryl group; and $Y_{15}$ and $R_{21}$ may be connected with each other to form a ring, but Formulae 1 and 2 are not limited thereto.

In one embodiment, in Formulae 1 and 2, $R_1$ to $R_5$ and $R_{11}$ to $R_{15}$ are each independently selected from a hydrogen atom, a deuterium atom, a halogen atom, a hydroxyl group, a cyano group, a nitro group, a substituted or unsubstituted $C_1$-$C_{30}$ alkyl group, a substituted or unsubstituted $C_6$-$C_{30}$ aryl group, and a substituted or unsubstituted $C_2$-$C_{30}$ heteroaryl group; but embodiments of the invention are not limited thereto.

In another embodiment, in Formula 1 and Formula 2, $R_1$ to $R_5$ and $R_{11}$ to $R_{15}$ are each independently selected from a hydrogen atom, a deuterium atom, —F, a cyano group, a nitro group, a substituted or unsubstituted methyl group, a substituted or unsubstituted ethyl group, a substituted or unsubstituted propyl group, a substituted or unsubstituted butyl group, a substituted or unsubstituted phenyl group, a substituted or unsubstituted biphenyl group, a substituted or unsubstituted naphthyl group, a substituted or unsubstituted anthryl group, a substituted or unsubstituted phenanthrenyl group, a substituted or unsubstituted pyrenyl group, a substituted or unsubstituted indolyl group, a substituted or unsubstituted indenyl group, a substituted or unsubstituted fluorenyl group, and a substituted or unsubstituted carbazolyl group; but embodiments of the invention are not limited thereto.

In yet another embodiment, $R_1$ to $R_5$ and $R_{11}$ to $R_{15}$ are each independently selected from a hydrogen atom and a deuterium atom; but embodiments of the invention are not limited thereto.

In one embodiment, in Formulae 1 and 2, $Ar_1$ is selected from a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_2$-$C_{30}$ heteroaryl group, and —Si($Q_3$)($Q_4$)($Q_5$)(where, $Q_3$ to $Q_5$ are each independently selected from a substituted or unsubstituted $C_1$-$C_{30}$ alkyl group, a substituted or unsubstituted $C_6$-$C_{30}$ aryl group, and a substituted or unsubstituted $C_2$-$C_{30}$ heteroaryl group); but embodiments of the invention are not limited thereto.

In another embodiment, in Formula 1, $Ar_1$ is selected from a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzopuranyl group, a substituted or unsubstituted dibenzothiophenyl group, a substituted or unsubstituted benzocarbazolyl group, and —Si($Q_3$)($Q_4$)($Q_5$) (where, $Q_3$ to $Q_5$ are each independently selected from a substituted or unsubstituted $C_6$-$C_{30}$ aryl group); but embodiments of the invention are not limited thereto.

In another embodiment, in Formula 1, $Ar_1$ is selected from:

a phenanthrenyl group, a triphenylenyl group, a carbazolyl group, a benzoimidazole group, a dibenzothiophenyl group, and —Si($Q_3$)($Q_4$)($Q_5$) (where, $Q_3$ to $Q_5$ are each independently a phenyl group), and a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid or a salt thereof, a $C_1$-$C_{10}$ alkyl group, and a $C_1$-$C_{10}$ alkoxy group, a $C_1$-$C_{10}$ alkyl group and a $C_1$-$C_{10}$ alkoxy group, each substituted with at least one selected from a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, and a phosphoric acid or a salt thereof, a phenyl group, a naphthyl group, a fluorenyl group, a phenanthrenyl group, an anthryl group, a pyrenyl group, and a chrysenyl group, a phenyl group, a naphthyl group, a fluorenyi group, a phenanthrenyl group, an anthryl group, a pyrenyl group, and a chrysenyl group, each substituted with at least one selected from a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid or a salt thereof, a $C_1$-$C_{10}$ alkyl group, and a $C_1$-$C_{10}$ alkoxy group, an indolyl group, a benzoimidazolyl group, a carbazolyl group, an imidazolyl group, an imidazolinyl group, an imidazopyridinyl group, an imidazopyrimidinyl group, a pyridinyl group, a pyrimidinyl group, a triazinyl group, and a quinolinyl group, and a phenanthrenyl group, a triphenylenyl group, a carbazolyl group, a benzoimidazole group, a dibenzothiophenyl group, and —Si($Q_3$)($Q_4$)($Q_5$) (where, $Q_3$ to $Q_5$ are each independently a phenyl group), each substituted with at least one selected from an indolyl group, a benzoimidazolyl group, a carbazolyl group, an imidazolyl group, an imidazolinyl group, an imidazopyridinyl group, an imidazopyrimidinyl group, a pyridinyl group, a pyrimidinyl group, a triazinyl group, and a quinolinyl group, each substituted with at least one selected from a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid or a salt thereof, a $C_1$-$C_{10}$ alkyl group, a $C_1$-$C_{10}$ alkoxy group, a phenyl group, and a naphthyl group; but embodiments of the invention are not limited thereto.

In one embodiment, in Formula 1, $Ar_1$ is selected from a group represented by Formulae 8-1 to 8-20, but embodiments of the invention are not limited thereto:

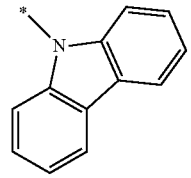

8-1

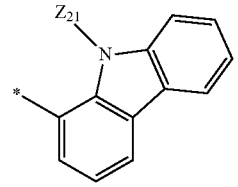

8-2

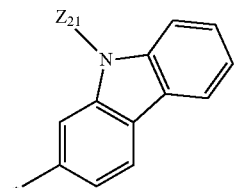

8-3

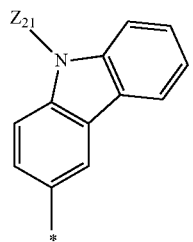

8-4

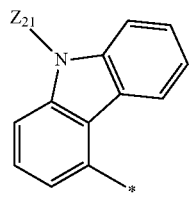

8-5

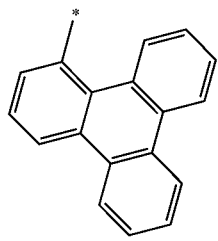

8-6

8-7
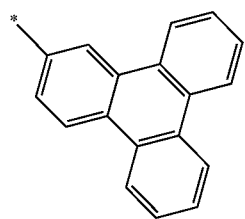

8-8
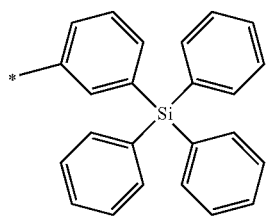

8-9
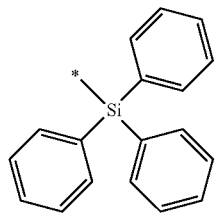

8-10
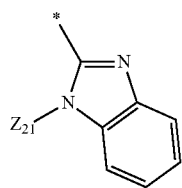

8-11
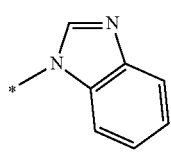

8-12
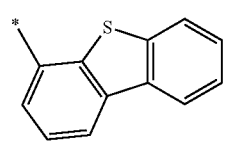

8-13
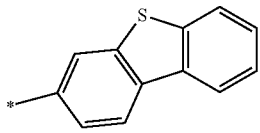

8-14
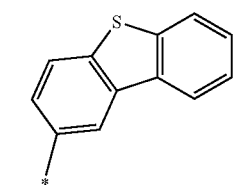

8-15
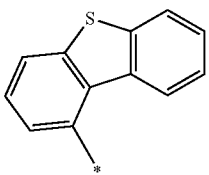

8-16
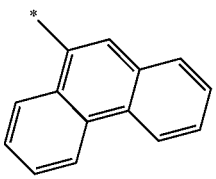

8-17
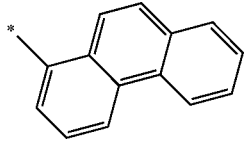

8-18
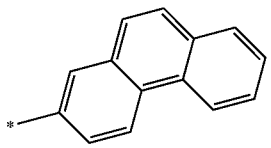

8-19
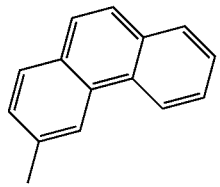

8-20
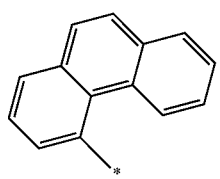

In Formulae 8-1 to 8-20:

$Z_{21}$ is selected from a phenyl group, a naphthyl group, a fluorenyl group, a phenanthrenyl group, and an anthryl group, and

* is a binding site to $L_1$.

In one embodiment, in Formula 1, $L_1$ is selected from a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphtylene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzopuranylene group, a substituted or unsubstituted dibenzothiophenylene group, and a substituted or unsubstituted benzocarbazolylene group; but embodiments of the invention are not limited thereto.

In another embodiment, in Formula 1, is selected from:
a phenylene group and a pyrimidinylene group, and
a phenylene group and a pyrimidinylene group, each substituted with at least one selected from a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid or a salt thereof, and a $C_1$-$C_{10}$ alkyl group,
a $C_1$-$C_{10}$ alkyl group substituted with at least one selected from a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, and a phosphoric acid or a salt thereof;
a $C_6$-$C_{16}$ aryl group and a $C_2$-$C_{16}$ heteroaryl group; and
a $C_6$-$C_{16}$ aryl group and a $C_2$-$C_{16}$ heteroaryl group, each substituted with at least one selected from a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, and a $C_2$-$C_{16}$ heteroaryl group.

In Formula 1, a denotes the number of $L_1$s, and a may be an integer from 1 to 2, but a is not limited thereto. When a is an integer of 2, two or more $L_1$ groups may be the same or different.

In one embodiment, in Formula 1, a moiety represented by *-$(L_1)_a$-** (where, * is a binding site to a corresponding N and ** is a binding site to $Ar_1$) is selected from a group represented by Formulae 9-1 to 9-17, but embodiments of the invention are not limited thereto:

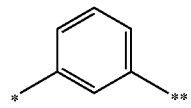

9-1

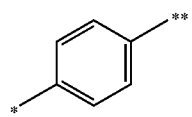

9-2

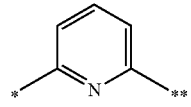

9-3

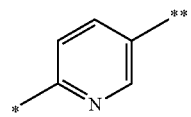

9-4

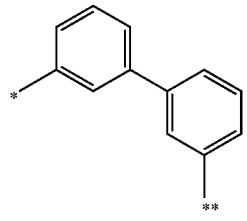

9-5

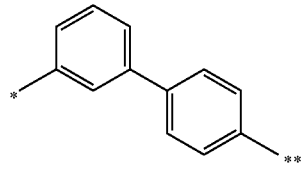

9-6

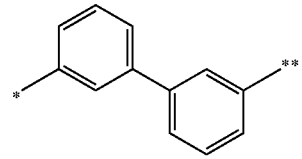

9-7

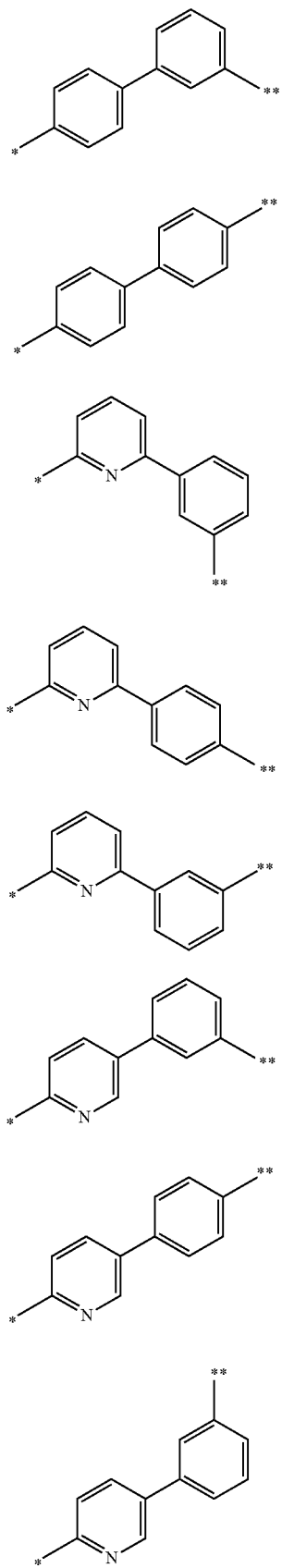

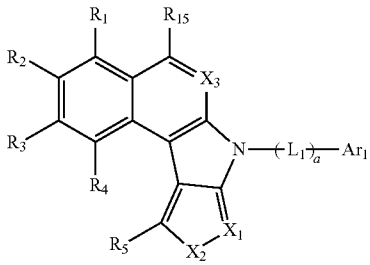

In one embodiment, the first material is represented by Formula 1a below, but embodiments of the invention are not limited thereto:

<Formula 1a>

In Formula 1a:
$X_1$ is selected from $CR_{11}$ and N;
$X_2$ is selected from $C(R_{12})(R_{13})$, $NR_{14}$, S, and O;
$X_3$ and $X_4$ are each independently selected from $CR_{15}$ and N;
$R_1$ to $R_5$ and $R_{15}$ are each independently selected from a hydrogen atom, a deuterium atom, —F, a cyano group, a nitro group, a substituted or unsubstituted methyl group, a substituted or unsubstituted ethyl group, a substituted or unsubstituted propyl group, a substituted or unsubstituted butyl group, a substituted or unsubstituted phenyl group, a substituted or unsubstituted biphenyl group, a substituted or unsubstituted naphthyl group, a substituted or unsubstituted anthryl group, a substituted or unsubstituted phenanthrenyl group, a substituted or unsubstituted pyrenyl group, a substituted or unsubstituted indolyl group, a substituted or unsubstituted indenyl group, a substituted or unsubstituted fluorenyl group, and a substituted or unsubstituted carbazolyl group;
$Ar_1$ is selected from a group represented by Formulae 8-1 to 8-20; and
a moiety represented by *-$(L_1)_a$-** (where, * is a binding site to a corresponding N and ** is a binding site to $Ar_1$) is selected from a group represented by Formulae 9-1 to 9-17.

In some embodiments, the first material is represented by any one selected from Formulae 1b to 1e, but embodiments of the invention are not limited thereto:

<Formula 1b>

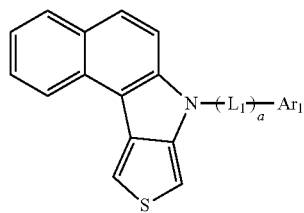

<Formula 1c>

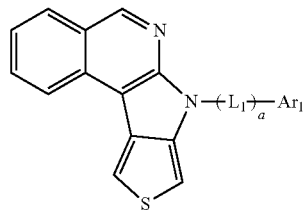

<Formula 1d>

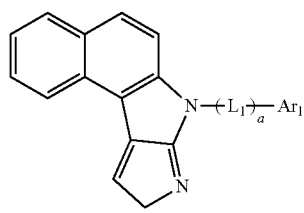

<Formula 1e>

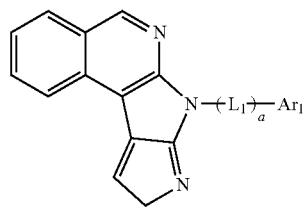

In Formulae 1b to 1e:

$Ar_1$ is selected from a group represented by Formulae 8-1 to 8-20; and a moiety represented by *-$(L_1)_a$-** (where, * is a binding site to a corresponding N and ** is a binding site to $Ar_1$) is selected from a group represented by Formulae 9-1 to 9-17.

In one embodiment, the first material is selected from Compounds 1 to 48 below, but embodiments of the invention are not limited thereto:

1

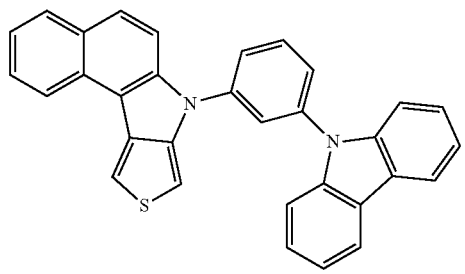

2

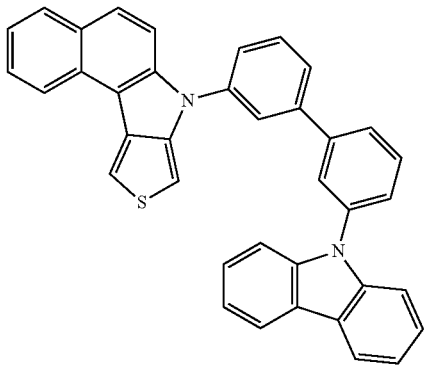

3

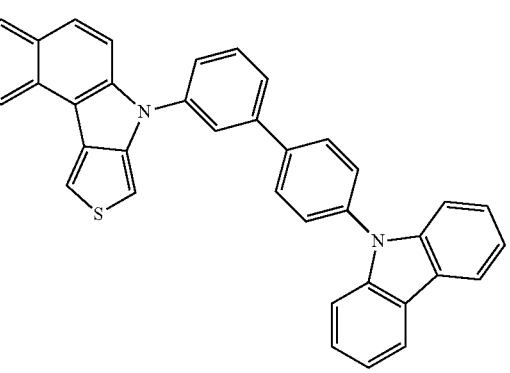

4

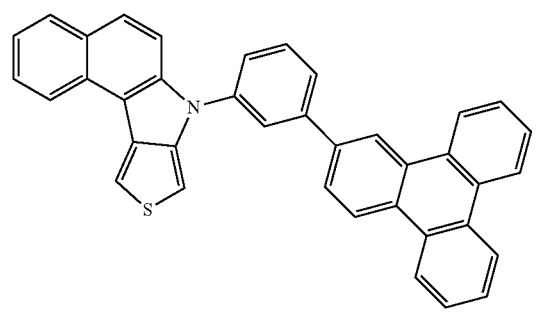

5

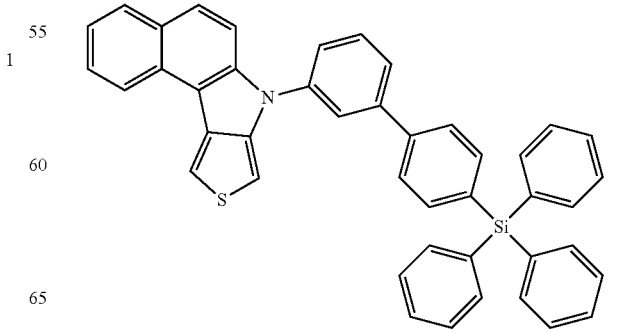

17
-continued
6
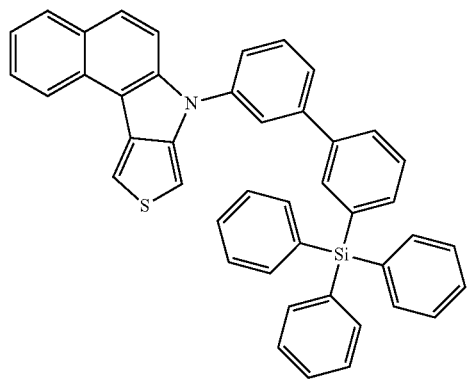
7
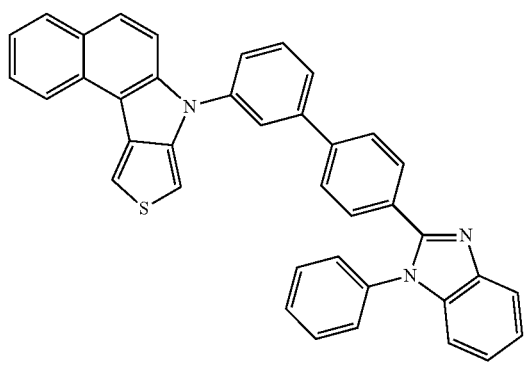
8
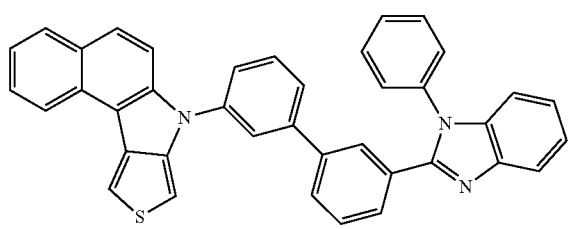
9
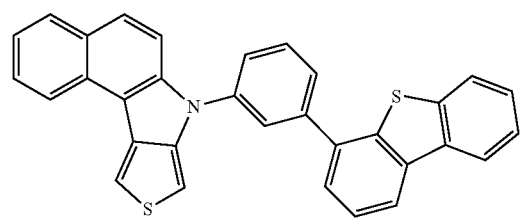
10
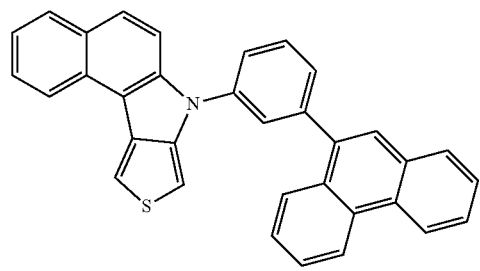
18
-continued
11
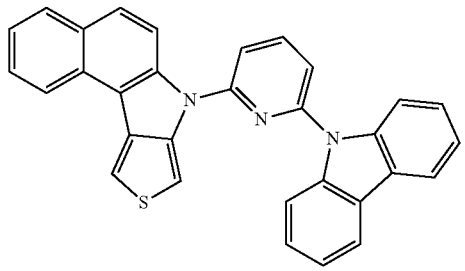
12
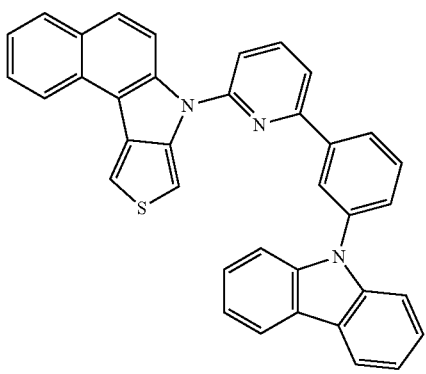
13
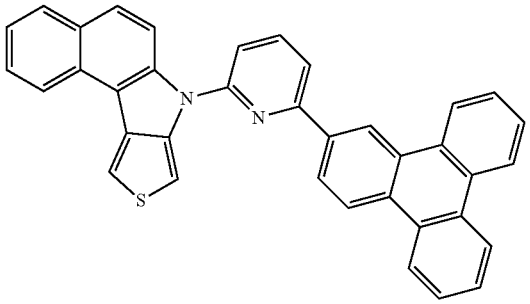
14
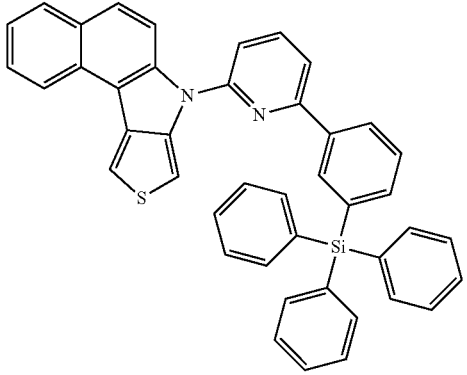

15
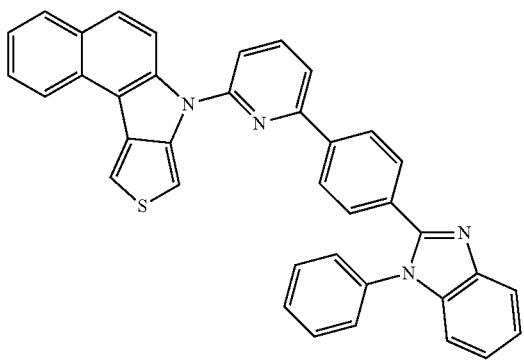
16
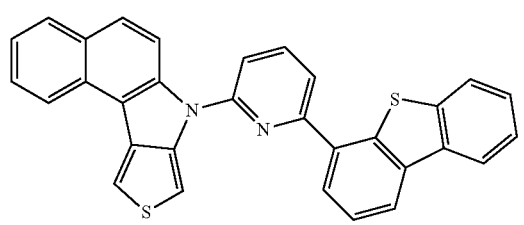
17
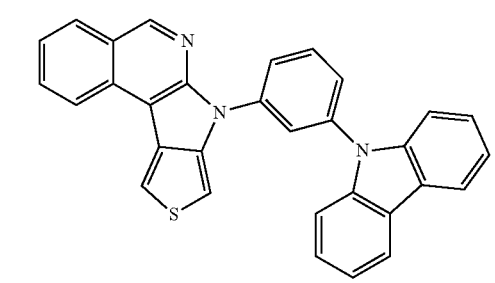
18
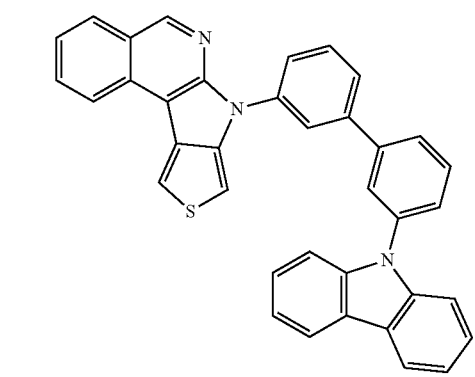
19
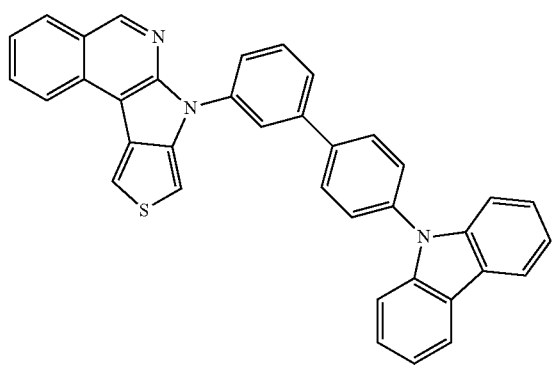
20
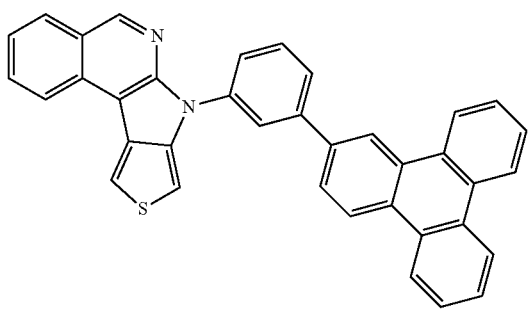
21
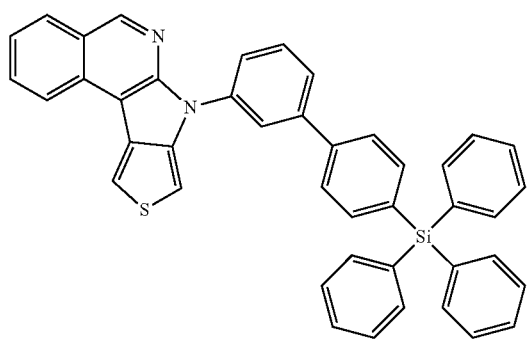
22
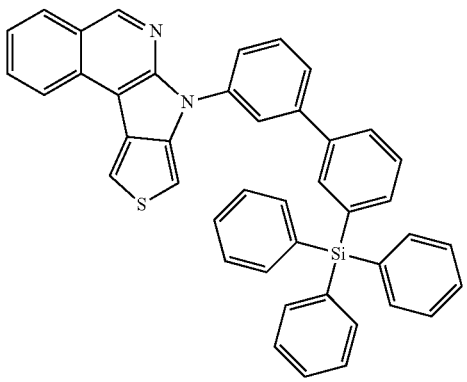
23
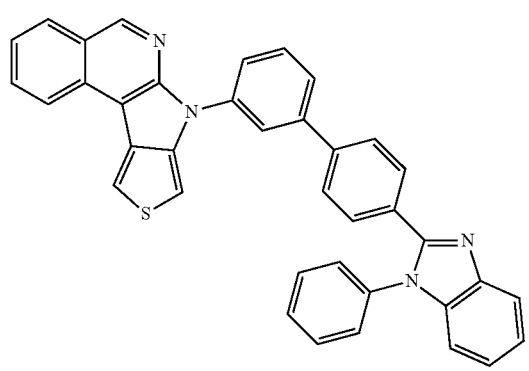

21
-continued
24
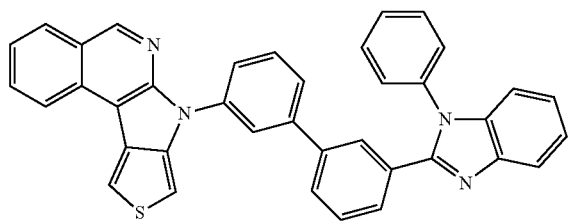
25
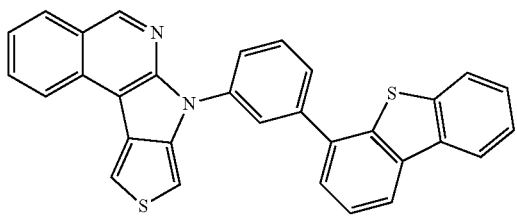
26
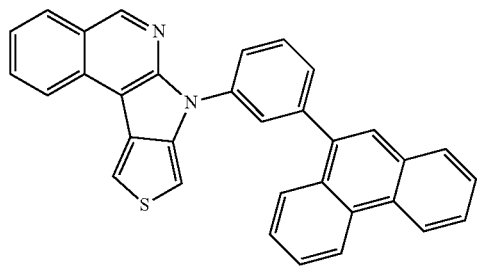
27
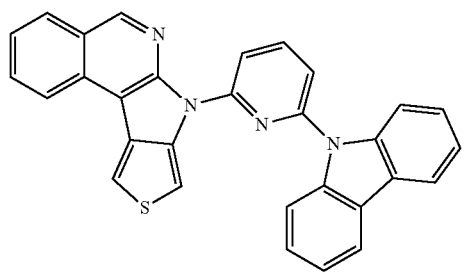
28
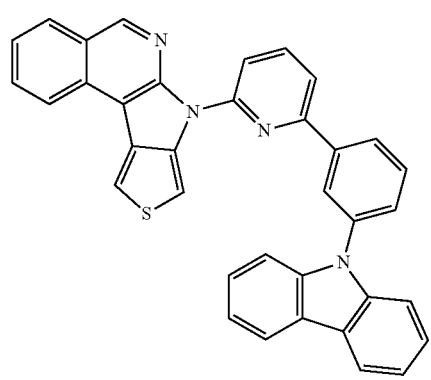
22
-continued
29
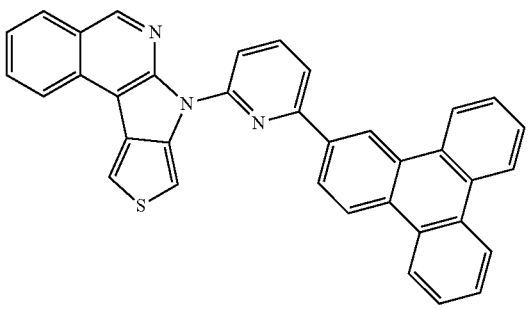
30
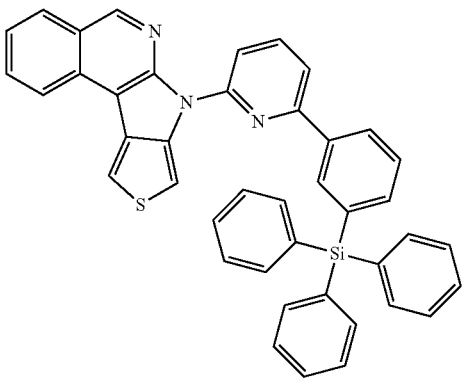
31
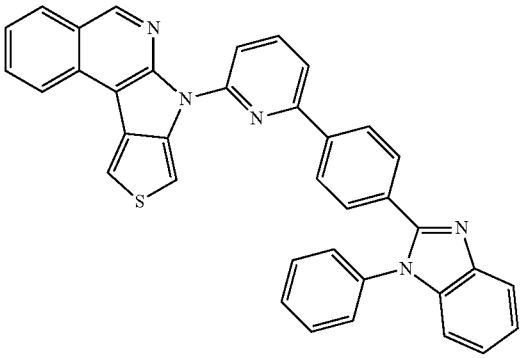
32
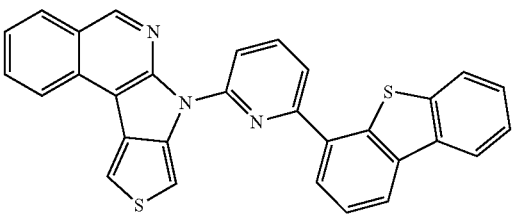
33
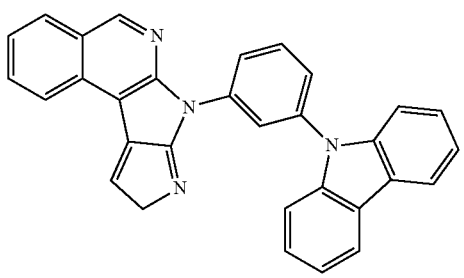

-continued
34
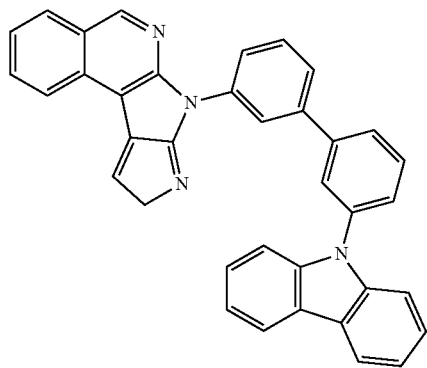
35
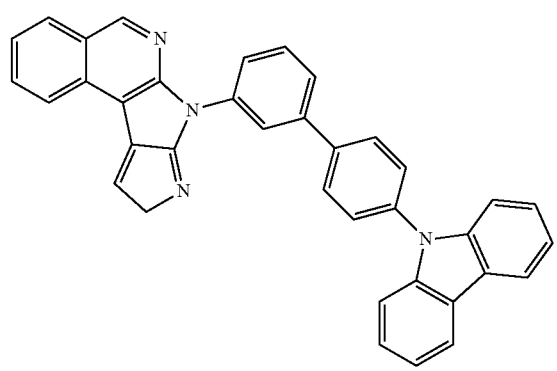
36
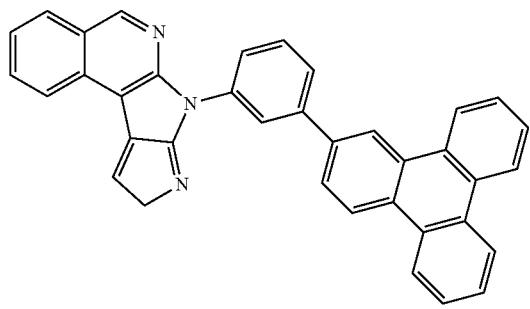
37
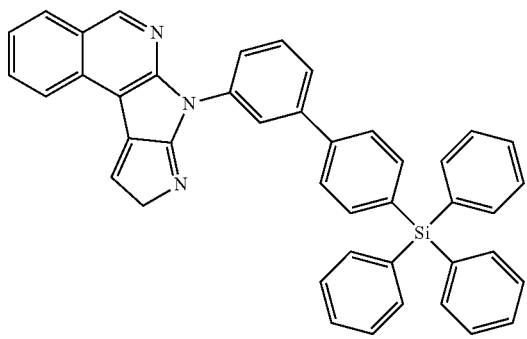
-continued
38
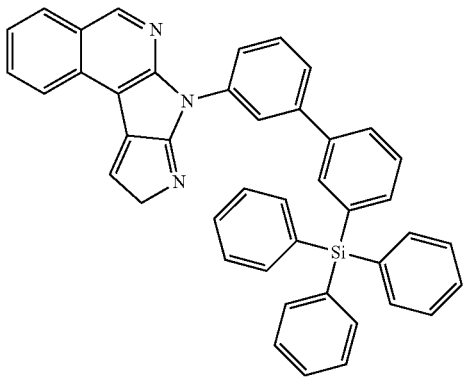
39
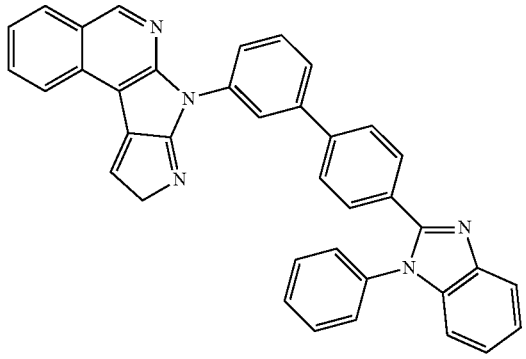
40
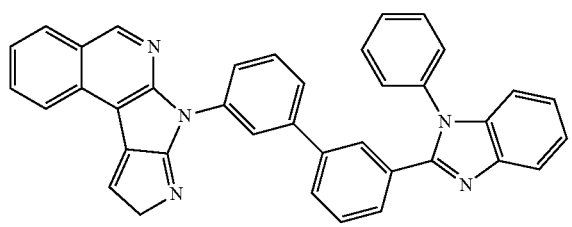
41
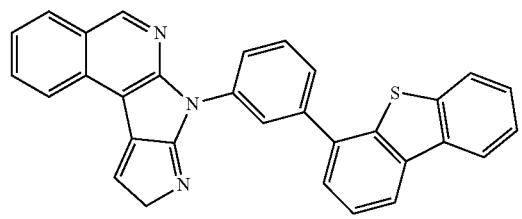
42
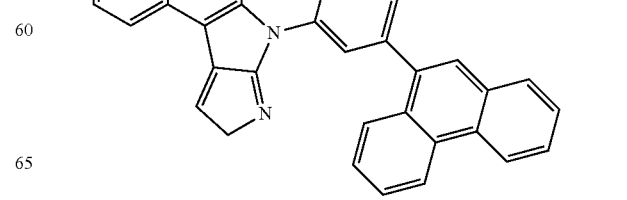

43
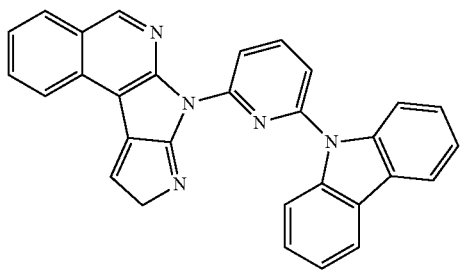

44
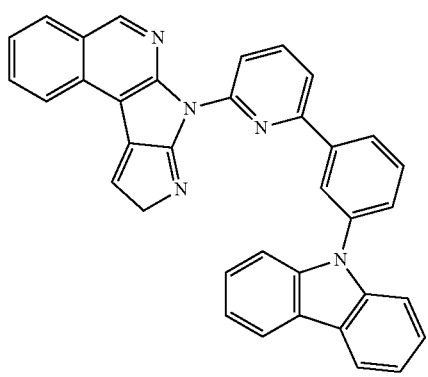

45
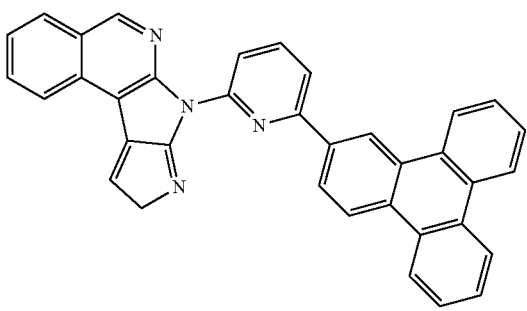

46
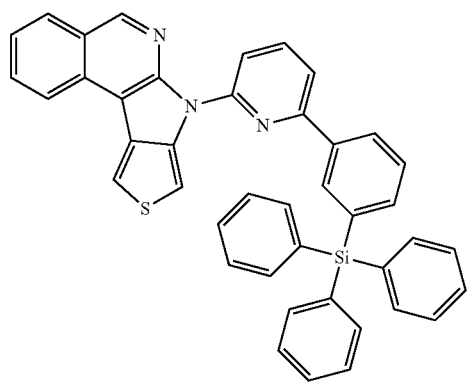

47
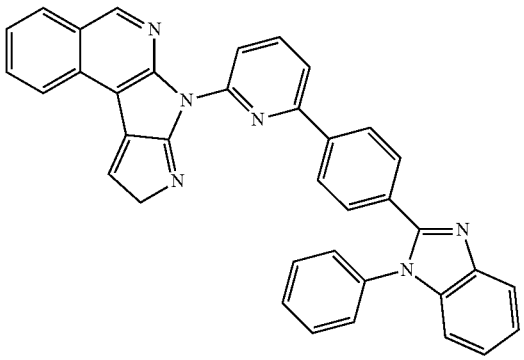

48
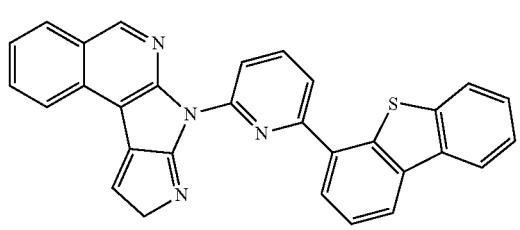

In some embodiments, in Formula 2, Ar$_2$ is selected from a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted isoquinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzopuranyl group, a substituted or unsubstituted dibenzothiophenyl group, and a substituted or unsubstituted benzocarbazolyl group; but embodiments of the invention not limited thereto.

In another embodiment, in Formula 2, $Ar_2$ is selected from:
  a phenyl group, a naphthyl group, a phenanthrenyl group, a pyrenyl group, a pyridyl group, a pyrimidinyl group, a quinolinyl group, and an isoquinolinyl group; and
  a phenyl group, a naphthyl group, a phenanthrenyl group, a pyrenyl group, a pyridyl group, a pyrimidyl group, a quinolinyl group, and an isoquinolinyl group, each substituted with at least one selected from:
    a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid or a salt thereof, a $C_1$-$C_{10}$ alkyl group, and a $C_1$-$C_{10}$ alkoxy group;
    a $C_1$-$C_{10}$ alkyl group and a $C_1$-$C_{10}$ alkoxy group, each substituted with at least one selected from a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, and a phosphoric acid or a salt thereof;
    a phenyl group, a naphthyl group, a fluorenyl group, a phenanthrenyl group, an anthryl group, a pyrenyl group, and a chrysenyl group;
    a phenyl group, a naphthyl group, a fluorenyl group, a phenanthrenyl group, an anthryl group, a pyrenyl group, and a chrysenyl group, each substituted with at least one selected from a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid or a salt thereof, a $C_1$-$C_{10}$ alkyl group, and a $C_1$-$C_{10}$ alkoxy group;
    an indolyl group, a benzoimidazolyl group, a carbazolyl group, an imidazolyl group, an imidazolinyl group, an imidazopyridinyl group, an imidazopyrimidinyl group, a pyridinyl group, a pyrimidinyl group, a triazinyl group, and a quinolinyl group; and
    an indolyl group, a benzoimidazolyl group, a carbazolyl group, an imidazolyl group, an imidazolinyl group, an imidazopyridinyl group, an imidazopyrimidinyl group, a pyridinyl group, a pyrimidinyl group, a triazinyl group, and a quinolinyl group, each substituted with at least one selected from a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid or a salt thereof, a $C_1$-$C_{10}$ alkyl group, a $C_1$-$C_{10}$ alkoxy group, a phenyl group, and a naphthyl group; but embodiments of the invention are not limited thereto.

In another embodiment, in Formula 2, $Ar_2$ is selected from a naphthyl group, a phenanthrenyl group, a pyrenyl group, a pyridyl group, a pyrimidyl group, a quinolinyl group, and an isoquinolinyl group, but embodiments of the invention are not limited thereto.

In one embodiment, in Formula 2, $Ar_2$ is at least one compound selected from a group represented by Formulae 10-1 to 10-8, but embodiments of the invention are not limited thereto:

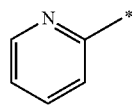
10-1

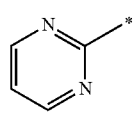
10-2

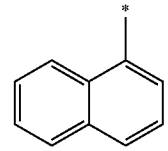
10-3

10-4

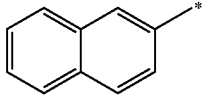
10-5

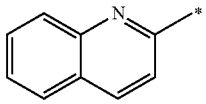
10-6

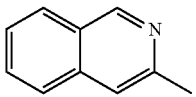
10-7

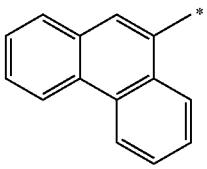
10-8

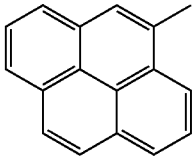

In one embodiment, in Formula 2, $Y_1$ to $Y_8$ are each independently selected from a hydrogen atom and a deuterium atom, but embodiments of the invention are not limited thereto.

In one embodiment, in Formula 2, $Y_9$ to $Y_{15}$, $R_{20}$, and $R_{21}$ are each independently selected from a hydrogen atom, a deuterium atom, and a substituted or unsubstituted a $C_6$-$C_{60}$ aryl group, but embodiments of the invention are not limited thereto.

In another embodiment, in Formula 2, $Y_9$ to $Y_{15}$, $R_{20}$, and $R_{21}$ are each independently selected from a hydrogen atom, a deuterium atom, and a phenyl group, but embodiments of the invention are not limited thereto.

In one embodiment, in Formula 2, a moiety represented by

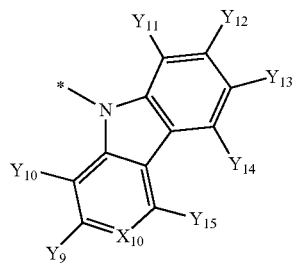

(where * is a binding site to a ring including $X_7$ to $X_9$) is at least one compound selected from a group represented by Formulae 11-1 to 11-3, but embodiments of the invention are not limited thereto:

11-1

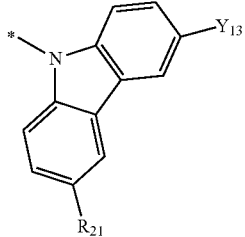

11-2

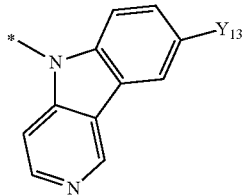

11-3

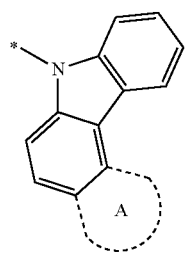

In Formulae 11-1 to 11-3, $Y_{13}$ and $R_{21}$ may be each independently selected from a hydrogen atom, a deuterium atom, and a phenyl group; and ring A may be selected from benzene, naphthalene, and anthracene.

In one embodiment, the second material is at least one compound selected from a group represented by Formulae 2a to 2d, but embodiments of the invention are not limited thereto:

<Formula 2a>

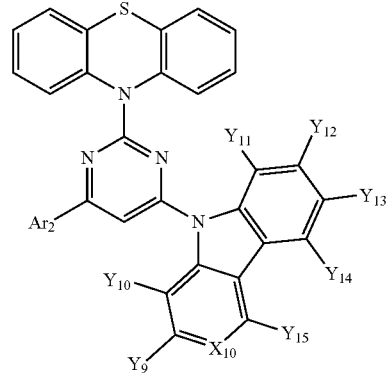

<Formula 2b>

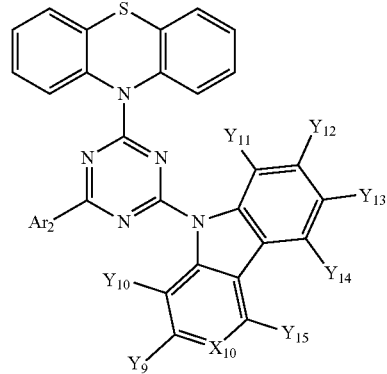

<Formula 2c>

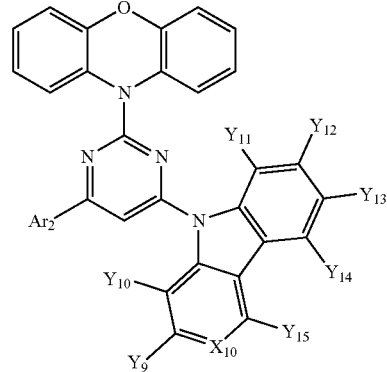

<Formula 2d>

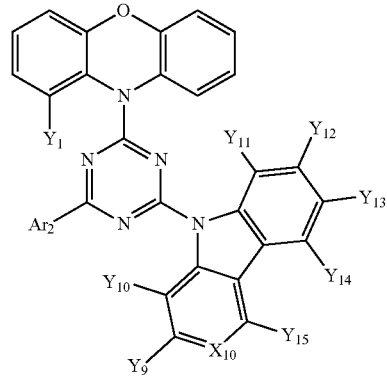

in Formulae 2a to 2d:

Ar₂ is selected from a group represented by Formulae 10-1 to 10-8; and a moiety represented by

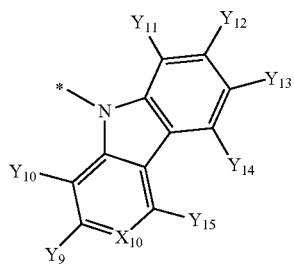

(where * is a binding site to a ring including X₇ to X₉) is selected from a group represented by Formulae 11-1 to 11-3:

11-1

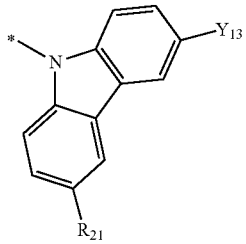

11-2

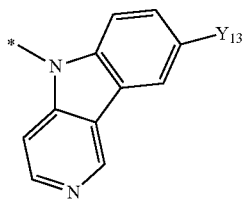

11-3

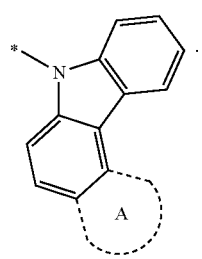

in Formulae 11-1 to 11-3, $Y_{13}$ and $R_{21}$ are each independently selected from a hydrogen atom, a deuterium atom, and a phenyl group; and ring A is selected from benzene, naphthalene, and anthracene.

In one embodiment, the second material is selected from Compounds 49 to 82, but embodiments of the invention are not limited thereto:

49

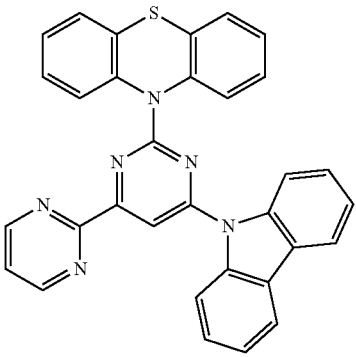

50

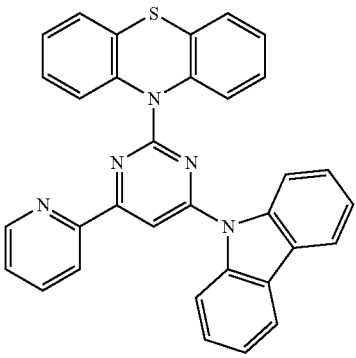

51

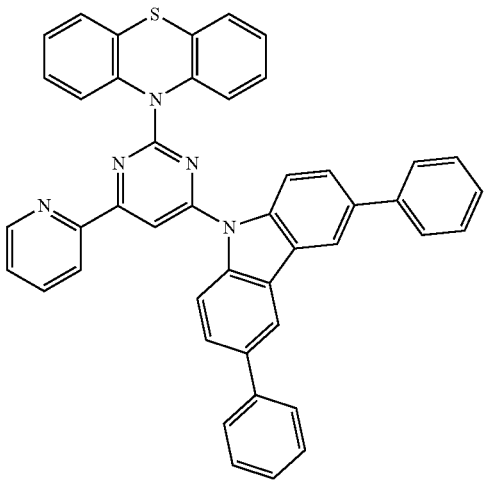

52

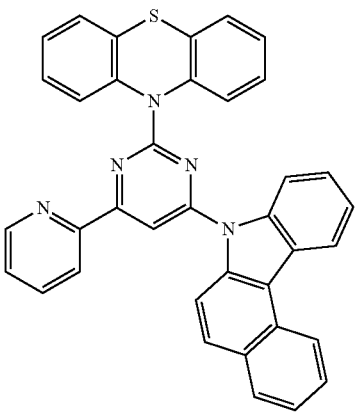

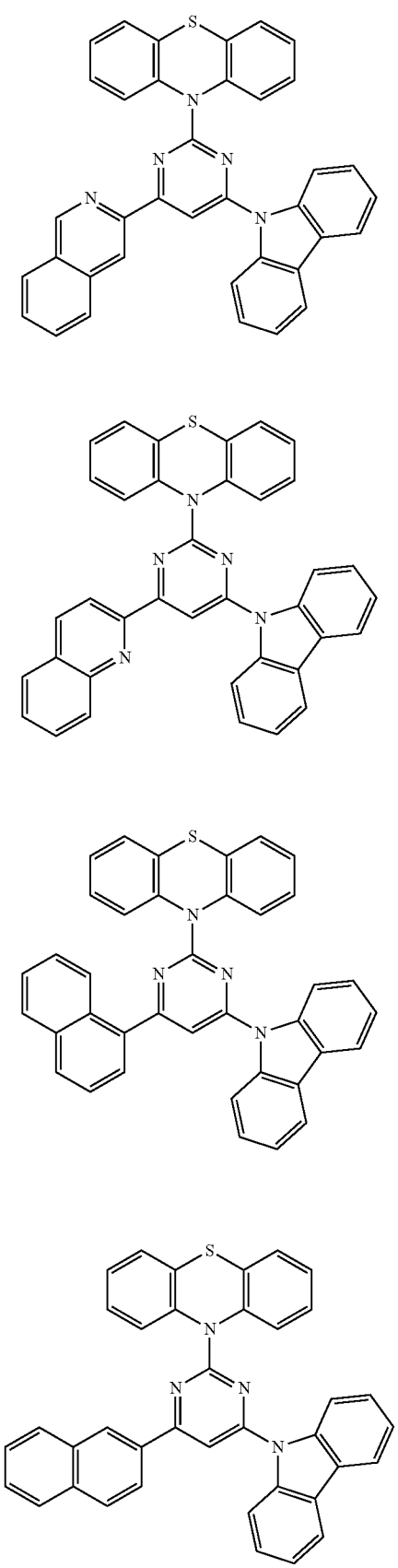
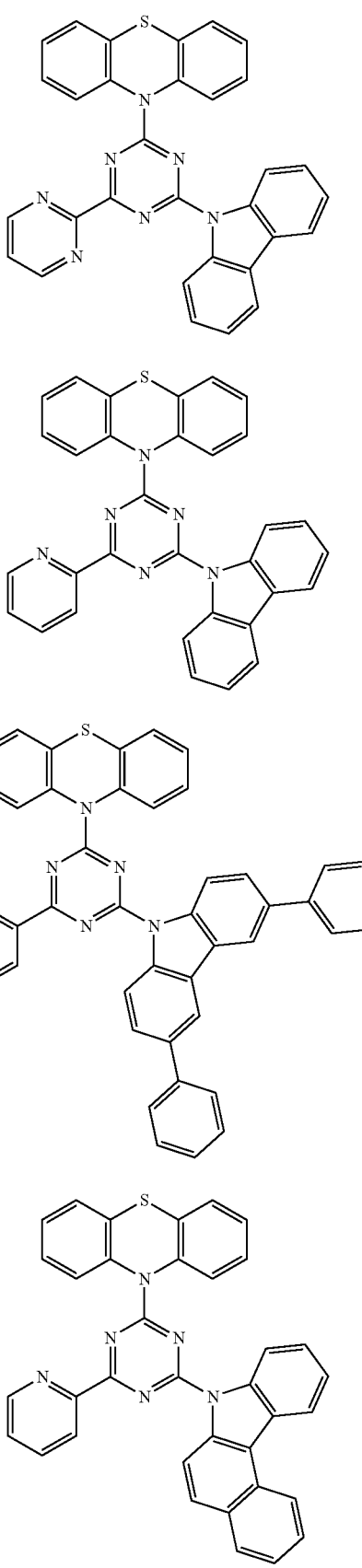

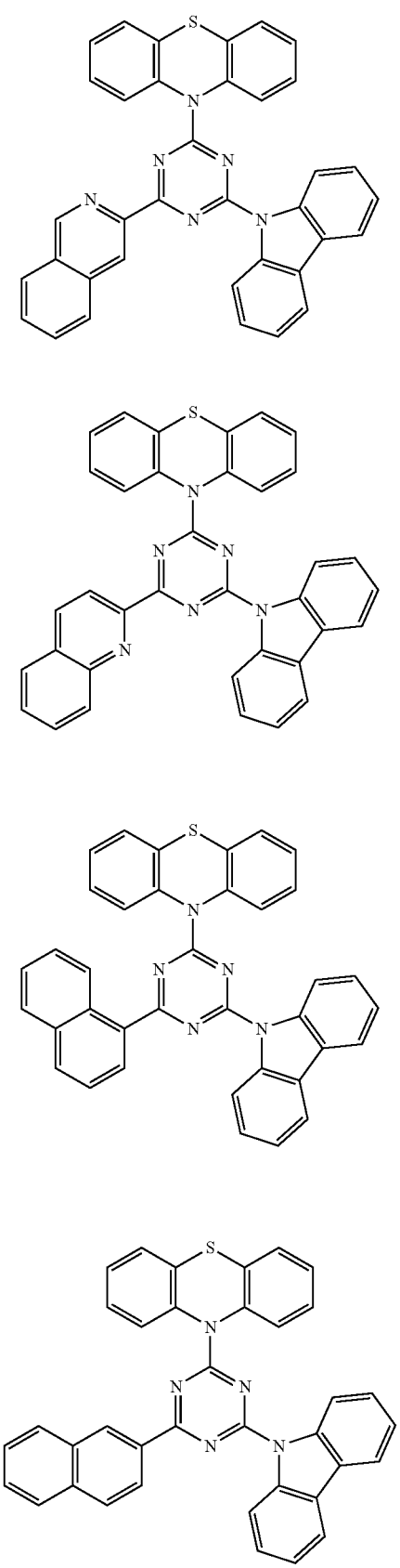
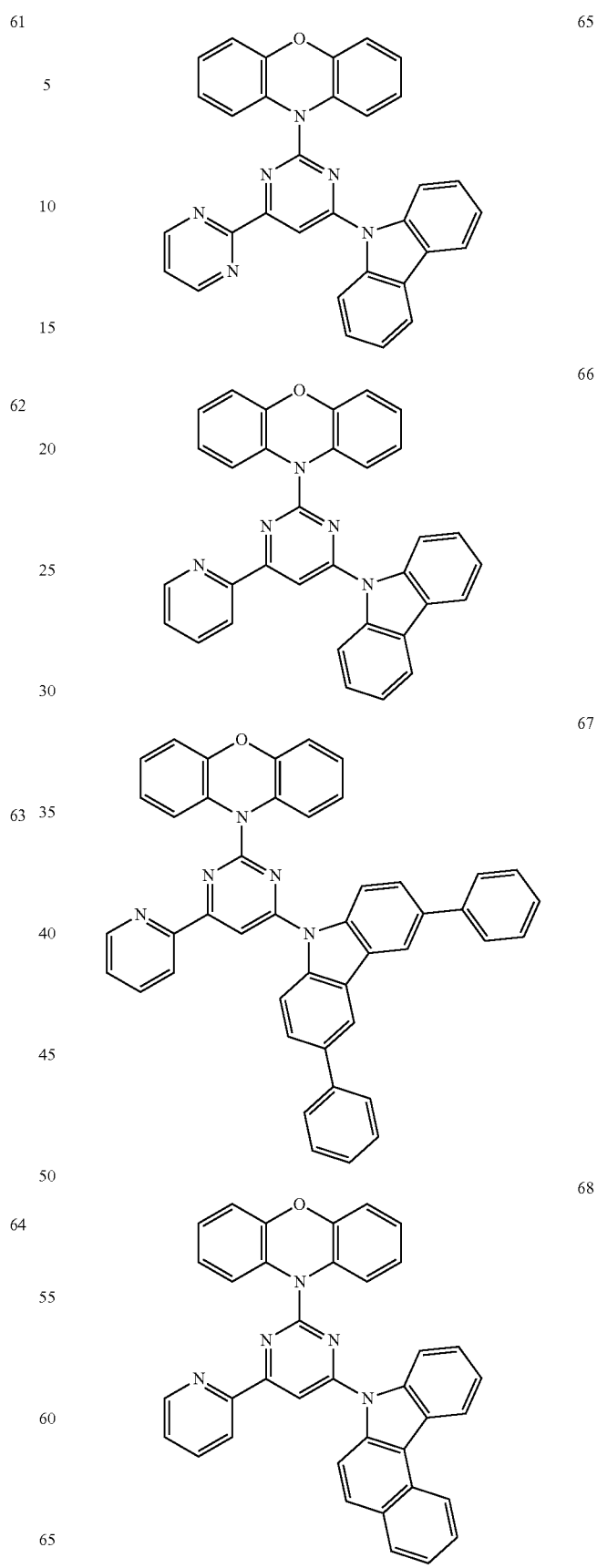

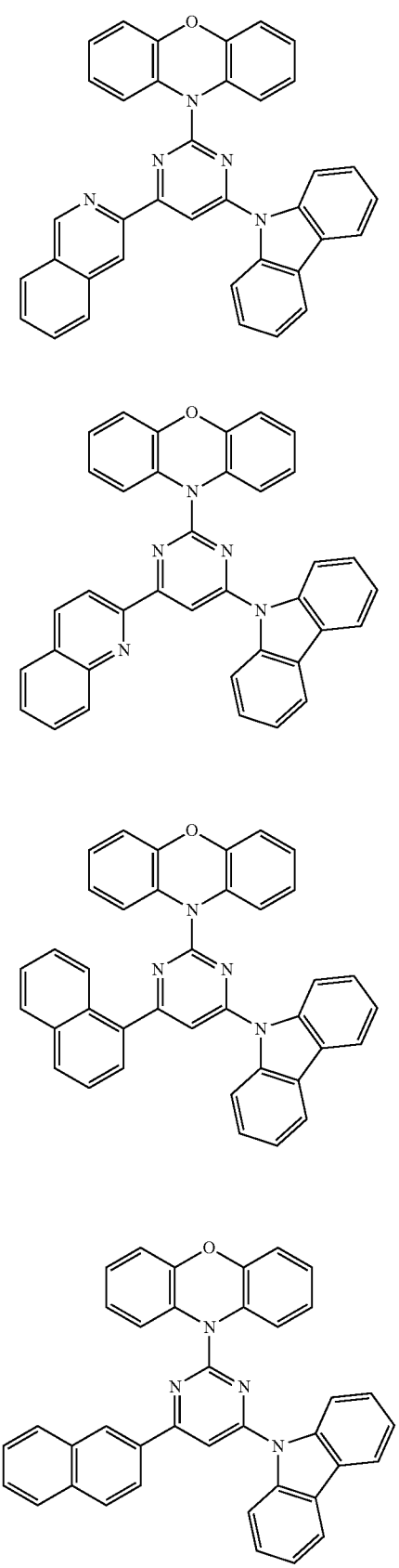
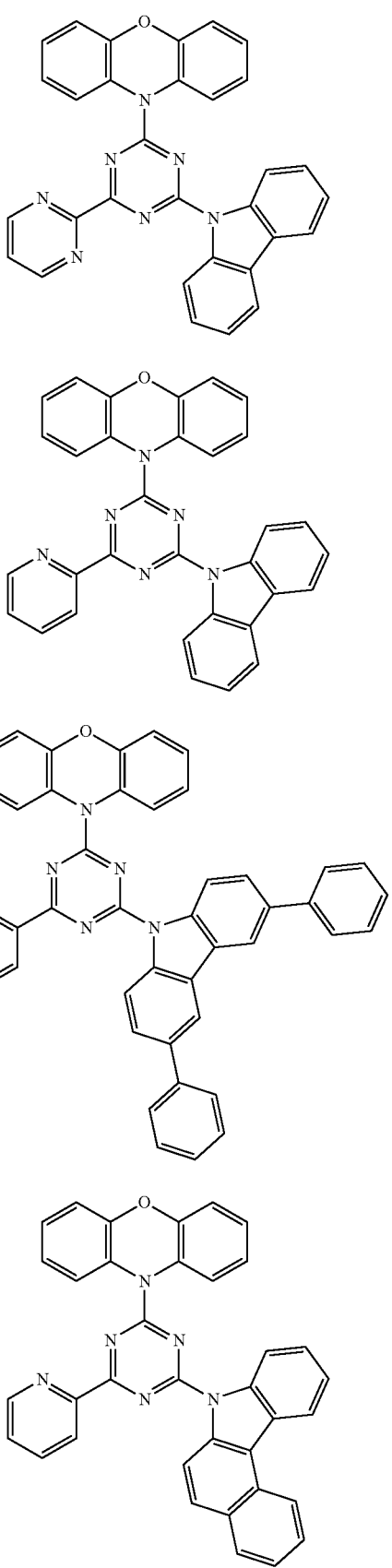

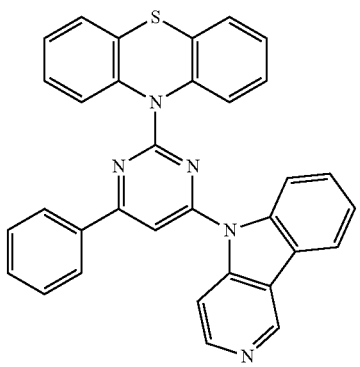

77

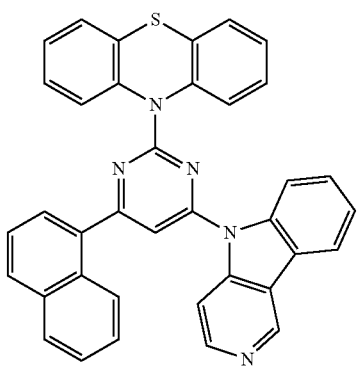

78

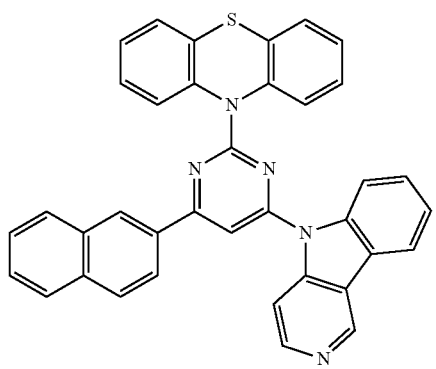

79

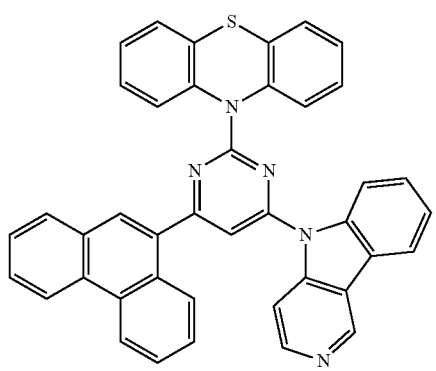

80

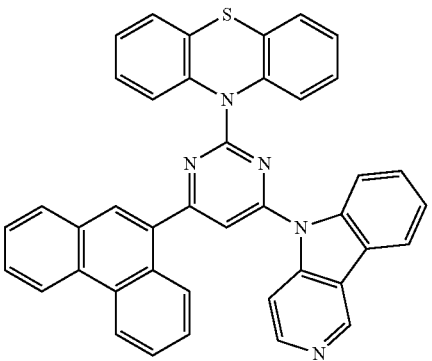

81

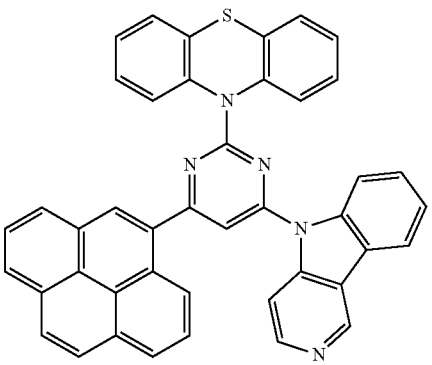

82

In some embodiments, the first material represented by Formula 1 is a material having a good hole transport capability, and the second material represented by Formula 2 is a material having a good electron transport capability. Accordingly, by combining the first material and the second material in the organic layer, the charge mobility of the organic light-emitting diode may be controlled to effectively form excitons. Thus, an organic light-emitting diode, which uses a combination of the first material and the second material in the organic layer, more specifically, which uses such combination with the EML, may have improved efficiency. In embodiments of the present invention, when the first material and the second material are used together with the EML, a balance between the holes and the electrons in the EML is maintained, and the lifespan of the organic light-emitting diode, therefore, may be increased.

In embodiments, where a phosphorescent host and a dopant are used together in the EML of the organic light-emitting diode, energy transfer between the host and the dopant is facilitated in accordance with Formula 1' below.

E1>E2 (where, E1 is a triplet energy of a host, and E2 is a triplet energy of a dopant.)  [Formula 1']

In embodiments where the conditions of Formula 1' for selecting a host and a dopant are satisfied, the triplet energy of the host may be efficiently transferred to the dopant, and the host and the dopant may emit light, even at room temperature. Since the first material and the second material, according to some embodiments, each have high triplet energy, there may be several kinds of suitable dopants. Accordingly, dopants may be selected from various kinds of dopants suitable for use in an organic light-emitting diode, thereby not only increasing the efficiency of the organic light-emitting diode, but also obtaining various emitted light colors.

The organic light-emitting diode may include a hole transport region including at least one layer selected from a hole injection layer, a hole transport layer, a functional layer having both hole injection and hole transport capabilities, a buffer layer, and an electron blocking layer between a first electrode and an EML, and an electron transport region including at least one layer selected from a hole blocking layer, an electron transport layer, and an electron injection layer located between the EML and a second electrode, but embodiments of the invention are not limited thereto.

In some embodiments, the first material and the second material exist on the EML, but embodiments of the invention are not limited thereto. In one embodiment, the first material and the second material exist of opposite sides of the EML, respectively.

In embodiments, in which the first material and the second material exist on the EML, the EML further includes a dopant, and the first material and the second material may function as hosts, but embodiments of the invention are not limited thereto.

In some embodiments, the first material and the second material are be vacuum deposited, but embodiments of the invention are not limited thereto.

The drawing is a schematic view of an organic light-emitting diode 10 according to an embodiment of the present invention. Hereinafter, a structure and a method of manufacturing the organic light-emitting diode 10, according to embodiments of the present invention, are described:

A substrate 11 may be any substrate suitable for use in organic light-emitting devices. In some embodiments, the substrate 11 may be a glass substrate or a transparent plastic substrate with strong mechanical strength, thermal stability, transparency, surface smoothness, ease of handling, and water resistance.

A first electrode 13 may be formed by depositing or sputtering a first electrode-forming material onto a surface of the substrate 11. When the first electrode 13 is an anode, a material having a high work function may be used as the first electrode-forming material to facilitate hole injection. The first electrode 13 may be a reflective electrode or a transmission electrode. Non-limiting examples of transparent and conductive materials that may be used to form the first electrode 13, include Indium Tin Oxide (ITO), Indium Zinc Oxide (IZO), $SnO_2$, and ZnO. The first electrode 13 may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode 13 may have a single-layer structure or a multi-layer structure including at least two layers. For example, the first electrode 13 may have a three-layered structure of ITO/Ag/ITO, but it is not limited thereto.

In some embodiments, an organic layer 15 is positioned on the first electrode 13.

The organic layer 15 may include a hole injection layer (HIL), a hole transport layer (HTL), an H-functional layer having both hole injection and hole transport capabilities (H-functional layer), a buffer layer, an EML, an electron transport layer (ETL), and an electron injection layer (EIL).

An HIL may be formed on the first electrode 13 by vacuum deposition, spin coating, casting, Langmuir-Blodgett (LB) deposition, or the like.

When the HIL is formed using vacuum deposition, vacuum deposition conditions may vary according to the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 Å/sec to about 100 ksec. However, the deposition conditions are not limited thereto.

When the HIL is formed using spin coating, the coating conditions may vary according to the compound that is used to form the HIL, and the desired structure and thermal properties of the HIL to be formed. In one embodiment, the coating rate may be in the range from about 2000 rpm to about 5000 rpm, and a temperature at which heat treatment is performed to remove a solvent after coating may be in the range from about 80° C. to about 200° C. However, the coating conditions are not limited thereto.

The HIL may be formed of any material that is suitable to form an HIL.

Non-limiting examples of the material that may be used to form the HIL include N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4''-tris(3-methylphenylphenylamino)triphenylamine (m-MTDATA), N,N'-di(1-naphthyl group-N,N'-diphenyl-benzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline/poly(4-styrenesulfonate (PANI/PSS):

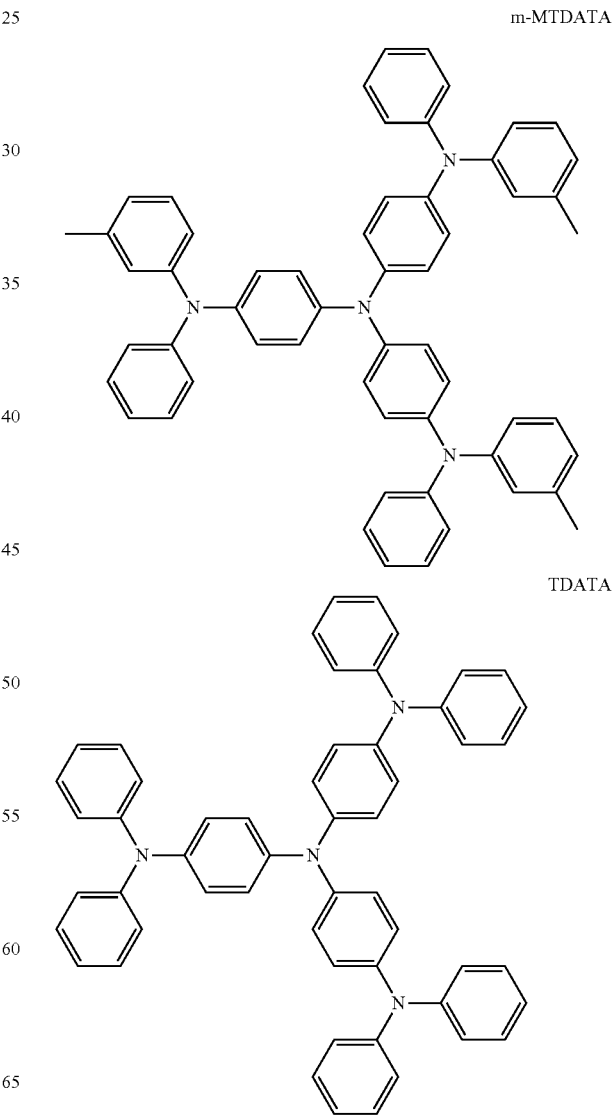

2-TNATA

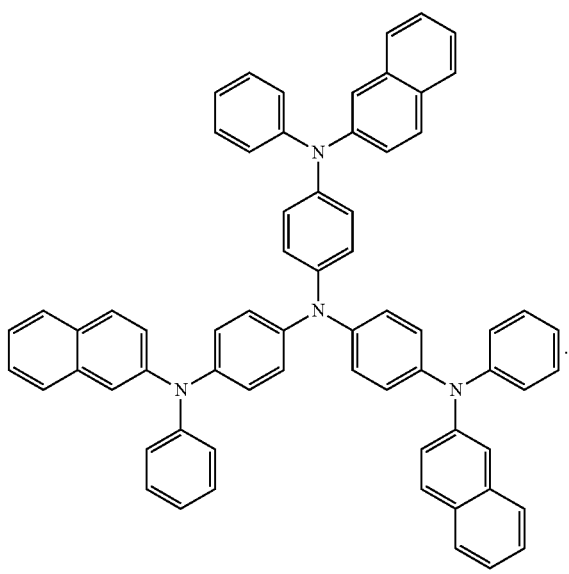

The thickness of the HIL may be from about 100 Å to about 10000 Å, and in some embodiments, may be from about 100 Å to about 1000 Å. When the thickness of the HIL is within these ranges, the HIL may have good hole injecting ability without a substantial increase in driving voltage.

An HTL may be formed on the HIL by using vacuum deposition, spin coating, casting, LB deposition, or the like. When the HTL is formed using vacuum deposition or spin coating, the conditions for deposition and coating may be similar to those for the formation of the HIL, though the conditions for the deposition and coating may vary according to a material that is used to form the HTL.

Non-limiting examples of suitable HTL forming materials include carbazole derivatives, such as N-phenylcarbazole or polyvinylcarbazole, N,N'-bis(3-methylphenyl)-N,N'-diphenyl-[1,1-biphenyl]-4,4'-diamine (TPD), 4,4',4''-tris(N-carbazolyl)triphenylamine (TCTA), and N,N'-di(1-naphthyl-N,N'-diphenylbenzidine) (NPB).

TPD

NPD

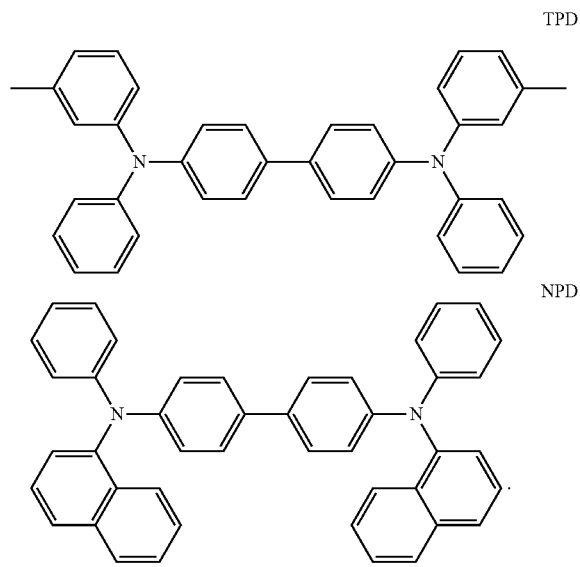

The thickness of the HTL may be from about 50 Å to about 2000 Å, and in some embodiments, may be from about 100 Å to about 1500 Å. When the thickness of the HTL is within these ranges, the HTL may have good hole transporting ability without a substantial increase in driving voltage.

An H-functional layer (having both hole injection and hole transport capabilities) may contain at least one material from each group of the HIL materials and the HTL materials. The thickness of the H-functional layer may be from about 500 Å to about 10,000 Å, and in some embodiments, may be from about 100 Å to about 1,000 Å. When the thickness of the H-functional layer is within these ranges, the H-functional layer may have good hole injection and transport capabilities without a substantial increase in driving voltage.

At least one of the HIL, HTL, and H-functional layer may further include a charge-generating material for improved layer conductivity, in addition to the hole injecting material, the hole transport material, and/or the material having both hole injection and hole transport capabilities as described above.

The charge-generating material may be selected from quinone derivatives, metal oxides, and cyano-containing compounds, but is not limited thereto. Non-limiting examples of the charge-generating material include quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and cyano-containing compounds such as Compound 200 below.

<Compound 200>

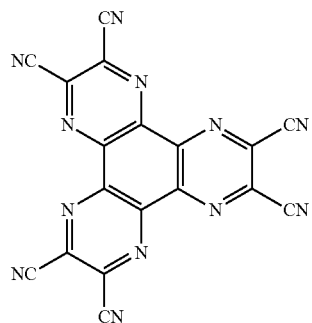

<F4-TCNQ>

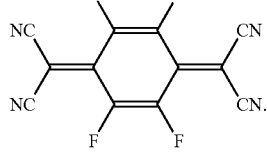

In embodiments in which the HIL, the HTL, and/or the H-functional layer further include a charge-generating material, the charge-generating material may be homogeneously dispersed or inhomogeneously distributed in the HIL, the HTL, and/or the H-functional layer.

A buffer layer may be located between the EML and at least one of the HIL, the HTL, and the H-functional layer. The buffer layer may compensate for an optical resonance distance of light according to a wavelength of the light emitted from the EML, and thus may increase efficiency. The buffer layer may include any hole injection material or hole transport material suitable for use in an organic light-emitting diode. In some embodiments, the buffer layer includes the same material as those included in the HIL, the HTL, and/or the H-functional layer.

An EML may be formed on the HTL, the H-functional layer, or buffer layer by vacuum deposition, spin coating, casting, LB deposition, or the like. When the EML is formed using vacuum deposition or spin coating, the deposition and coating conditions may be similar to those for the formation of the HIL, though the conditions for deposition and coating may vary according to a material that is used to form the EML.

The EML may further include a host and a dopant. The host and the dopant may be any host and dopant suitable for use in an organic light-emitting diode.

Non-limiting examples of the host include Alq$_3$, 4,4'-N,N'-dicarbazole-biphenyl (CBP), poly(n-vinyl carbazole) (PVK), 9,10-di(naphthalene-2-yl)anthracene (herein abbreviated as DNA), TCTA, 1,3,5-tris(N-phenylbenzimidazole-2-yl)benzene (TPBI), 3-tert-butyl-9,10-di(naphth-2-yl) anthracene (TBADN), mCP, and OXD-7.

PVK

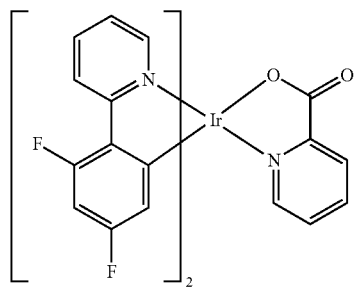

mCP

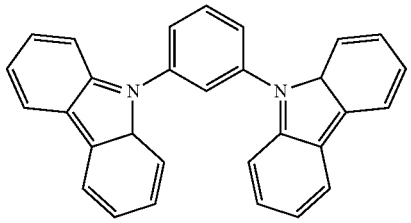

OXD-7

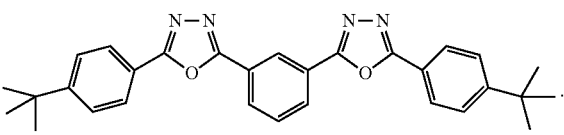

In some embodiments, the dopant is at least one selected from a fluorescent dopant and a phosphorescent dopant.

The phosphorescent dopant may be an organic metal complex including a combination of at least two of iridium (Ir), platinum (Pt), osmium (Os), rhenium (Re), titanium (Ti), zirconium (Zr), and hafnium (Hf), but the phosphorescent dopant is not limited thereto.

In some embodiments, blue dopants are used. Non-limiting examples of blue dopants include F$_2$Irpic, (F$_2$ppy)$_2$Ir(tmd), Ir(dfppz)$_3$, ter-fluorene, 4,4'-bis(4-diphenylaminostyryl) biphenyl (DPAVBi), 2,5,8,11-tetra-tert-butyl pherylene (TBPe), and DPVBi.

F$_2$Irpic

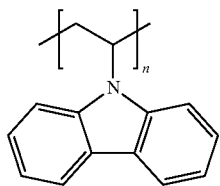

(F$_2$ppy)$_2$Ir(tmd)

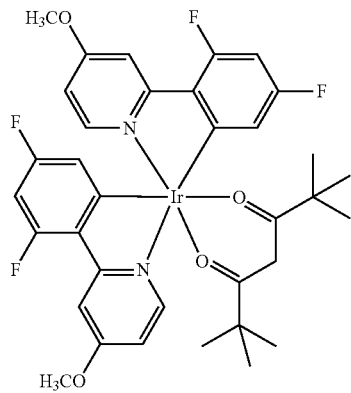

Ir(dfppz)$_3$

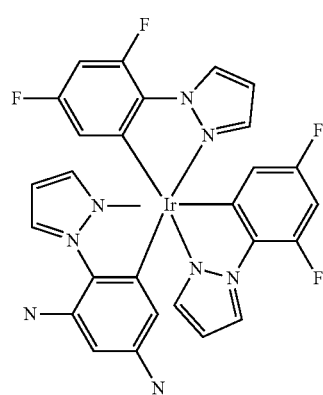

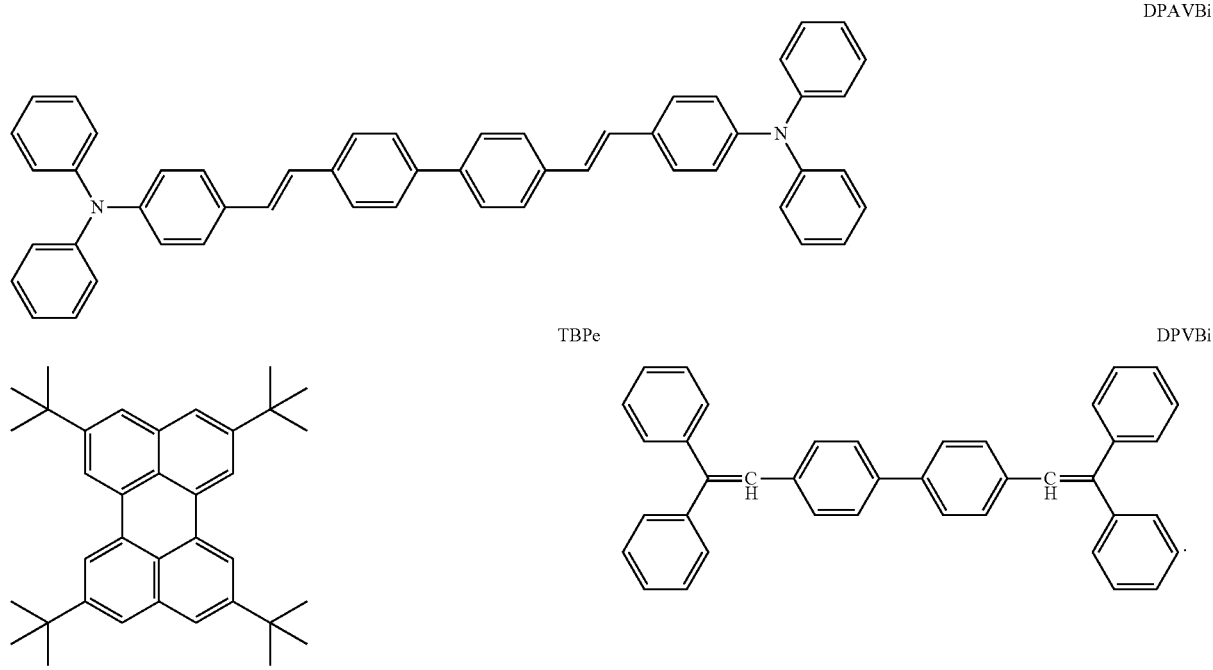
DPAVBi
TBPe
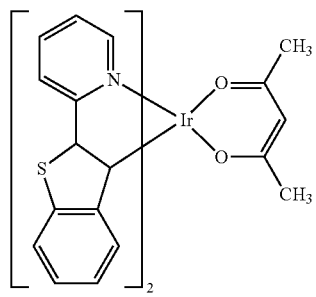
DPVBi
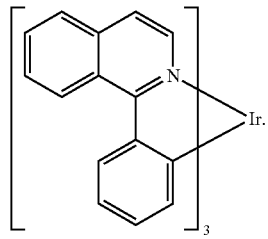
In some embodiments, red dopants are used. Non-limiting examples of red dopants include PtOEP, Ir(piq)$_3$, and BtpIr.
BtpIr
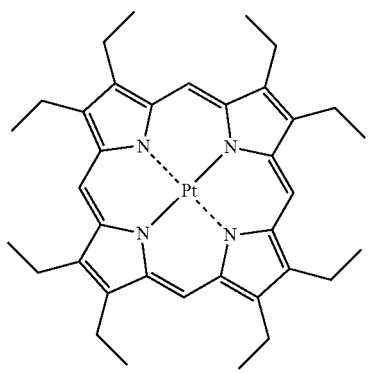
PtOEP
Ir(piq)$_3$
Additional non-limiting examples of red dopants include compounds represented by the following formulae:
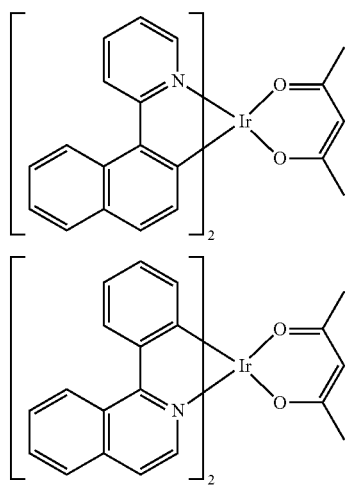

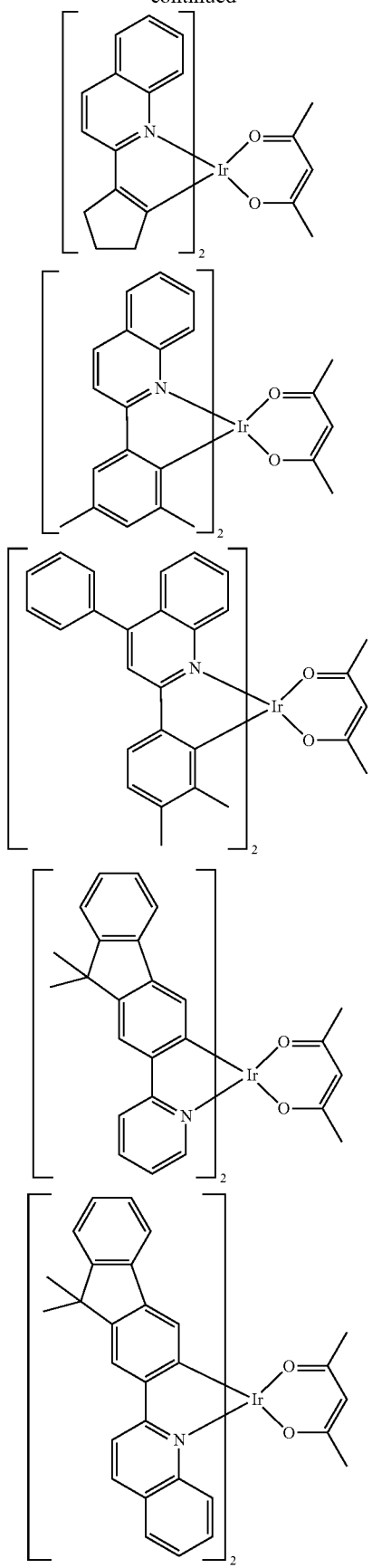
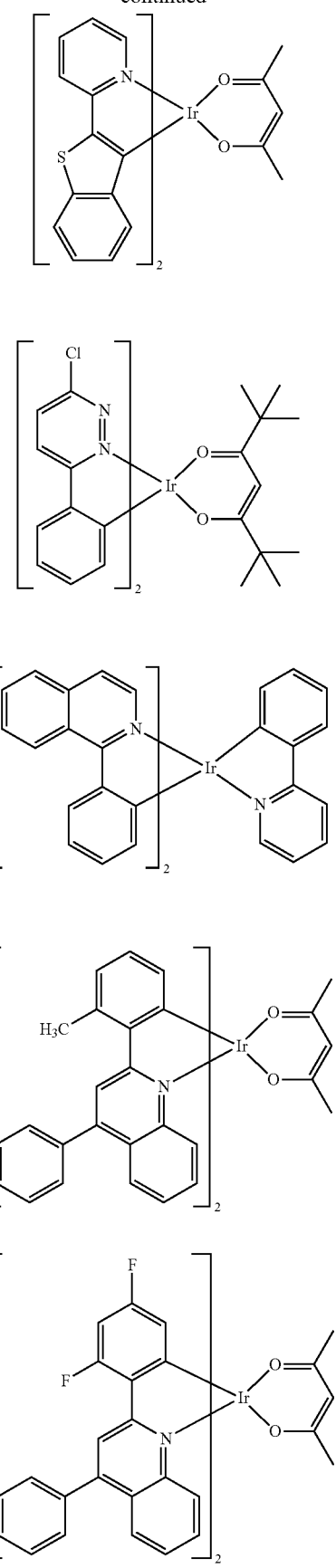

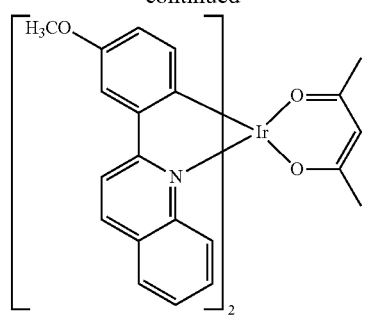
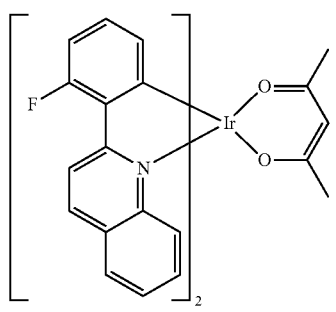
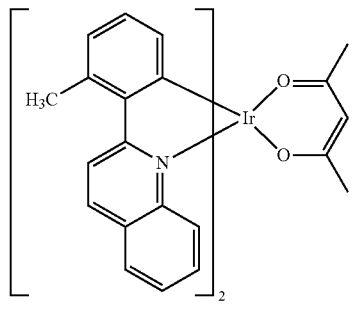
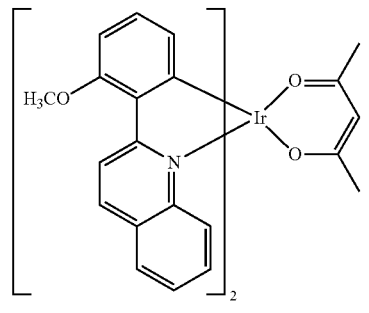
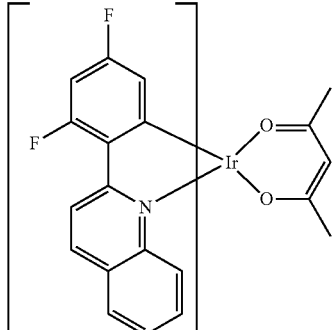
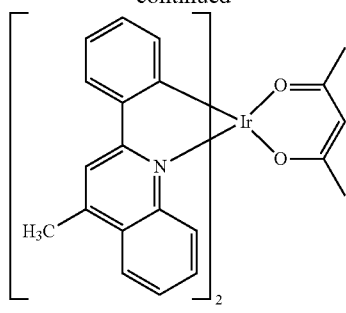
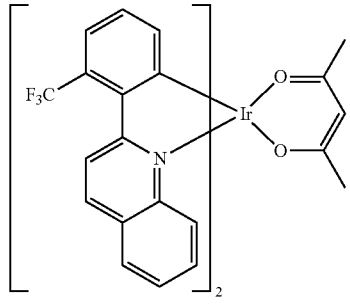
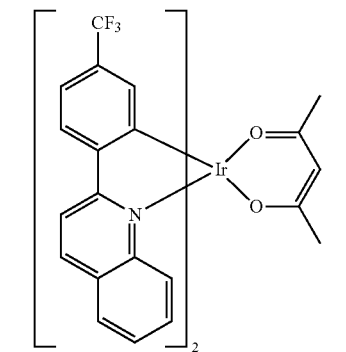
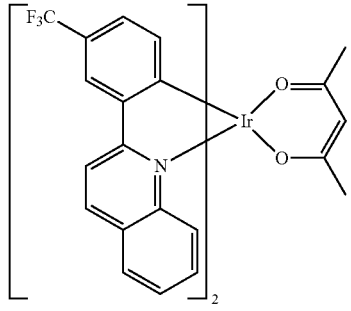
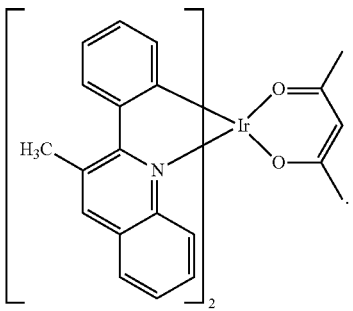
In some embodiments, green dopants are used. Non-limiting examples of green dopants include Ir(ppy)₃ (ppy=phenylpyridine), Ir(ppy)₂(acac), and Ir(mpyp)₃.

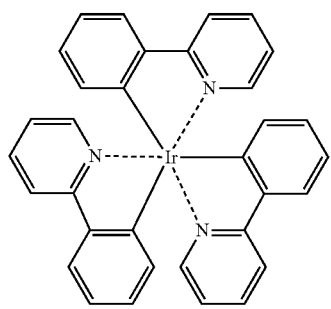

Ir(ppy)₃

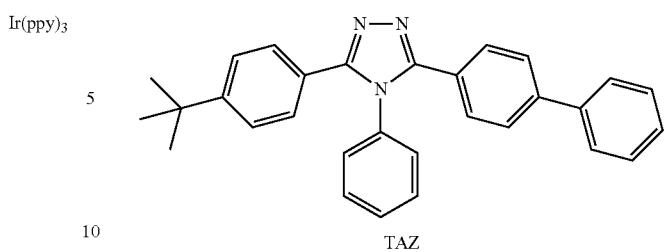

TAZ

BAlq

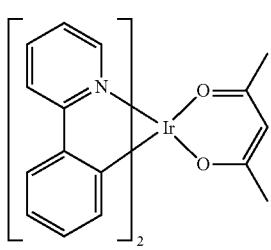

Ir(ppy)₂(acac)

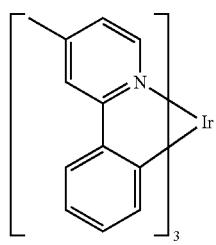

Ir(mpyp)₃

<Compound 101>

<Compound 102>

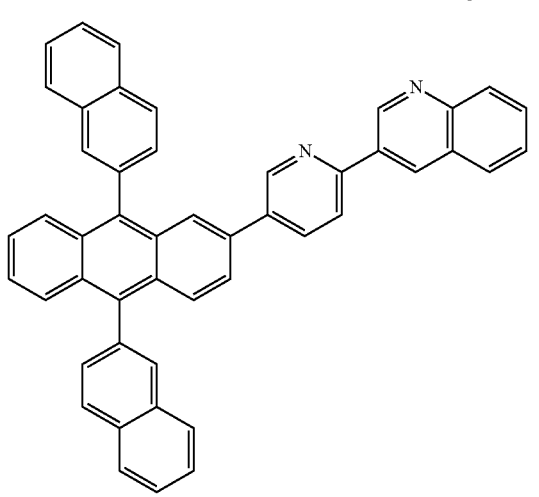

In embodiments in which the EML includes both a host and a dopant, the amount of the dopant may be from about 0.01 wt % to about 15 wt %, based on 100 wt % of the EML. However, the amount of the dopant is not limited to this range.

The thickness of the EML may be from about 200 Å to about 700 Å. When the thickness of the EML is within this range, the EML may have good light-emitting ability without a substantial increase in driving voltage.

An ETL may be formed on the EML by a variety of methods, for example, vacuum deposition, spin coating, or casting. When the ETL is formed using vacuum deposition or spin coating, the deposition and coating conditions may be similar to those for the formation of the HIL, though the deposition and coating conditions may vary according to a material that is used to form the ETL. The material that is used to form the ETL may be a material suitable to stably transport electrons injected from an electron injecting electrode (cathode) and any electron transport material suitable for use in an organic light-emitting diode may be used as a material for forming the ETL. Non-limiting examples of materials for forming the ETL include quinoline derivatives (such as tris(8-quinolinolate)aluminum (Alq3)), TAZ, BAIq, beryllium bis(benzoquinolin-10-olate (Bebq2), 9,10-di(naphthalene-2-yl)anthracene (herein abbreviated as DNA), and Bphen, as well as Compound 101 and Compound 102 below.

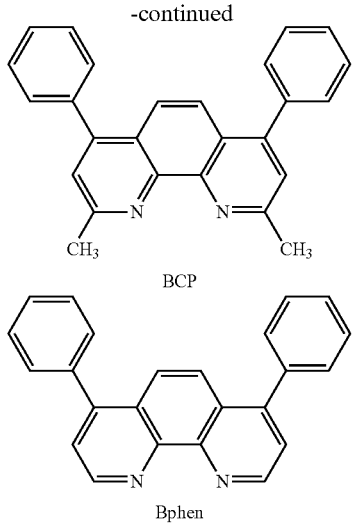

BCP

Bphen

A thickness of the ETL may be from about 100 Å to about 1,000 Å, and in some embodiments, may be from about 150 Å to about 500 Å. When the thickness of the ETL is within these ranges, the ETL may have good electron transporting ability without a substantial increase in driving voltage.

In some embodiments, the ETL may further include a metal-containing material, in addition to an electron-transporting organic compound. The metal-containing material may include a lithium (Li) complex. Non-limiting examples of the Li complex include lithium quinolate (LiQ) and Compound 203 below:

<Compound 103>

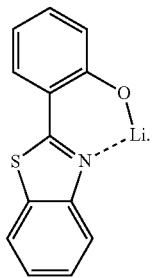

An EIL, which in some embodiments facilitates injection of electrons from the cathode, may be formed on the ETL. Any suitable electron-injecting material may be used to form the EIL.

Non-limiting examples of the material for forming the EIL include LiF, NaCl, CsF, $Li_2O$, and BaO. The deposition and coating conditions for forming the EIL may be similar to those for the formation of the HIL, though the deposition and coating conditions may vary according to a material that is used to form the EIL.

A thickness of the EIL may be from about 1 Å to about 100 Å, and in some embodiments, may be from about 3 Å to about 90 Å. When the thickness of the EIL is within these ranges, the EIL may have good electron injection ability without a substantial increase in driving voltage.

In some embodiments, a second electrode 17 is located on the organic layer 15. The second electrode 17 may be a cathode, which in some embodiments is an electron injection electrode. Here, a metal for forming the second electrode 17 may be a metal, an alloy, and an electro-conductive compound, which all have a low work function, or a mixture thereof. The second electrode 17 may be formed of lithium (Li), magnesium (Mg), aluminum (Al group, aluminum-lithium (Al—Li), calcium (Ca), magnesium-indium (Mg—In), magnesium-silver (Mg—Ag), or the like, and may be formed as a thin film type transmission electrode. In some embodiments, various changes may be made to manufacture a top-emission light-emitting diode, such as forming a transmission electrode by using indium tin oxide (ITO) or indium zinc oxide (IZO), but embodiments of the invention are not limited thereto.

In embodiments in which a phosphorescent dopant is used in the EML, an HBL may be formed between the HTL and the EML, or between the H-functional layer and the EML, by using vacuum deposition, spin coating, casting, LB deposition, or the like, in order to prevent diffusion of triplet excitons or holes into an ETL. When the HBL is formed using vacuum deposition or spin coating, the conditions for deposition and coating may be similar to those for the formation of the HIL, although the conditions for deposition and coating may vary according to a material that is used to form the HBL. Any hole blocking materials suitable for use in an organic light-emitting diode may be used. Non-limiting examples of hole blocking materials include oxadiazole derivatives, triazole derivatives, and phenanthroline derivatives. For example, BCP, as shown below, may be used as the hole blocking material.

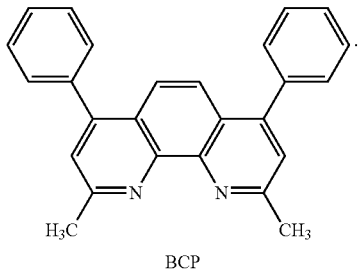

BCP

A thickness of the HBL may be from about 20 Å to about 1000 Å, and in some embodiments, may be from about 30 Å to about 300 Å. When the thickness of the HBL is within these ranges, the HBL may have improved hole blocking ability without a substantial increase in driving voltage.

Although the organic light-emitting device 10 of the drawing is described above, embodiments of the present invention are not limited thereto.

The groups described above in connection with Formulae 1, 2, 1a-1e and 2a-2d, including but not limited to $R_1$-$R_5$, $R_{11}$-$R_{15}$, $R_{20}$, $R_{21}$, $Ar_1$-$Ar_2$, $L_1$ and $Y_1$-$Y_{15}$, are described here in more detail.

As used in the present specification, examples of an unsubstituted $C_1$-$C_{60}$ alkyl group (or a $C_1$-$C_{60}$ alkyl group) may include a linear or a branched $C_1$-$C_{60}$ alkyl group such as methyl, ethyl, propyl, isobutyl, sec-butyl, pentyl, iso-amyl, and hexyl. A substituted $C_1$-$C_{60}$ alkyl group may refer to the unsubstituted $C_1$-$C_{60}$ alkyl group wherein at least one hydrogen atom is substituted with at least one selected from:

a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, and a phosphoric acid or a salt thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, each substituted with at least one selected from a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridyl group, a pyrimidinyl group, a pyrazinyl group, a pyridazinyl group, a triazinyl group, a quinolyl group, and an isoquinolyl group;

—N($Q_{11}$)($Q_{12}$); and —Si($Q_{13}$)($Q_{14}$)($Q_{15}$) (where, $Q_{ii}$ and $Q_{12}$ are each independently selected from a $C_6$-$C_{60}$ aryl group and a $C_2$-$C_{60}$ heteroaryl group, and $Q_{13}$ to $Q_{15}$ are each independently selected from a $C_1$-$C_{60}$ alkyl group, a $C_1$-$C_{60}$ alkoxy group, a $C_6$-$C_{60}$ aryl group, and a $C_2$-$C_{60}$ heteroaryl group).

As used herein, an unsubstituted $C_1$-$C_{60}$ alkoxy group (or a $C_1$-$C_{60}$ alkoxy group) has a formula of —OA (where, A is the unsubstituted $C_1$-$C_{60}$ alkyl group described above), and examples of the unsubstituted $C_1$-$C_{60}$ alkoxy group may include methoxy, ethoxy, isopropyloxy, and the like. Examples of a substituted $C_1$-$C_{60}$ alkoxy group may include a group, in which at least one hydrogen atom of the unsubstituted $C_1$-$C_{60}$ alkoxy group is substituted with at least one selected from the substituents described above in conjunction with the substituted $C_1$-$C_{60}$ alkyl group.

As used herein, an unsubstituted $C_2$-$C_{60}$ alkenyl group (or a $C_2$-$C_{60}$ alkenyl group) may refer to a hydrocarbon chain having one or more carbon-carbon double bond at one or more positions along a carbon chain of the unsubstituted $C_2$-$C_{60}$ alkyl group. Examples of the unsubstituted $C_2$-$C_{60}$ alkenyl group include an ethenyl group, a propenyl group, a butenyl group, and the like. Examples of a substituted $C_2$-$C_{60}$ alkyl group include a group, in which at least one hydrogen atom in the unsubstituted $C_2$-$C_{60}$ alkenyl group is substituted with at least one selected from the substituents described above in conjunction with the substituted $C_1$-$C_{60}$ alkyl group.

As used herein, an unsubstituted $C_2$-$C_{60}$ alkynyl group (or a $C_2$-$C_{60}$ alkynyl group) may refer to a $C_2$-$C_{60}$ alkyl group having at least one carbon-carbon triple bond at one or more positions along a carbon chain of the $C_2$-$C_{60}$ alkynyl group. Examples of the unsubstituted $C_2$-$C_{60}$ alkynyl group include an ethynyl group, a propynyl group, and the like. Examples of a substituted $C_2$-$C_{60}$ alkynyl group include a group, in which at least one hydrogen atom in the unsubstituted $C_2$-$C_{60}$ alkynyl group is substituted with at least one selected from the substituents described above in conjunction with the substituted $C_1$-$C_{60}$ alkyl group.

As used herein, an unsubstituted $C_3$-$C_{30}$ cycloalkyl group may refer to a monovalent group having a saturated carbocyclic system having 3 to 60 carbon atoms. Examples of the unsubstituted $C_3$-$C_{30}$ cycloalkyl group include cyclopropyl, cyclobutyl, cyclopentyl, cyclohexyl, cyclooctyl, and the like. Examples of a substituted $C_3$-$C_{30}$ cycloalkyl group include a group, in which at least one hydrogen atom in the unsubstituted $C_3$-$C_{30}$ cycloalkyl group is substituted with at least one selected from the substituents described above in conjunction with the substituted $C_1$-$C_{60}$ alkyl group.

As used herein, an unsubstituted $C_3$-$C_{30}$ cycloalkenyl group may refer to an unsaturated hydrocarbon ring group, that is not an aromatic ring, having at least one carbon-carbon double bond. Examples of the unsubstituted $C_3$-$C_{30}$ cycloalkenyl group include cyclopropenyl, cyclobutenyl, cyclopentenyl, cyclohexenyl, cycloheptenyl, a 1,3-cyclohexadienyl group, a 1,4-cyclohexadienyl group, a 2,4-cycloheptadienyl group, a 1,5-cyclooctadienyl group, and the like. Examples of a substituted $C_3$-$C_{30}$ cycloalkenyl group include a group, in which at least one hydrogen atom of the cycloalkenyl group is substituted with at least one selected from the substituents described above in conjunction with the substituted $C_1$-$C_{60}$ alkyl group.

As used herein, an unsubstituted $C_6$-$C_{60}$ aryl group may refer a monovalent group having a carbocyclic aromatic system having 6 to 60 carbon atoms including at least one aromatic ring. An unsubstituted $C_6$-$C_{60}$ arylene group, as used herein, may refer to a divalent group having a carbocyclic aromatic system having 6 to 60 carbon atoms including at least one aromatic ring. When the unsubstituted $C_6$-$C_{60}$ aryl group and/or the unsubstituted $C_6$-$C_{60}$ arylene group include at least two rings, two or more rings may be fused to each other. A substituted $C_6$-$C_{60}$ aryl group and a substituted $C_6$-$C_{60}$ arylene group may each refer to a group in which at least one hydrogen atom of the unsubstituted $C_6$-$C_{60}$ aryl group and the unsubstituted $C_6$-$C_{60}$ arylene group, respectively, is substituted with at least one selected from the substituents described above in conjunction with the substituted $C_1$-$C_{60}$ alkyl group.

Non-limiting examples of the substituted and the unsubstituted $C_6$-$C_{60}$ aryl group include a phenyl group, a $C_1$-$C_{10}$ alkyl phenyl group (for example, ethyl phenyl group), a $C_1$-$C_{10}$ alkyl biphenyl group (for example, ethyl biphenyl group), a halophenyl group (for example, an o-, m- and p-fluorophenyl group, and a dichlorophenyl group), a dicyanophenyl group, a trifluoromethoxy phenyl group, an o-, m-, and p-tolyl group, an o-, m- and p-cumenyl group, a mesityl group, a phenoxy phenyl group, an (α,α-dimethyl benzene) phenyl group, an (N,N'-dimethyl)aminophenyl group, an (N,N'-diphenyl)aminophenyl group, a pentalenyl group, an indenyl group, a naphthyl group, a halonaphthyl group (for example, a fluoronaphthyl group), a $C_1$-$C_{10}$ alkyl naphthyl group (for example, a methyl naphthyl group), a $C_1$-$C_{10}$ alkoxy naphthyl group (for example, a methoxy naphthyl group), an anthracenyl group, an azulenyl group, a heptalenyl group, an acenaphthylenyl group, a phenalenyl group, a fluorenyl group, an anthraquinolyl group, a methyl anthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coroneryl group, a trinaphthylenyl group, a heptaphenyl group, a heptacenyl group, a pyranthrenyl group, an ovalenyl group, and the like. Additional examples of the substituted $C_6$-$C_{60}$ aryl group should be apparent based on the examples of the unsubstituted $C_6$-$C_{60}$ aryl group and those substituents described above in conjunction with the substituted $C_1$-$C_{60}$ alkyl group, but are not limited thereto. Examples of the substituted or unsubstituted $C_6$-$C_{60}$ arylene group should be apparent based on the examples of the substituted or unsubstituted $C_6$-$C_{60}$ aryl group.

As used herein, an unsubstituted $C_2$-$C_{60}$ heteroaryl group may refer to a monovalent group including at least one aromatic ring that includes at least one heteroatom selected from N, O, P, and S, as ring-forming atoms, and carbon atoms as other ring atoms. An unsubstituted $C_2$-$C_{60}$ heteroarylene group may refer to a divalent group including at least one aromatic ring that includes at least one heteroatom selected from N, O, P, and S, as ring-forming atoms, and carbon atoms as other ring atoms. In embodiments in which the unsubstituted $C_2$-$C_{60}$ heteroaryl group and/or the unsubstituted $C_2$-$C_{60}$ heteroarylene group include two or more rings, the two or more rings may be fused to each other. A substituted $C_2$-$C_{60}$ heteroaryl group and a substituted $C_2$-$C_{60}$ heteroarylene group may each refer to a group in which at least one hydrogen atom of the unsubstituted $C_2$-$C_{60}$ heteroaryl group and the unsubstituted $C_2$-$C_{60}$ heteroarylene group, respectively, is substituted with at least one selected from the substituents described above in conjunction with the substituted $C_1$-$C_{60}$ alkyl group.

Non-limiting examples of the unsubstituted $C_2$-$C_{60}$ heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, an imidazopyrimidinyl group, and the like. Examples of the substituted $C_2$-$C_{60}$ heteroaryl group should be apparent based on the examples of the unsubstituted $C_2$-$C_{60}$ heteroaryl group and those substituents described above in conjunction with the substituted $C_1$-$C_{60}$ alkyl group. Examples of the substituted and unsubstituted $C_2$-$C_{60}$ heteroarylene group should be apparent based on the examples of a substituted or unsubstituted $C_2$-$C_{60}$ arylene group.

A substituted or unsubstituted $C_6$-$C_{60}$ aryloxy group, as used herein, has a formula of —$OA_2$ (where, $A_2$ is a substituted or unsubstituted $C_6$-$C_{60}$ aryl group), and a substituted or unsubstituted $C_6$-$C_{60}$ arylthio group, as used herein, has a formula of —$SA_3$ (where, $A_3$ is a substituted or unsubstituted $C_6$-$C_{60}$ aryl group).

Hereinafter, an organic light-emitting device according to one or more embodiments of the present invention will be described in greater detail with references to Examples; however, the present invention is not limited by the Examples.

SYNTHESIS EXAMPLE

Synthesis of First Material

First, intermediates A and B were synthesized according to the reaction scheme below:

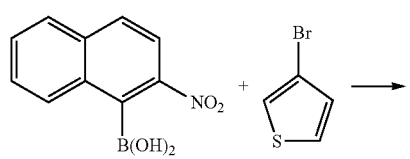

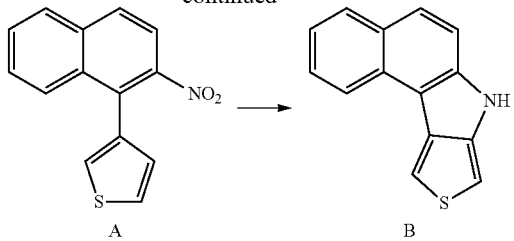

Synthesis of Intermediate A 20 g (1 equivalent weight and 0.092 mol) of 2-nitronaphthalen-1-yl boronic acid and 18.3 g (1.2 equivalent weight and 0.11 mol) of 3-bromothiophene were added to a flask, and 2.12 g (0.02 equivalent weight and 0.00184 mol) of Pd(PPh$_3$)$_4$ was added thereto. 550 ml of toluene and 100 ml of 2M saturated solution of K$_2$CO$_3$ were added to the flask to prepare a mixture, and then the mixture was refluxed and agitated for 5 hours to prepare a reaction product.

After the reaction was completed, the reaction product was washed and extracted with 500 ml of dichloromethane and 200 ml of distilled water, a solvent was removed from the reaction product to prepare a solid, and the solid was purified by column chromatography to obtain 18.81 g (yield 80.1%) of Intermediate A.

$^1$H NMR: 7.22 (d, 1H), 7.73 (m, 3H), 8.02 (m, 4H), 9.05 (s, 1H)

Synthesis of Intermediate B 20 g (1 equivalent weight and 0.078 mol) of Compound B, 120 g (800 mmol) of SnCl$_2$.2H$_2$O, 600 mL of acetic acid, and 70 mL of 1N HCl were added to a flask and agitated at a temperature of 80° C. overnight to prepare a reaction compound. After a reaction solvent was vacuum distilled, the reaction compound was dissolved in Tetrahydrofuran and Ethyl Acetate, and washed with NaHCO$_3$ aqueous solution and brine to prepare a reaction product. Water was removed from the reaction product by using anhydrous MgSO$_4$ and then vacuum distilled to prepare a product. The product was recrystallized with MeOH to obtain 8.2 g (yield 47%) of Intermediate B.

$^1$H NMR: 7.2 (s, 2H), 7.67 (m, 4H), 8.16 (t, 1H), 8.54 (t, 1H), 10.1 (S, 1H NH)

Synthesis of Compound 1

10 g (1 equivalent weight and 0.044 mol) of Intermediate B and 15.87 g (1.1 equivalent weight and 0.049 mol) of 9-(3-bromophenyl)-9H-carbazole were added to a flask and dissolved in 1200 ml of toluene. Then, 0.86 g (0.02 equivalent weight and 0.0008 mmol) of Pd$_2$(dba)$_3$, 6.75 g (1.2 equivalent weight and 0.0528 mol) of t-BuONa, and 0.28 g (0.08 equivalent weight and 0.0035 mmol) of t-Bu$_3$P were added to the flask and then the flask was heated and agitated for 12 hours to prepare a reaction solution. After the reaction was completed, the reaction solution was filtered through a Celite and purified by column chromatography to obtain 14.7 g (yield=72%) of a final Compound 1.

Elementary analysis (C$_{32}$H$_{20}$N$_2$S): C, 82.73; H, 4.34; N, 6.03; S, 6.90

HRMS (C$_{32}$H$_{20}$N$_2$S) [M]$^+$: calculated value 464, measured value 463.

Synthesis of Compound 3

10 g (1 equivalent weight and 0.044 mol) of Intermediate B and 19.51 g (1.1 equivalent weight and 0.049 mol) of 9-(4'-bromobiphenyl-3-yl)-9H-carbazole were added to a flask and dissolved in 1200 ml of toluene. Then, 0.86 g (0.02 equivalent weight and 0.0008 mmol) of $Pd_2(dba)_3$, 6.75 g (1.2 equivalent weight and 0.0528 mol) of t-BuONa, and 0.28 g (0.08 equivalent weight and 0.0035 mmol) of t-$Bu_3P$ were added to the flask and then the flask was heated and agitated for 12 hours to prepare a reaction solution. After the reaction was completed, the reaction solution was filtered through a Celite and purified by column chromatography to obtain 16.77 g (yield=70.5%) of a final Compound 3.

Elementary analysis ($C_{38}H_{24}N_2S$): C, 84.41; H, 4.47; N, 5.18; S, 5.93;

HRMS ($C_{38}H_{24}N_2S$) [M]$^+$: calculated value 540, measured value 539.

Synthesis of Compound 6

10 g (1 equivalent weight and 0.044 mol) of Intermediate B and 21.62 g (1.1 equivalent weight and 0.049 mol) of what were added to a flask and dissolved in 1200 ml of toluene. Then, 0.86 g (0.02 equivalent weight and 0.0008 mmol) of $Pd_2(dba)_3$, 6.75 g (1.2 equivalent weight and 0.0528 mol) of t-BuONa, and 0.28 g (0.08 equivalent weight and 0.0035 mmol) of t-$Bu_3P$ were added to the flask and then the flask was heated and agitated for 12 hours to prepare a reaction solution. After the reaction was completed, the reaction solution was filtered through a Celite and purified by column chromatography to obtain 21.14 g (yield=75.8%) of a final Compound 6.

Elementary analysis ($C_{44}H_{31}NSSi$): C, 83.37; H, 4.93; N, 2.21; S, 5.06; Si, 4.43

HRMS ($C_{44}H_{31}NSSi$) [M]$^+$: calculated value 633, measured value 632.

Synthesis of Compound 8

10 g (1 equivalent weight and 0.044 mol) of Intermediate B and 20.84 g (1.1 equivalent weight and 0.049 mol) of 2-(3'-bromobiphenyl-3-yl)-1-phenyl-1H-benzo[d]imidazole were added to a flask and dissolved in 1200 ml of toluene. Then, 0.86 g (0.02 equivalent weight and 0.0008 mmol) of $Pd_2(dba)_3$, 6.75 g (1.2 equivalent weight and 0.0528 mol) of t-BuONa, and 0.28 g (0.08 equivalent weight and 0.0035 mmol) of t-$Bu_3P$ were added to the flask and then the flask was heated and agitated for 12 hours to prepare a reaction solution. After the reaction was completed, the reaction solution was filtered through a Celite and purified by column chromatography to obtain 20.0 g (yield=80.1%) of a final Compound 8.

Elementary analysis ($C_{39}H_{25}N_3S$): C, 82.51; H, 4.44; N, 7.40; S, 5.65

HRMS ($C_{39}H_{25}N_3S$) [M]$^+$: calculated value 567, measured value 566.

Synthesis of Compound 12

10 g (1 equivalent weight and 0.044 mol) of Intermediate B and 17.56 g (1.1 equivalent weight and 0.049 mol) of 9-(3-(6-bromopyridin-2-yl)phenyl)-9H-carbazole were added to a flask and dissolved in 1200 ml of toluene. Then, 0.86 g (0.02 equivalent weight and 0.0008 mmol) of $Pd_2(dba)_3$, 6.75 g (1.2 equivalent weight and 0.0528 mol) of t-BuONa, and 0.28 g (0.08 equivalent weight and 0.0035 mmol) of t-$Bu_3P$ were added to the flask and then the flask was heated and agitated for 12 hours to prepare a reaction solution. After the reaction was completed, the reaction solution was filtered through a Celite and purified by column chromatography to obtain 18.49 g (yield=77.6%) of a final Compound 12.

Elementary analysis ($C_{37}H_{23}N_3S$): C, 82.04; H, 4.28; N, 7.76; S, 5.92

HRMS ($C_{37}H_{23}N_3S$) [M]$^+$: calculated value 541, measured value 540.

Synthesis of Compound 16

10 g (1 equivalent weight and 0.044 mol) of Intermediate B and 16.67 g (1.1 equivalent weight and 0.049 mol) of 2-bromo-6-(dibenzo[b,d]thiophen-4-yl)pyridine were added to a flask and dissolved in 1200 ml of toluene. Then, 0.86 g (0.02 equivalent weight and 0.0008 mmol) of $Pd_2(dba)_3$, 6.75 g (1.2 equivalent weight and 0.0528 mol) of f-BuONa, and 0.28 g (0.08 equivalent weight and 0.0035 mmol) of t-$Bu_3P$ were added to the flask and then the flask was heated and agitated for 12 hours to prepare a reaction solution. After the reaction was completed, the reaction solution was filtered through a Celite and purified by column chromatography to obtain 15.86 g (yield=74.7%) of a final Compound 16.

Elementary analysis ($C_{31}H_{18}N_2S_2$): C, 77.15; H, 3.76; N, 5.80; S, 13.29

HRMS ($C_{31}H_{18}N_2S_2$) [M]$^+$: calculated value 482, measured value 481.

Intermediates C, D, and E were synthesized according to the reaction scheme below:

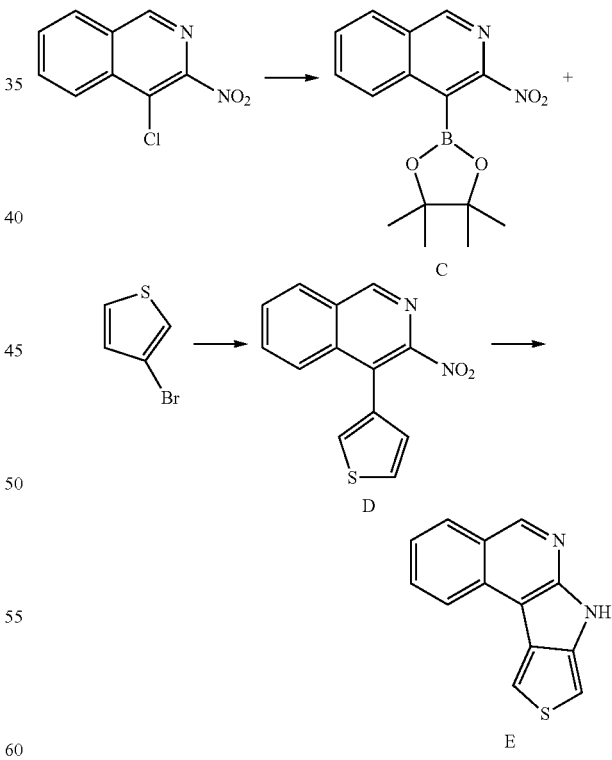

Synthesis of Intermediate C 50 g (1 equivalent weight and 0.239 mol) of 4-chloro-3-nitroisoquinoline, 4.2 g of $Pd(dppf)Cl_2$, 64.2 g (1.2 equivalent weight and 0.287 mol) of bis(pinacolate)diboron, and 38.8 g (4 equivalent weight and 0.95 mol) of potassium acetate were dissolved in 500 ml of 1,4-dioxane to prepare a reaction product. The reaction product was refluxed and agitated for 6 hours and then extracted three times with dichloromethane and distilled water to prepare a product. The product was distilled with column chromatography (Hexane:Ethyl Acetate=9:1 (v:v)) to obtain 57.3 g (yield=86%) of Intermediate C.

$^1$H NMR: 8.56 (d, 1H), 7.81 (d, 1H) 7.55 (m, 5H), 7.30 (m, 3H), 7.28 (t, 1H), 7.21 (m, 2H), 1.26 (s, 12H)

Synthesis of Intermediate D 20 g (1 equivalent weight and 0.066 mol) Intermediate C and 13 g (1.2 equivalent weight and 0.0799 mol) of 3-bromothiophene were added to a flask, and then 1.52 g (0.02 equivalent weight and 0.0013 mol) of Pd(PPh$_3$)$_4$ was added thereto. Then, 400 ml of toluene and 70 nil of 2M of saturated solution of K$_2$CO$_3$ were added to the flask and the flask was refluxed and agitated for 5 hours to prepare a product.

After the reaction was completed, the product was washed and extracted with 400 ml of dichloromethane and 150 ml of distilled water, a solvent was removed from the mixture to prepare a solid, and the solid was purified by column chromatography to obtain 14.2 g (yield 84.5%) of Intermediate D.

$^1$H NMR: 7.22 (d, 1H), 7.78 (m, 3H), 8.12 (m, 3H), 9.07 (s, 1H)

Synthesis of Intermediate E 30 g (1 equivalent weight and 0.117 mol) of Intermediate D, 150 g (0.1 mol) of SnCl$_2$.2H$_2$O, 800 mL of acetic acid, and 80 mL of 1 N HCl were added to a flask and agitated at a temperature of 80° C. overnight to prepare a reaction compound. After a reaction solvent was vacuum distilled, the reaction compound was dissolved in Tetrahydrofuran and Ethyl Acetate, and washed with an NaHCO$_3$ aqueous solution and brine to prepare a reaction product. Water was removed from the reaction product by using anhydrous MgSO$_4$ and then vacuum distilled to prepare a product. The product was recrystallized with MeOH to obtain 9.45 g (yield 36%) of Intermediate E.

$^1$H NMR: 7.27 (s, 2H), 7.67 (m, 5H), 8.91 (d, 1H)

Synthesis of Compound 19

10 g (1 equivalent weight and 0.044 mol) of Intermediate E and 17.75 g (1.1 equivalent weight and 0.049 mol) of 9-(3'-bromobiphenyl-4-yl)-9H-carbazole 1 were added to a flask and dissolved in 900 ml of toluene. Then, 0.86 g (0.02 equivalent weight and 0.0008 mmol) of Pd$_2$(dba)$_3$, 6.75 g (1.2 equivalent weight and 0.0528 mol) of Na(t-bu)O, and 0.28 g (0.08 equivalent weight and 0.0035 mmol) of P(t-Bu)$_3$ were added to the flask and then the flask was heated and agitated for 12 hours to prepare a reaction solution.

After the reaction was completed, the reaction solution was filtered through a Celite and purified by column chromatography to obtain 19.7 g (yield=82.8%) of a final Compound 19.

Elementary analysis (C$_{37}$H$_{23}$N$_3$S): C, 82.04; H, 4.28; N, 7.76; S, 5.92

HRMS (C$_{37}$H$_{23}$N$_3$S) [M]$^+$: calculated value 541, measured value 540.

Synthesis of Compound 24

10 g (1 equivalent weight and 0.044 mol) of Intermediate E and 20.8 g (1.1 equivalent weight and 0.049 mol) of 2-(3'-bromobiphenyl-3-yl)-1-phenyl-1H-benzo[d]imidazole were added to a flask and dissolved in 900 ml of toluene. Then, 0.86 g (0.02 equivalent weight and 0.0008 mmol) of Pd$_2$(dba)$_3$, 6.75 g (1.2 equivalent weight and 0.0528 mol) of Na(t-bu)O, and 0.28 g (0.08 equivalent weight and 0.0035 mmol) of P(t-Bu)$_3$ were added to the flask and then the flask was heated and agitated for 12 hours to prepare a reaction solution.

After the reaction was completed, the reaction solution was filtered through a Celite and purified by column chromatography to obtain 21.9 g (yield=87.8%) of a final Compound 24.

Elementary analysis (C$_{38}$H$_{24}$N$_4$S): C, 80.26; H, 4.25; N, 9.85; S, 5.64

HRMS (C$_{38}$H$_{24}$N$_4$S) [M]$^+$: calculated value 568, measured value 567.

Synthesis of Compound 28

10 g (1 equivalent weight and 0.044 mol) of Intermediate E and 19.5 g (1.1 equivalent weight and 0.049 mol) of 9-(3-(6-bromopyridin-2-yl)phenyl)-9H-carbazole were added to a flask and dissolved in 900 ml of toluene. Then, 0.86 g (0.02 equivalent weight and 0.0008 mmol) of Pd$_2$(dba)$_3$, 6.75 g (1.2 equivalent weight and 0.0528 mol) of Na(t-bu)O, and 0.28 g (0.08 equivalent weight and 0.0035 mmol) of P(t-Bu)$_3$ were added to the flask and then the flask was heated and agitated for 12 hours to prepare a reaction solution.

After the reaction was completed, the reaction solution was filtered through a Celite and purified by column chromatography to obtain 19.3 g (yield=81.1%) of a final Compound 28.

Elementary analysis (C$_{36}$H$_{22}$N$_4$S): C, 79.68; H, 4.09; N, 10.32; S, 5.91

HRMS (C$_{36}$H$_{22}$N$_4$S) [M]$^+$: calculated value 542, measured value 541.

Synthesis of Compound 30

10 g (1 equivalent weight and 0.044 mol) of Intermediate E and 21.6 g (1.1 equivalent weight and 0.049 mol) of 2-bromo-6-(3-(triphenylsilyl)phenyl)pyridine were added to a flask and dissolved in 900 ml of toluene. Then, 0.86 g (0.02 equivalent weight and 0.0008 mmol) of Pd$_2$(dba)$_3$, 6.75 g (1.2 equivalent weight and 0.0528 mol) of Na(t-bu)O, and 0.28 g (0.08 equivalent weight and 0.0035 mmol) of P(t-Bu)$_3$ were added to the flask and then the flask was heated and agitated for 12 hours to prepare a reaction solution.

Thereafter, the reaction solution was filtered through a Celite and purified by column chromatography to obtain 22.1 g (yield=79.4%) of a final Compound 30.

Elementary analysis (C$_{42}$H$_{29}$N$_3$SSi): C, 79.33; H, 4.60; N, 6.61; S, 5.04; Si, 4.42

HRMS (C$_{42}$H$_{29}$N$_3$SSi) [M]$^+$: calculated value 635, measured value 634.

Synthesis of Second Material

Intermediates F to K were synthesized according to Scheme 1 below.

Scheme 1
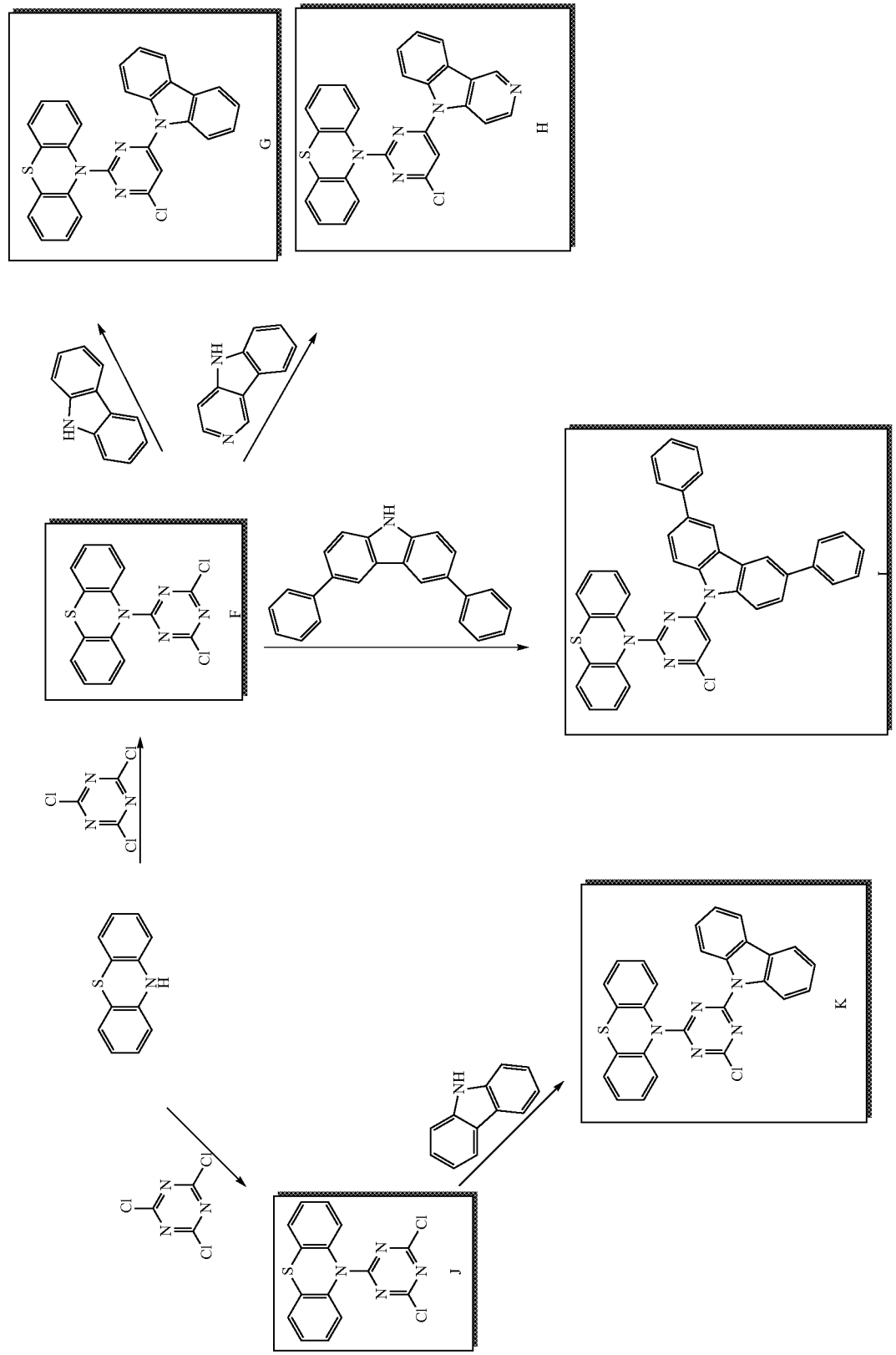

Synthesis of Intermediate F 10 g (1 equivalent weight and 0.05 mol) of 10H-phenothiazine and 10.1 g (1.1 equivalent weight and 0.055 mol) of 2,4,6-trichloropyrimidine were dissolved in 400 ml of toluene. Then, 0.95 g (0.02 equivalent weight and 0.001 mmol) of $Pd_2(dba)_3$, 8.31 g (1.2 equivalent weight and 0.06 mol) of t-BuONa, and 0.12 g (0.08 equivalent weight and 0.004 mmol) of $P(t-Bu)_3$ were added to the flask and then the flask was heated and agitated for 12 hours to prepare a reaction solution.

After the reaction was completed, the reaction solution was filtered through a Celite and purified by column chromatography to obtain 9.7 g (yield=56.4%) of Intermediate F.

GC-Mass: theoretical value: 346.23 g/mol, measured value: 345 g/mol

Synthesis of Intermediate G 20 g (1 equivalent weight and 0.057 mol) of Intermediate F and 10.6 g (1.1 equivalent weight and 0.063 mol) of 9H-carbazole were dissolved in 400 ml of toluene. Then, 0.97 g (0.02 equivalent weight and 0.00114 mmol) of $Pd_2(dba)_3$, 8.4 g (1.2 equivalent weight and 0.068 mol) of t-BuONa, and 0.13 g (0.08 equivalent weight and 0.0045 mmol) of $P(t-Bu)_3$ were added to the flask and then the flask was heated and agitated for 12 hours to prepare a reaction solution.

After the reaction was completed, the reaction solution was filtered through a Celite and purified by column chromatography to obtain 27.18 g (yield=60.8%) of Intermediate G.

GC-Mass: theoretical value: 476.98 g/mol, measured value: 475 g/mol

Synthesis of Intermediate H 20 g (1 equivalent weight and 0.057 mol) of Intermediate F and 10.59 g (1.1 equivalent weight and 0.063 mol) of 5H-pyrido[4,3-b]indole were dissolved in 400 ml of toluene. Then, 0.97 g (0.02 equivalent weight and 0.00114 mmol) of $Pd_2(dba)_3$, 8.4 g (1.2 equivalent weight and 0.068 mol) of t-BuONa, and 0.13 g (0.08 equivalent weight and 0.0045 mmol) of $t-Bu_3P$ were added to the flask and then the flask was heated and agitated for 12 hours to prepare a reaction solution.

After the reaction was completed, the reaction solution was filtered through a Celite and purified by column chromatography to obtain 14.05 g (yield=51.6%) of Intermediate H.

GC-Mass: theoretical value: 477.97 g/mol, measured value: 476 g/mol

Synthesis of Intermediate I 20 g (1 equivalent weight and 0.057 mol) of Intermediate F and 20.12 g (1.1 equivalent weight and 0.063 mol) of 3,6-diphenyl-9H-carbazole were dissolved in 400 ml of toluene. Then, 0.97 g (0.02 equivalent weight and 0.00114 mmol) of $Pd_2(dba)_3$, 8.4 g (1.2 equivalent weight and 0.068 mol) of t-BuONa, and 0.13 g (0.08 equivalent weight and 0.0045 mmol) of $t-Bu_3P$ were added to the flask and then the flask was heated and agitated for 12 hours to prepare a reaction solution.

After the reaction was completed, the reaction solution was filtered through a Celite and purified by column chromatography to obtain 22.8 g (yield=63.7%) of Intermediate I.

GC-Mass: theoretical value: 629.17 g/mol, measured value: 628 g/mol

Synthesis of Intermediate J 10 g (1 equivalent weight and 0.05 mol) of 10H-phenothiazine and 10.14 g (1.1 equivalent weight and 0.055 mol) of 2,4,6-trichloro-1,3,5-triazine were dissolved in 400 ml of toluene. Then, 0.95 g (0.02 equivalent weight and 0.001 mmol) of $Pd_2(dba)_3$, 8.31 g (1.2 equivalent weight and 0.06 mol) of t-BuONa, and 0.12 g (0.08 equivalent weight and 0.004 mmol) of $t-Bu_3P$ were added to the flask and then the flask was heated and agitated for 12 hours to prepare a reaction solution.

After the reaction was completed, the reaction solution was filtered through a Celite and purified by column chromatography to obtain 12.56 g (yield=72.4%) of Intermediate J.

GC-Mass: theoretical value: 347.22 g/mol, measured value: 346 g/mol

Synthesis of Intermediate K 20 g (1 equivalent weight and 0.0576 mol) of Intermediate J and 10.6 g (1.1 equivalent weight and 0.063 mol) of 9H-carbazole were dissolved in 400 ml of toluene. Then, 0.97 g (0.02 equivalent weight and 0.00114 mmol) of $Pd_2(dba)_3$, 8.4 g (1.2 equivalent weight and 0.068 mol) of t-BuONa, and 0.13 g (0.08 equivalent weight and 0.0045 mmol) of $t-Bu_3P$ were added to the flask and then the flask was heated and agitated for 12 hours to prepare a reaction solution.

After the reaction was completed, the reaction solution was filtered through a Celite and purified by column chromatography to obtain 18.36 g (yield=66.7%) of Intermediate K.

GC-Mass: theoretical value: 477.97 g/mol, measured value: 476 g/mol

Intermediates L to Q were synthesized according to Scheme 2 below.

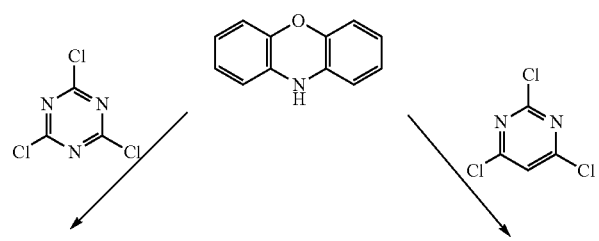

Scheme 2

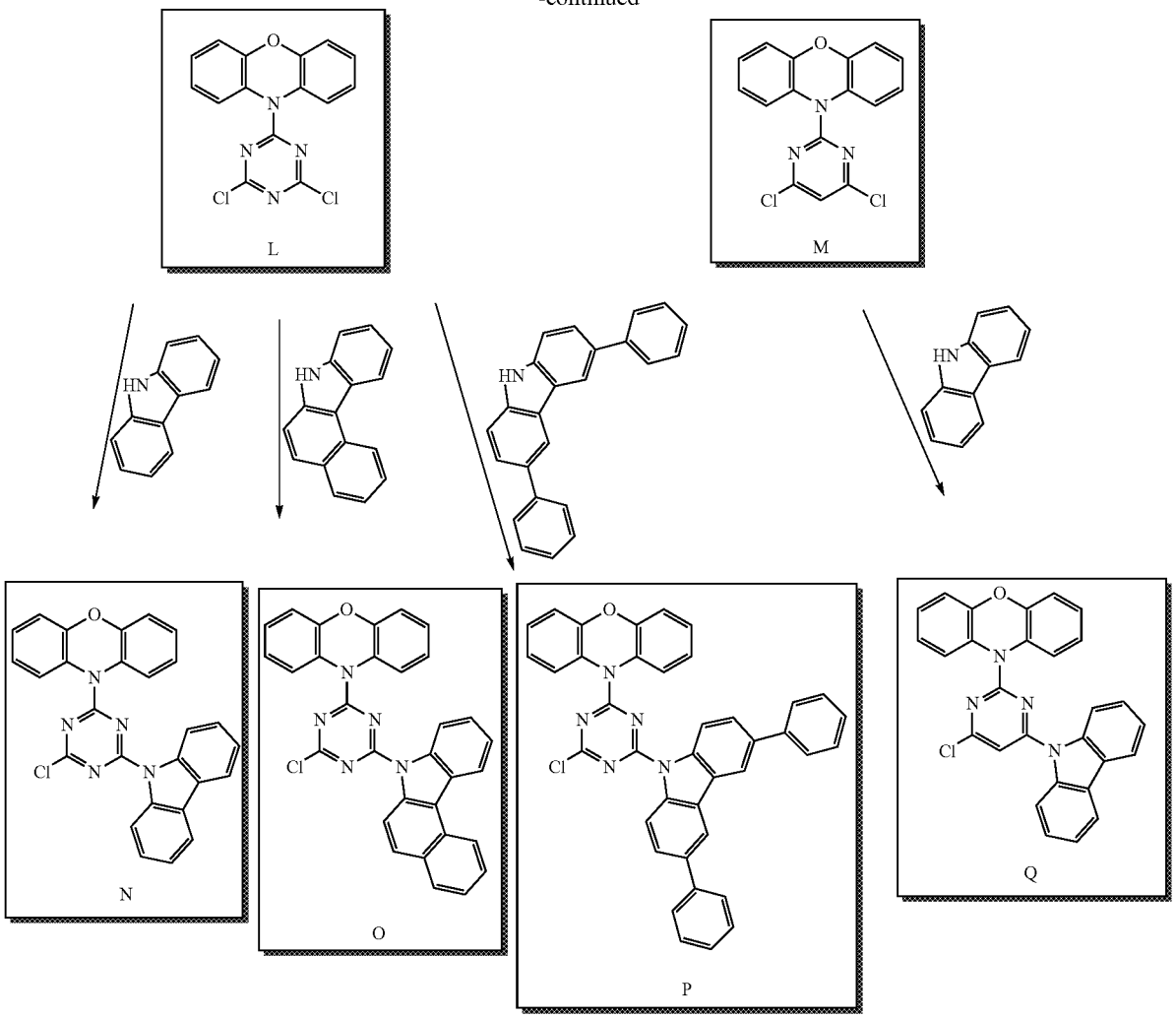

Synthesis of Intermediate L 10 g (1 equivalent weight and 0.054 mol) of 10H-phenoxazine and 10.95 g (1.1 equivalent weight and 0.059 mol) of 2,4,6-trichloro-1,3,5-triazine were dissolved in 600 ml of toluene. Then, 0.95 g (0.02 equivalent weight and 0.001 mmol) of Pd$_2$(dba)$_3$, 8.31 g (1.2 equivalent weight and 0.06 mol) of t-BuONa, and 0.12 g (0.08 equivalent weight and 0.004 mmol) of t-Bu$_3$P were added to the flask and then the flask was heated and agitated for 12 hours to prepare a reaction solution.

After the reaction was completed, the reaction solution was filtered through a Celite and purified by column chromatography to obtain 9.96 g (yield=55.7%) of Intermediate L.

GC-Mass: theoretical value: 341.16 g/mol, measured value: 340 g/mol

Synthesis of Intermediate M 10 g (1 equivalent weight and 0.054 mol) of 10H-phenoxazine and 10.8 g (1.1 equivalent weight and 0.059 mol) of 2,4,6-trichloropyrimidine were dissolved in 400 ml of toluene. Then, 0.95 g (0.02 equivalent weight and 0.001 mmol) of Pd$_2$(dba)$_3$, 8.31 g (1.2 equivalent weight and 0.06 mol) of t-BuONa, and 0.12 g (0.08 equivalent weight and 0.004 mmol) of t-Bu$_3$P were added to the flask and then the flask was heated and agitated for 12 hours to prepare a reaction solution.

After the reaction was completed, the reaction solution was filtered through a Celite and purified by column chromatography to obtain 9.7 g (yield=61.9%) of Intermediate M.

GC-Mass: theoretical value: 330.17 g/mol, measured value: 329 g/mol

Synthesis of Intermediate N 10 g (1 equivalent weight and 0.0293 mol) of Intermediate L and 5.38 g (1.1 equivalent weight and 0.0322 mol) of 9H-carbazole were dissolved in 400 ml of toluene. Then, 0.56 g (0.02 equivalent weight and 0.0005 mmol) of Pd$_2$(dba)$_3$, 6.5 g (1.2 equivalent weight and 0.035 mol) of t-BuONa, and 0.47 g (0.08 equivalent weight and 0.0028 mmol) of t-Bu$_3$P were added to the flask and then the flask was heated and agitated for 12 hours to prepare a reaction solution.

After the reaction was completed, the reaction solution was filtered through a Celite and purified by column chromatography to obtain 8.39 g (yield=62%) of Intermediate N.

GC-Mass: theoretical value: 461.90 g/mol, measured value: 460 g/mol

Synthesis of Intermediate O 10 g (1 equivalent weight and 0.0293 mol) of Intermediate L and 6.99 g (1.1 equivalent weight and 0.0322 mol) of 7H-benzo[c]carbazole were dissolved in 500 ml of toluene. Then, 0.56 g (0.02 equivalent weight and 0.0005 mmol) of $Pd_2(dba)_3$, 6.5 g (1.2 equivalent weight and 0.035 mol) of t-BuONa, and 0.47 g (0.08 equivalent weight and 0.0028 mmol) of $t-Bu_3P$ were added to the flask and then the flask was heated and agitated for 12 hours to prepare a reaction solution.

After the reaction was completed, the reaction solution was filtered through a Celite and purified by column chromatography to obtain 7.8 g (yield=52%) of Intermediate O.

GC-Mass: theoretical value: 511.96 g/mol, measured value: 510 g/mol

Synthesis of Intermediate P 10 g (1 equivalent weight and 0.0293 mol) of Intermediate L and 10.28 g (1.1 equivalent weight and 0.0322 mol) of 3,6-diphenyl-9H-carbazole were dissolved in 500 ml of toluene. Then, 0.56 g (0.02 equivalent weight and 0.0005 mmol) of $Pd_2(dba)_3$, 6.5 g (1.2 equivalent weight and 0.035 mol) of t-BuONa, and 0.47 g (0.08 equivalent weight and 0.0028 mmol) of $t-Bu_3P$ were added to the flask and then the flask was heated and agitated for 12 hours to prepare a reaction solution.

After the reaction was completed, the reaction solution was filtered through a Celite and purified by column chromatography to obtain 9.12 g (yield=50.7%) of Intermediate P.

GC-Mass: theoretical value: 614.09 g/mol, measured value: 613 g/mol

Synthesis of Intermediate Q 10 g (1 equivalent weight and 0.03 mol) of Intermediate M and 5.38 g (1.1 equivalent weight and 0.0322 mol) of 9H-carbazole were dissolved in 500 ml of toluene. Then, 0.56 g (0.02 equivalent weight and 0.0005 mmol) of $Pd_2(dba)_3$, 6.5 g (1.2 equivalent weight and 0.035 mol) of t-BuONa, and 0.47 g (0.08 equivalent weight and 0.0028 mmol) of $t-Bu_3P$ were added to the flask and then the flask was heated and agitated for 12 hours to prepare a reaction solution.

After the reaction was completed, the reaction solution was filtered through a Celite and purified by column chromatography to obtain 13.82 g (yield=66.4%) of Intermediate Q.

GC-Mass: theoretical value: 460.91 g/mol, measured value: 459 g/mol

Synthesis of Compound 49

10 g (1 equivalent weight and 0.03 mol) of Intermediate G and 5.38 g (1.1 equivalent weight and 0.0322 mol) of 2-(4,4,5,5-tetramethyl-1,3,2-dioxaborolan-2-yl)pyrimidine were dissolved in 500 ml of toluene and added to a flask. Then, 1.52 g (0.02 equivalent weight and 0.0013 mol) of $Pd(PPh_3)_4$ was added to the flask. 400 ml of toluene and 70 ml of 2M saturated solution of $K_2CO_3$ were added to the flask to prepare a mixture, and the mixture was refluxed and agitated for 5 hours to prepare a reaction product.

After the reaction was completed, the reaction product was washed and extracted with 400 ml of dichloromethane and 150 ml of distilled water, a solvent was removed from the reaction product to prepare a solid, and the solid was purified by using column chromatography to obtain 14.2 g (yield 84.5%) of Compound 49.

$^1$H NMR: 7.22 (d, 1H), 7.78 (m, 3H), 8.12 (m, 3H), 9.07 (s, 1H).

Elementary analysis: C, 73.83; H, 3.87; N, 16.14; S, 6.16.

Synthesis of Compound 53

10 g (1 equivalent weight and 0.03 mol) of Intermediate G and 7.1 g (1.1 equivalent weight and 0.0322 mol) of 3-(4,4,5,5-tetramethyl-1,3,2-dioxaborolan-2-yl) were dissolved in 600 ml of toluene and added to a flask. 1.52 g (0.02 equivalent weight and 0.0013 mol) of $Pd(PPh_3)_4$ was added to the flask. 200 ml of toluene and 70 nil of 2M saturated solution of $K_2CO_3$ were added to the flask to prepare a mixture, and the mixture was refluxed and agitated for 5 hours to prepare a reaction product.

After the reaction was completed, the reaction product was washed and extracted with 400 ml of dichloromethane and 150 ml of distilled water, a solvent was removed from the reaction product to prepare a solid, and the solid was purified by using column chromatography to obtain 13.9 g (yield 81.5%) of Compound 53.

$^1$H NMR: 8.97 (d, 2H), 8.55 (m, 3H), 7.92 (m, 7H), 7.78 (m, 12H).

Elementary analysis: C, 75.77; H, 3.89; N, 14.73; S, 5.62.

Synthesis of Compound 56

10 g (1 equivalent weight and 0.04 mol) of Intermediate G and 7.5 g (1.1 equivalent weight and 0.044 mol) of naphthalen-2-ylboronic acid were dissolved in 200 ml of toluene and added to a flask. 0.92 g (0.02 equivalent weight and 0.0008 mol) of $Pd(PPh_3)_4$ was added to the flask. 400 ml of toluene and 50 ml of 2M saturated solution of $K_2CO_3$ were added to the flask to prepare a mixture, and the mixture was refluxed and agitated for 5 hours to prepare a reaction product.

After the reaction was completed, the reaction product was washed and extracted with 400 ml of dichloromethane and 150 ml of distilled water, a solvent was removed from the reaction product to prepare a solid, and the solid was purified by using column chromatography to obtain 17.5 g (yield 77.4%) of Compound 56.

GC-Mass: theoretical value: 568.17 g/mol, measured value: 567 g/mol

Elementary analysis: C, 80.26; H, 4.25; N, 9.85; 8, 5.64

Synthesis of Compound 59

10 g (1 equivalent weight and 0.03 mol) of Intermediate I and 5.38 g (1.1 equivalent weight and 0.0322 mol) of 2-(4,4,5,5-tetramethyl-1,3,2-dioxaborolan-2-yl)pyridine were dissolved in 500 ml of toluene and added to a flask. 1.52 g (0.02 equivalent weight and 0.0013 mol) of $Pd(PPh_3)_4$ was added to the flask. 400 ml of toluene and 70 ml of 2M saturated solution of $K_2CO_3$ were added to the flask to prepare a mixture, and the mixture was refluxed and agitated for 5 hours to prepare a reaction product.

After the reaction was completed, the reaction product was washed and extracted with 400 ml of dichloromethane and 150 ml of distilled water, a solvent was removed from the reaction product to prepare a solid, and the solid was purified by using column chromatography to obtain 14.2 g (yield 84.5%) of Compound 59.

$^1$H NMR: 7.22 (d, 1H), 7.78 (m, 3H), 8.12 (m, 3H), 9.07 (s, 1H).

Synthesis of Compound 63

10 g (1 equivalent weight and 0.03 mol) of Intermediate K and 7.1 g (1.1 equivalent weight and 0.0322 mol) of naphthalen-1-ylboronic acid were dissolved in 600 ml of toluene and added to a flask. 1.52 g (0.02 equivalent weight and 0.0013 mol) of $Pd(PPh_3)_4$ was added to the flask. 200 mg of toluene and 70 ml of 2M saturated solution of $K_2CO_3$ were added to the flask to prepare a mixture, and the mixture was refluxed and agitated for 5 hours to prepare a reaction product.

After the reaction was completed, the reaction product was washed and extracted with 400 ml of dichloromethane and 150 ml of distilled water, a solvent was removed from the reaction product to prepare a solid, and the solid was purified by using column chromatography to obtain 14.2 g (yield 84.5%) of Compound 63.

$^1$H NMR: 6.99 (t, 2H), 7.22 (m, 9H), 7.78 (m, 4H), 8.12 (m, 5H), 9.07 (t, 2H).

Elementary analysis: C, 78.01; H, 4.07; N, 12.29; S, 5.63

Synthesis of Compound 69

10 g (1 equivalent weight and 0.03 mol) of Intermediate Q and 5.1 g (1.1 equivalent weight and 0.0322 mol) of isoquinolin-3-ylboronic acid were dissolved in 500 me of toluene and added to a flask. 1.52 g (0.02 equivalent weight and 0.0013 mol) of Pd(PPh$_3$)$_4$ was added to the flask. 200 ml of toluene and 70 ml of 2M saturated solution of K$_2$CO$_3$ were added to the flask to prepare a mixture, and the mixture was refluxed and agitated for 5 hours to prepare a reaction product.

After the reaction was completed, the reaction product was washed and extracted with 400 ml of dichloromethane and 150 ml of distilled water, a solvent was removed from the reaction product to prepare a solid, and the solid was purified by using column chromatography to obtain 12.7 g (yield 79%) of Compound 69.

$^1$H NMR: 6.78 (t, 2H), 7.22 (m, 6H), 7.42 (m, 6H), 7.78 (m, 5H), 8.12 (d, 1H), 9.07 (s, 1H).

Elementary analysis: C, 80.27; H, 4.19; N, 12.65; O, 2.89.

Synthesis of Compound 74

10 g (1 equivalent weight and 0.03 mol) of Intermediate N and 4.7 g (1.1 equivalent weight and 0.0322 mol) of 2-(4,4,5,5-tetramethyl-1,3,2-dioxaborolan-2-yl)pyridine were dissolved in 500 ml of toluene and added to a flask. 1.52 g (0.02 equivalent weight and 0.0013 mol) of Pd(PPh$_3$)$_4$ was added to the flask. 400 ml of toluene and 70 ml of 2 M saturated solution of K$_2$CO$_3$ were added to the flask to prepare a mixture, and the mixture was refluxed and agitated for 5 hours to prepare a reaction product.

After the reaction was completed, the reaction product was washed and extracted with 400 ml of dichloromethane and 150 ml of distilled water, a solvent was removed from the reaction product to prepare a solid, and the solid was purified by using column chromatography to obtain 14.2 g (yield 84.5%) of Compound 74.

$^1$H NMR: 6.99 (t, 2H), 7.22 (m, 6H), 7.52 (m, 5H), 7.78 (m, 4H), 8.12 (m, 1H), 9.07 (t, 2H).

Elementary analysis: C, 76.18; H, 4.00; N, 16.66; O, 3.17

Synthesis of Compound 75

10 g (1 equivalent weight and 0.03 mol) of Intermediate P and 4.7 g (1.1 equivalent weight and 0.0322 mol) of 2-(4,4,5,5-tetramethyl-1,3,2-dioxaborolan-2-yl)pyridine were dissolved in 500 ml of toluene and added to a flask. 1.52 g (0.02 equivalent weight and 0.0013 mol) of Pd(PPh$_3$)$_4$ was added to the flask. 400 ml of toluene and 70 ml of 2M saturated solution of K$_2$CO$_3$ were added to the flask to prepare a mixture, and the mixture was refluxed and agitated for 5 hours to prepare a reaction product.

After the reaction was completed, the reaction product was washed and extracted with 400 ml of dichloromethane and 150 ml of distilled water, a solvent was removed from the reaction product to prepare a solid, and the solid was purified by using column chromatography to obtain 13.6 g (yield 81.5%) of Compound 75.

$^1$H NMR: 6.99 (t, 2H), 7.22 (m, 6H), 7.52 (m, 5H), 7.78 (m, 4H), 8.12 (m, 1H), 9.07 (t, 2H).

Elementary analysis: C, 80.47; H, 4.30; N, 12.80; O, 2.44.

Synthesis of Compound 76

10 g (1 equivalent weight and 0.03 mol) of Intermediate O and 5.38 g (1.1 equivalent weight and 0.0322 mol) of 2-(4,4,5,5-tetramethyl-1,3,2-dioxaborolan-2-yl)pyridine were dissolved in 500 ml of toluene and added to a flask. 1.52 g (0.02 equivalent weight and 0.0013 mol) of Pd(PPh$_3$)$_4$ was added to the flask. 400 ml of toluene and 70 ml of 2M saturated solution of K$_2$CO$_3$ were added to the flask to prepare a mixture, and the mixture was refluxed and agitated for 5 hours to prepare a reaction product.

After the reaction was completed, the reaction product was washed and extracted with 400 ml of dichloromethane and 150 ml of distilled water, a solvent was removed from the reaction product to prepare a solid, and the solid was purified by using column chromatography to obtain 22.7 g (yield 87.1%) of Compound 76.

$^1$H NMR: 6.89 (t, 2H), 7.2 (m, 5H), 7.49 (m, 7H), 7.9 (m, 3H), 8.22 (m, 2H)

Elementary analysis: C, 77.96; H, 4.00; N, 15.15; O, 2.88.

Synthesis of Compound 77

10 g (1 equivalent weight and 0.03 mol) of Intermediate H and 2.7 g (1.1 equivalent weight and 0.0322 mol) of phenyl boronic acid were dissolved in 400 ml of toluene and added to a flask. 1.34 g (0.02 equivalent weight and 0.001 mol) of Pd(PPh$_3$)$_4$ was added to the flask. 250 ml of toluene and 50 ml of 2M saturated solution of K$_2$CO$_3$ were added to the flask to prepare a mixture, and the mixture was refluxed and agitated for 5 hours to prepare a reaction product.

After the reaction was completed, the reaction product was washed and extracted with 400 ml of dichloromethane and 150 ml of distilled water, a solvent was removed from the reaction product to prepare a solid, and the solid was purified by using column chromatography to obtain 17.7 g (yield 91%) of Compound 77.

$^1$H NMR: 6.97 (m, 2H), 7.22 (m, 24H), 7.78 (d, 1H), 8.12 (m, 4H), 9.07 (s, 1H).

Elementary analysis: C, 73.83; H, 3.87; N, 16.14; S, 6.16

Synthesis of Compound 80

10 g (1 equivalent weight and 0.03 mol) of Intermediate H and 5.8 g (1.1 equivalent weight and 0.033 mol) of phenanthrene-9-yl boronic acid were dissolved in 500 ml of toluene and added to a flask. 1.52 g (0.02 equivalent weight and 0.0013 mol) of Pd(PPh$_3$)$_4$ was added to the flask. 500 ml of toluene and 70 ml of 2M saturated solution of K$_2$CO$_3$ were added to the flask to prepare a mixture, and the mixture was refluxed and agitated for 5 hours to prepare a reaction product.

After the reaction was completed, the reaction product was washed and extracted with 400 ml of dichloromethane and 150 ml of distilled water, a solvent was removed from the reaction product to prepare a solid, and the solid was purified by using column chromatography to obtain 14.2 g (yield 84.5%) of Compound 80.

$^1$H NMR: 7.10 (m, 10H), 7.78 (d, 1H), 8.10 (m, 8H), 8.47 (d, 1H), 8.55 (d, 1H), 8.98 (d, 2H), 9.07 (s, 1H).

Elementary analysis: C, 77.40; H, 3.90; N, 13.54; S, 5.17

Synthesis of Compound 82

10 g (1 equivalent weight and 0.03 mol) of Intermediate H and 6.2 g (1.1 equivalent weight and 0.0322 mol) of pyrene-4-yl boronic acid were dissolved in 600 ml of toluene and added to a flask. 1.52 g (0.02 equivalent weight and 0.0013 mol) of Pd(PPh$_3$)$_4$ was added to the flask. 600 ml of toluene and 90 nil of 2M saturated solution of K$_2$CO$_3$ were added to the flask to prepare a mixture, and the mixture was refluxed and agitated for 5 hours to prepare a reaction product.

After the reaction was completed, the reaction product was washed and extracted with 400 ml of dichloromethane and 150 ml of distilled water, a solvent was removed from the reaction product to prepare a solid, and the solid was purified by using column chromatography to obtain 12.9 g (yield 81.4%) of Compound 82.

$^1$H NMR: 7.10 (m, 2H), 7.62 (m, 8H), 7.88 (d, 1H), 7.99 (m, 6H), 8.12 (d, 1H), 8.47 (d, 1H), 8.55 (d, 1H), 9.07 (s, 1H).

Elementary analysis: C, 78.24; H, 3.75; N, 13.03; S, 4.97

Example 1

As an anode, a Corning 15 Ω/cm² (500 Å) ITO glass substrate was cut into a size of 50 mm×50 mm×0.7 mm, and the ITO glass substrate was ultrasonically washed using isopropyl alcohol and distilled water for 10 minutes, followed by irradiation of UV and exposure to ozone for cleaning for about 10 minutes. The ITO glass substrate was then loaded onto a vacuum deposition device.

2-TNATA was vacuum deposited on the substrate to form an HIL having a thickness of 600 Å, and 4,4'-bis[N-(1-naphthyl)-N-phenyl amino]biphenyl (NPB) was vacuum deposited thereto to form an HTL having a thickness of 300 Å.

A host material in which Compound 1 and Compound 49 were mixed in a weight ratio of 50:50, and bis-(1-phenylisoquinolyl)iridium(III)acetylacetonate, as a dopant material, were simultaneously vacuum co-deposited (weight ratio of the host material:the dopant material=90:10) on the HTL to form an EML having a thickness of 300 Å.

Alq$_3$ was vacuum deposited on the EML to form an ETL having a thickness of 300 Å, and Al was vacuum deposited on the EIL to form a cathode having a thickness of 1200 Å, thereby manufacturing an organic light-emitting diode.

Example 2

An organic light-emitting diode was manufactured in the same manner as in Example 1, except Compound 1 and Compound 49 were mixed, in the host material, in a weight ratio of 20:70.

Example 3

An organic light-emitting diode was manufactured in the same manner as in Example 1, except Compound 2 was used instead of Compound 1 in the host material.

Example 4

An organic light-emitting diode was manufactured in the same manner as in Example 1, except Compound 3 was used instead of Compound 1 in the host material.

Example 5

An organic light-emitting diode was manufactured in the same manner as in Example 1, except Compound 5 and Compound 56 were used instead of Compound 1 and Compound 49, respectively, in the host material.

Example 6

An organic light-emitting diode was manufactured in the same manner as in Example 1, except Compound 6 and Compound 60 were used instead of Compound 1 and Compound 49, respectively, in the host material.

Example 7

An organic light-emitting diode was manufactured in the same manner as in Example 1, except Compound 8 and Compound 62 were used instead of Compound 1 and Compound 49, respectively, in the host material.

Comparative Example 1

An organic light-emitting diode was manufactured in the same manner as in Example 1, except Compound A and Compound B, which are shown below, were used instead of Compound 1 and Compound 49, respectively.

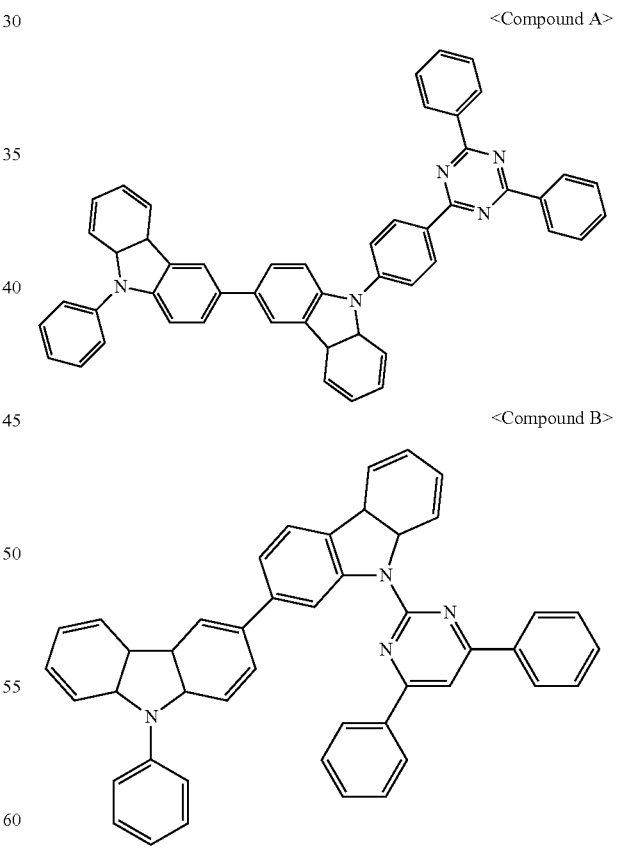

<Compound A>

<Compound B>

Comparative Example 2

An organic light-emitting diode was manufactured in the same manner as in Example 1, except Compound C and Compound D, which are shown below, were used instead of Compound 1 and Compound 49, respectively.

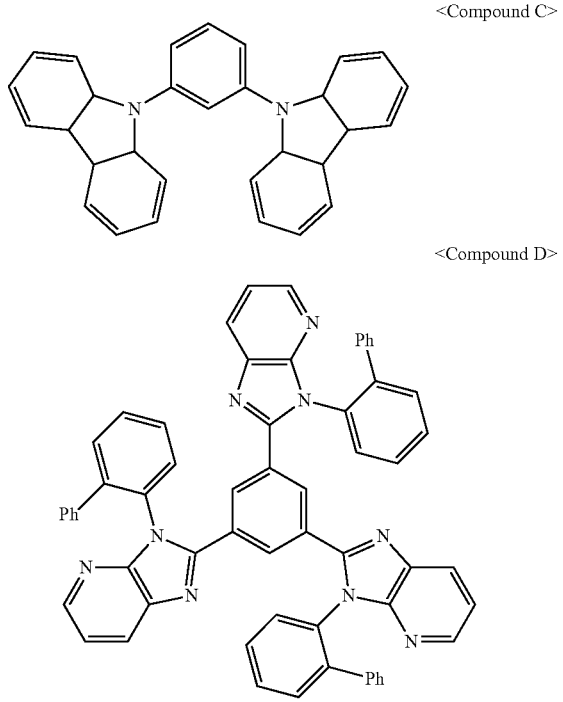

<Compound C>

<Compound D>

Evaluation Example 1

Current density, voltage, external quantum efficiency, and lifespan of the organic light-emitting diodes manufactured in Examples 1 to 7 and Comparative Examples 1 and 2 were evaluated by using a PR650 Spectroscan Source Measurement Unit (product of PhotoResearch). A lifespan of T90 shows the amount of time it takes for brightness to decrease up to 90%, assuming that the initial brightness is 100% under a current density condition of 10 mA/cm$^2$. The results are illustrated in Table 1.

According to Table 1, the organic light-emitting diodes of Examples 1 to 7 have higher efficiency, lower operating voltage, and longer lifespan than Comparative Examples 1 and 2.

The organic light-emitting diode of the present invention may be a high definition organic light-emitting diode having good light-emitting properties and a long lifespan.

While the present invention has been particularly shown and described with reference to exemplary embodiments thereof, it will be understood by those of ordinary skill in the art that various changes in form and details may be made therein without departing from the spirit and scope of the present invention as defined by the following claims and equivalents thereof.

What is claimed is:

1. An organic light-emitting diode comprising:
a first electrode, a second electrode, and an organic layer between the first electrode and the second electrode, the organic layer comprising at least one first material represented by Formula 1 and at least one second material represented by Formula 2:

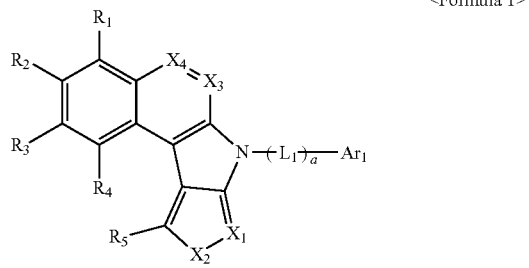

<Formula 1>

TABLE 1

|  | The first material | The second material | Ratio (w:w:w) | Current density (mA/cm$^2$) | Efficiency (cd/A) | Operating voltage (V) | T90 lifespan (hr) |
| --- | --- | --- | --- | --- | --- | --- | --- |
| Comparative Example 1 | Compound A | Compound B | 50:50:10 | 10 | 13.7 | 6.4 | 10 |
| Comparative Example 2 | Compound C | Compound D | 50:50:10 | 10 | 14.1 | 6.2 | 12 |
| Example 1 | Compound 1 | Compound 49 | 50:50:10 | 10 | 24.2 | 4.7 | 36 |
| Example 2 | Compound 1 | Compound 49 | 20:70:10 | 10 | 28.2 | 4.1 | 18 |
| Example 3 | Compound 2 | Compound 49 | 50:50:10 | 10 | 15.2 | 5.1 | 8 |
| Example 4 | Compound 3 | Compound 49 | 50:50:10 | 10 | 18.1 | 5.2 | 15 |
| Example 5 | Compound 5 | Compound 56 | 50:50:10 | 10 | 14.9 | 4.9 | 42 |
| Example 6 | Compound 5 | Compound 60 | 50:50:10 | 10 | 19.4 | 5.1 | 28 |
| Example 7 | Compound 8 | Compound 62 | 50:50:10 | 10 | 29.1 | 3.9 | 11 |

<Formula 2>

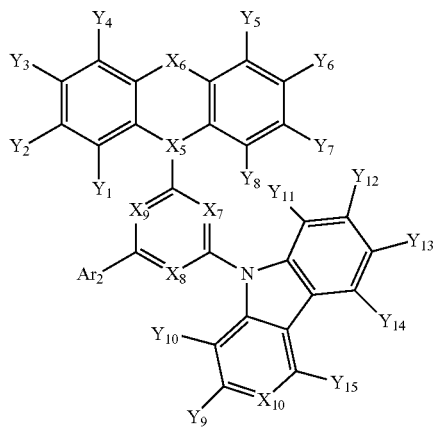

in Formulae 1 and 2:
$X_1$ is selected from $CR_{11}$ and N;
$X_2$ is selected from $C(R_{12})(R_{13})$, $NR_{14}$, S and O;
$X_3$ and $X_4$ are each independently selected from $CR_{15}$ and N;
$R_1$ to $R_5$ and $R_{11}$ to $R_{15}$ are each independently selected from a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, and a substituted or unsubstituted $C_2$-$C_{30}$ heteroaryl group;
$Ar_1$ is selected from a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, $-N(Q_1)(Q_2)$ and $-Si(Q_3)(Q_4)(Q_5)$ (where, $Q_1$ to $Q_5$ are each independently selected from a hydrogen atom, a deuterium atom, a halogen atom, a hydroxyl group, a cyano group, an amino group, a nitro group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_2$-$C_{30}$ heteroaryl group);
$L_1$ is selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene, a substituted or unsubstituted $C_2$-$C_{10}$ heterocycloalkenylene, a substituted or unsubstituted $C_6$-$C_{60}$ arylene group, and a substituted or unsubstituted $C_2$-$C_{60}$ heteroarylene group;
a is an integer from 0 to 3;
X5 is N and X6 is selected from O and S;
$X_7$, $X_8$ and $X_9$ are each independently selected from N, O, S and $C(R_{20})$;
$X_{10}$ is selected from N and $C(R_{21})$;
$Y_1$ to $Y_{15}$, $R_{20}$ and $R_{21}$ are each independently selected from a hydrogen atom, deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, and a substituted or unsubstituted $C_2$-$C_{30}$ heteroaryl group;
$Ar_2$ is selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{30}$ aryl group, and a substituted or unsubstituted $C_2$-$C_{30}$ heteroaryl group; and
when $Y_{15}$ and $R_{21}$ are connected with each other, they form a ring.

2. The organic light-emitting diode of claim 1, wherein $R_1$ to $R_5$ and $R_{11}$ to $R_{15}$ are each independently selected from hydrogen atom, deuterium atom, a halogen atom, a hydroxyl group, a cyano group, a nitro group, a substituted or unsubstituted $C_1$-$C_{30}$ alkyl group, a substituted or unsubstituted $C_6$-$C_{30}$ aryl group, and a substituted or unsubstituted $C_2$-$C_{30}$ heteroaryl group.

3. The organic light-emitting diode of claim 1, wherein $R_1$ to $R_5$ and $R_{11}$ to $R_{15}$ are each independently selected from a hydrogen atom, a deuterium atom, —F, a cyano group, a nitro group, a substituted or unsubstituted methyl group, a substituted or unsubstituted ethyl group, a substituted or unsubstituted propyl group, a substituted or unsubstituted butyl group, a substituted or unsubstituted phenyl group, a substituted or unsubstituted biphenyl group, a substituted or unsubstituted naphthyl group, a substituted or unsubstituted anthryl group, a substituted or unsubstituted phenanthrenyl group, a substituted or unsubstituted pyrenyl group, a substituted or unsubstituted indolyl group, a substituted or unsubstituted indenyl group, a substituted or unsubstituted fluorenyl group, and a substituted or unsubstituted carbazolyl group.

4. The organic light-emitting diode of claim 1, wherein $R_1$ to $R_5$ and $R_{11}$ to $R_{15}$ are each independently selected from a hydrogen atom and a deuterium atom.

5. The organic light-emitting diode of claim 1, wherein $Ar_1$ is selected from a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, and —Si($Q_3$)($Q_4$)($Q_5$)(where, $Q_3$ to $Q_5$ are each independently selected from a substituted or unsubstituted $C_1$-$C_{30}$ alkyl group, a substituted or unsubstituted $C_6$-$C_{30}$ aryl group, and a substituted or unsubstituted $C_2$-$C_{30}$ heteroaryl group).

6. The organic light-emitting diode of claim 1, wherein $Ar_1$ is selected from a group represented by Formulae 8-1 to 8-20 (where * is a binding site to $(L_1)_a$):

8-1
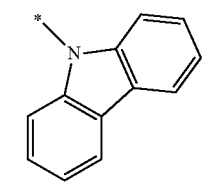

8-2
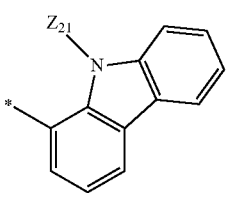

8-3
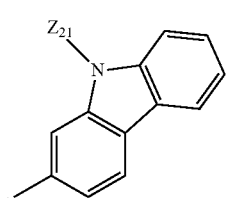

8-4
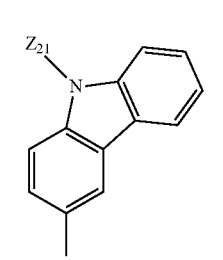

8-5
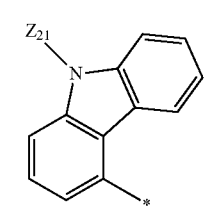

8-6
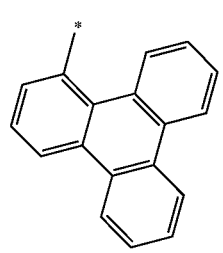

-continued 8-7
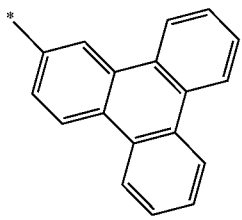

8-8
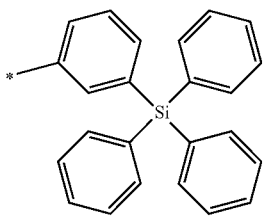

8-9
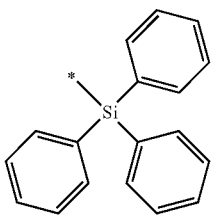

8-10
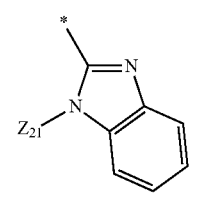

8-11
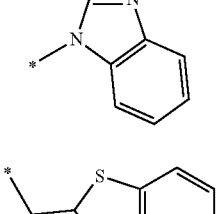

8-12
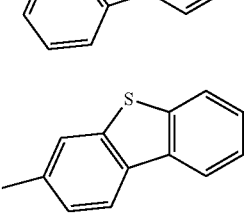

8-13
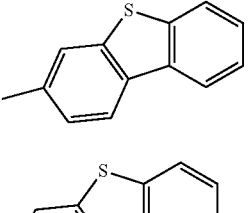

8-14
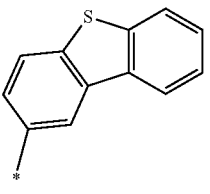

-continued
8-15
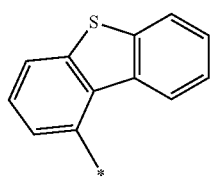
8-16
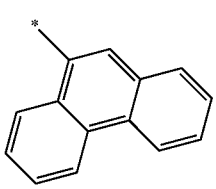
8-17
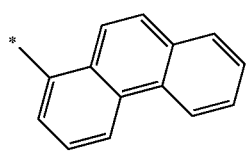
8-18
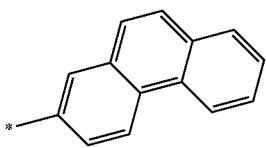
8-19
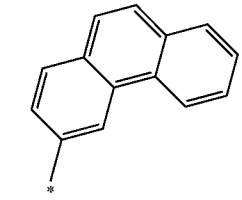
8-20
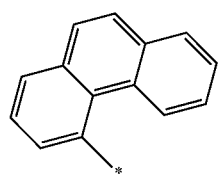
in Formulae 8-1 to 8-20:
$Z_{21}$ is selected from a phenyl group, a naphthyl group, a fluorenyl group, a phenanthrenyl group, and an anthryl group.
7. The organic light-emitting diode of claim 1, wherein a moiety represented by *-(L$_1$)$_a$-** (where, * is a binding site to a corresponding N and ** is a binding site to Ar$_1$) is selected from a group represented by Formulae 9-1 to 9-17:
9-1
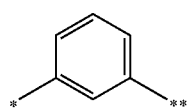
-continued
9-2
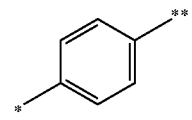
9-3
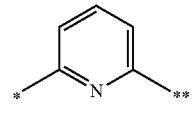
9-4
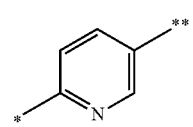
9-5
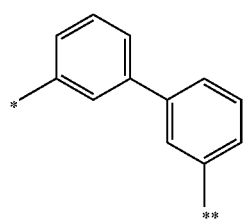
9-6
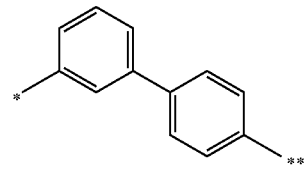
9-7
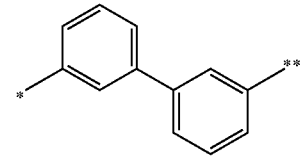
9-8
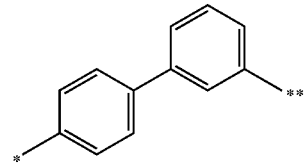
9-9
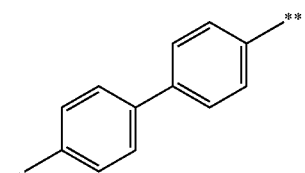
9-10
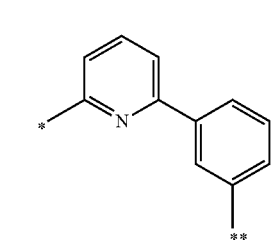

-continued 9-11 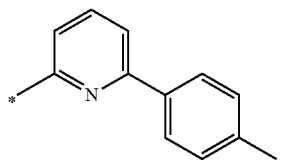

9-12 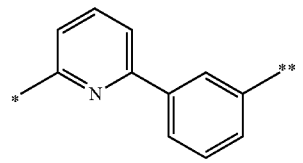

9-13 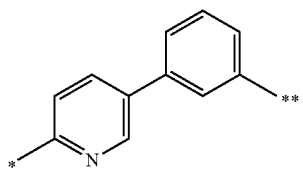

9-14 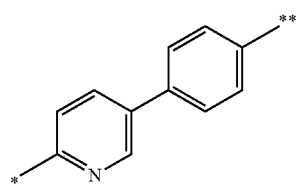

9-15 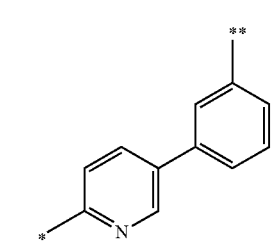

9-16 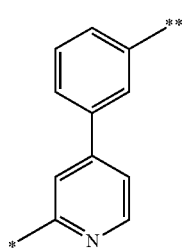

9-17 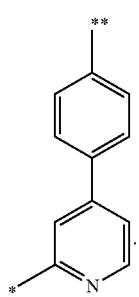

8. The organic light-emitting diode of claim 1, wherein the first material is represented by Formula 1a:

<Formula 1a>

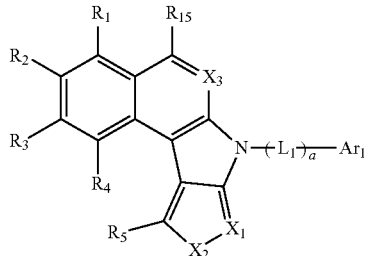

in Formula 1a:
$X_1$ is selected from $CR_{11}$ and N;
$X_2$ is selected from $C(R_{12})(R_{13})$, $NR_{14}$, S, and O;
$X_3$ and $X_4$ are each independently selected from $CR_{15}$ and N;
$R_1$ to $R_5$ and $R_{15}$ are each independently selected from a hydrogen atom, a deuterium atom, —F, a cyano group, a nitro group, a substituted or unsubstituted methyl group, a substituted or unsubstituted ethyl group, a substituted or unsubstituted propyl group, a substituted or unsubstituted butyl group, a substituted or unsubstituted phenyl group, a substituted or unsubstituted biphenyl group, a substituted or unsubstituted naphthyl group, a substituted or unsubstituted anthryl group, a substituted or unsubstituted phenanthrenyl group, a substituted or unsubstituted pyrenyl group, a substituted or unsubstituted indolyl group, a substituted or unsubstituted indenyl group, a substituted or unsubstituted fluorenyl group, and a substituted or unsubstituted carbazolyl group;
$Ar_1$ is selected from a group represented by Formulae 8-1 to 8-20 (where, in Formulae 8-1 to 8-20, * is a binding site to $(L_1)_a$):

8-1
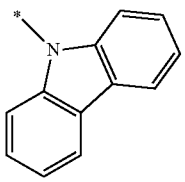

8-2
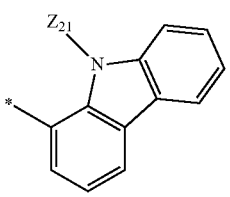

8-3
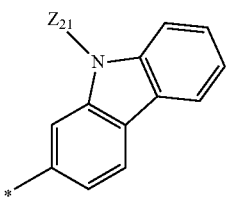

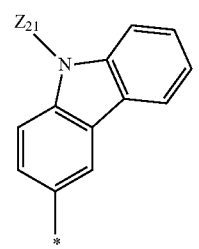
8-4
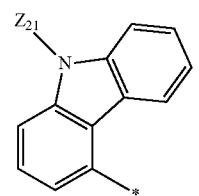
8-5
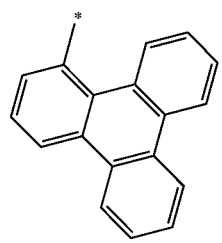
8-6
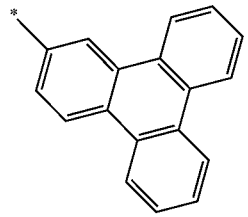
8-7
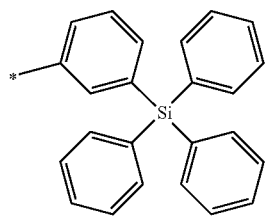
8-8
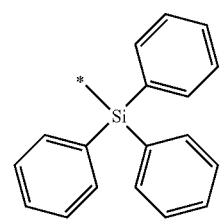
8-9
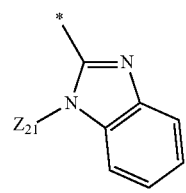
8-10
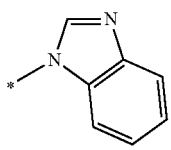
8-11
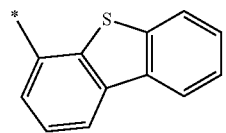
8-12
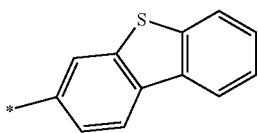
8-13
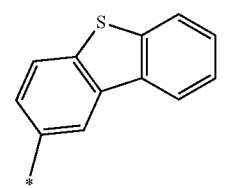
8-14
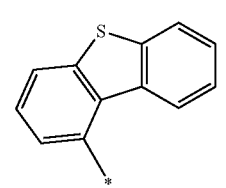
8-15
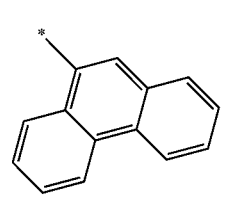
8-16
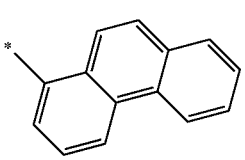
8-17
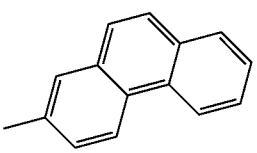
8-18
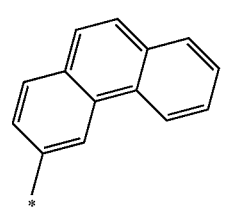
8-19

8-20
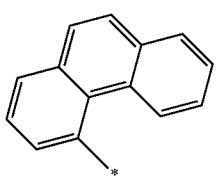
a moiety represented by *-(L₁)ₐ-** (where, in Formulae 9-1 to 9-17, * is a binding site to a corresponding N and ** is a binding site to Ar₁) is selected from a group represented by Formulae 9-1 to 9-17:
9-1
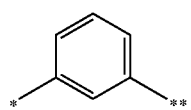
9-2
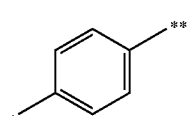
9-3
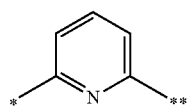
9-4
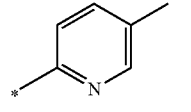
9-5
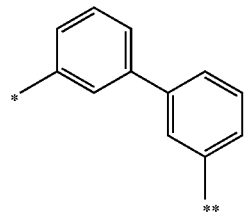
9-6
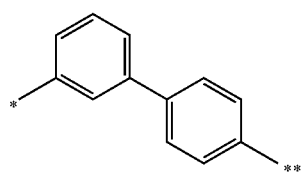
9-7
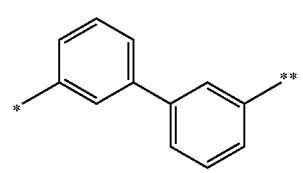
9-8
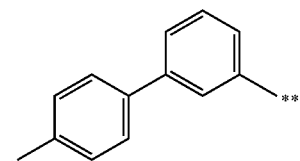
9-9
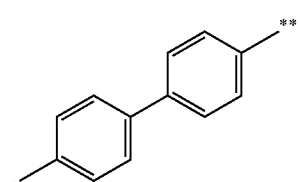
9-10
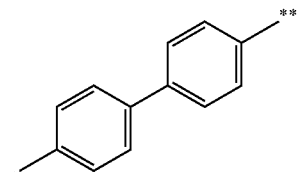
9-11
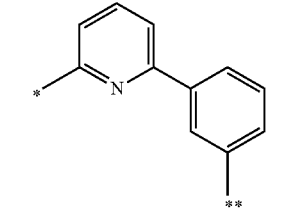
9-12
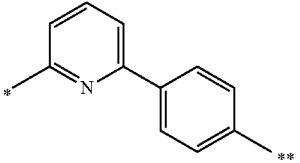
9-13
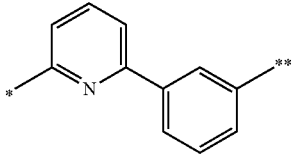
9-14
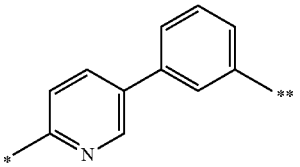
9-15
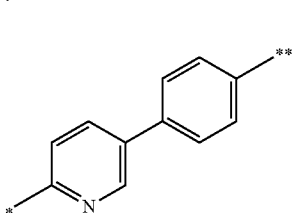

-continued
9-16
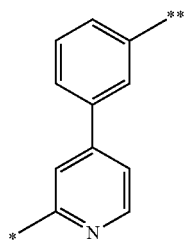
9-17
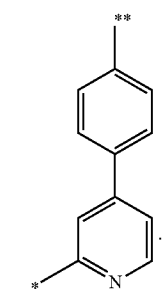
9. The organic light-emitting diode of claim 1, wherein the first material is any one selected from a group represented by Formulae 1b to 1e:
<Formula 1b>
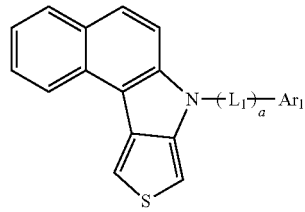
<Formula 1c>
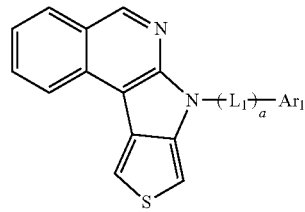
<Formula 1d>
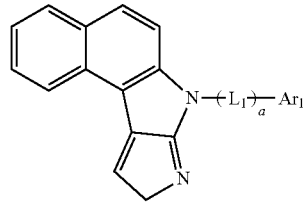
<Formula 1e>
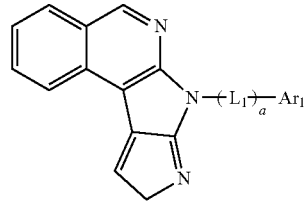
in Formulae 1b to 1e:
$Ar_1$ is selected from a group represented by Formulae 8-1 to 8-20 (where, in Formulae 8-1 to 8-20, * is a binding site to $(L_1)_a$):
8-1
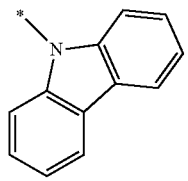
8-2
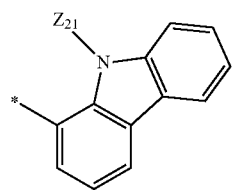
8-3
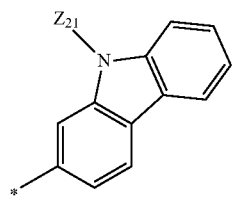
8-4
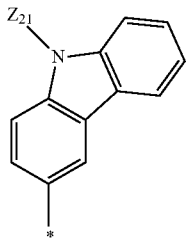
8-5
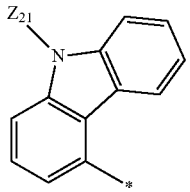
8-6
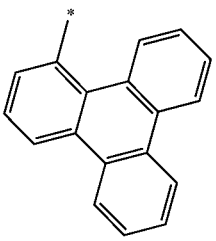

-continued
8-7 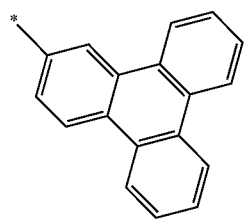
8-8 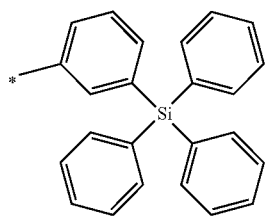
8-9 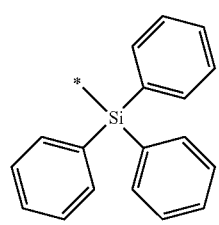
8-10 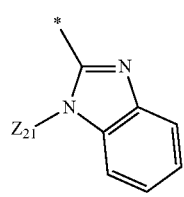
8-11 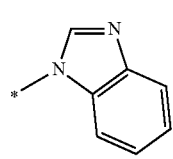
8-12 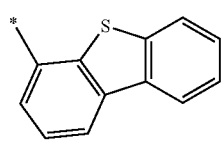
8-13 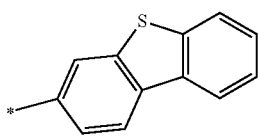
8-14 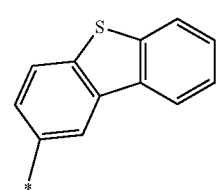
-continued
8-15 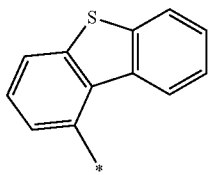
8-16 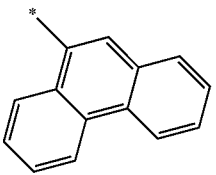
8-17 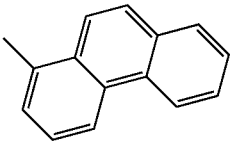
8-18 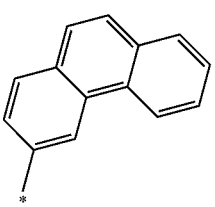
8-19 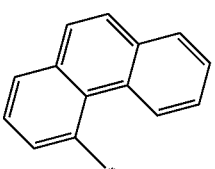
8-20 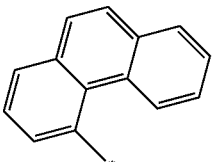
a moiety represented by *-(L$_1$)$_a$-** (where, in Formulae 9-1 to 9-17, * is a binding site to a corresponding N and ** is a binding site to Ar$_1$) is selected from a group represented by Formulae 9-1 to 9-17:
9-1 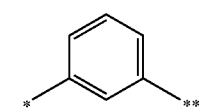
9-2 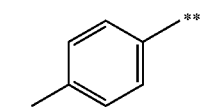

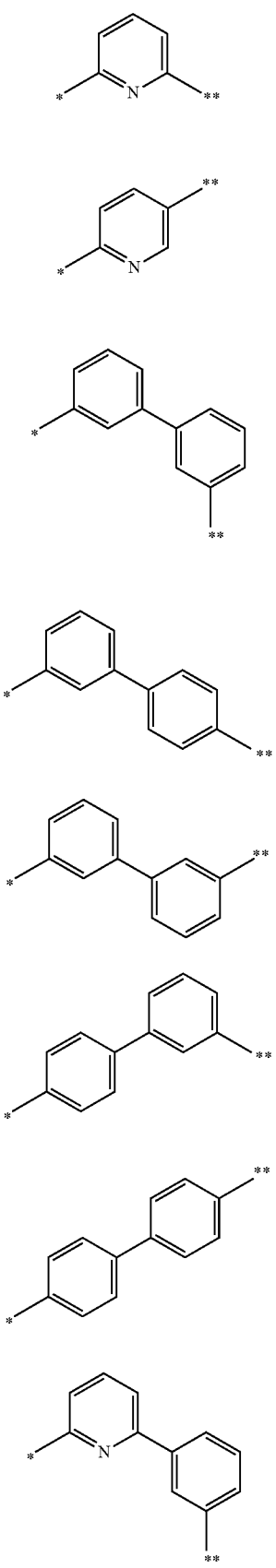
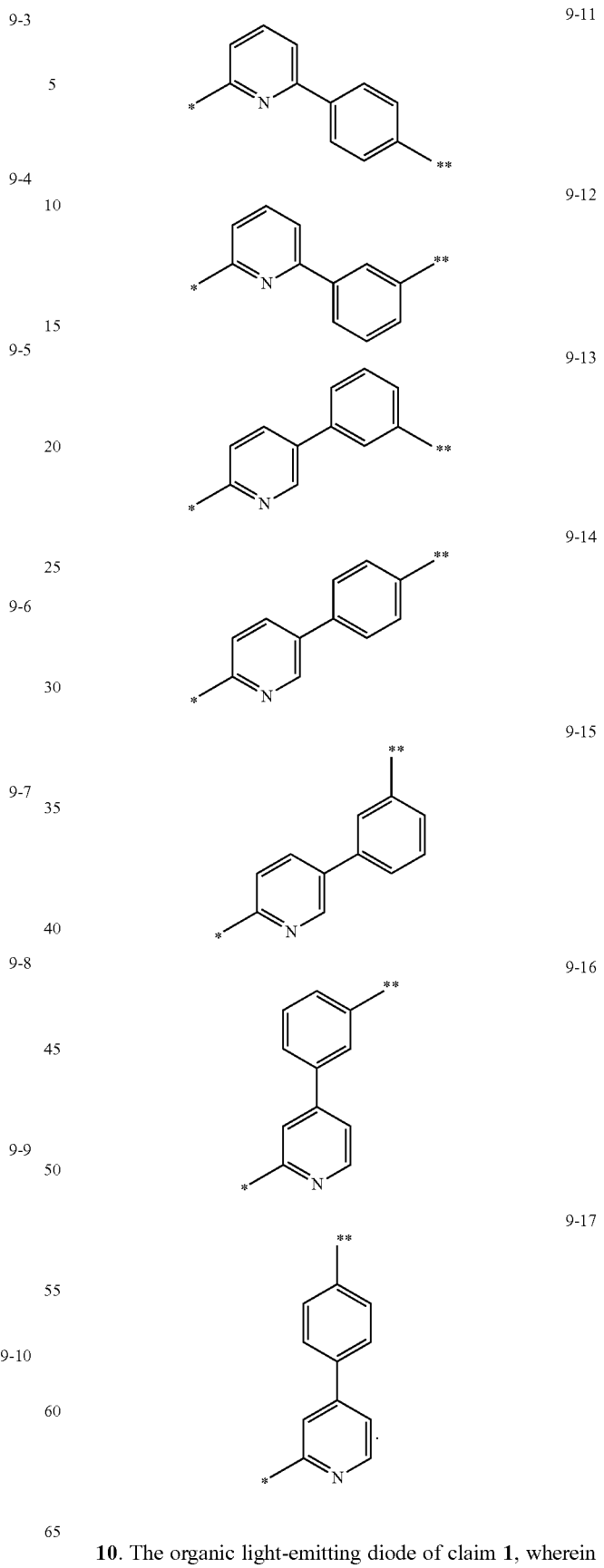
10. The organic light-emitting diode of claim 1, wherein the first material is any one selected from Compounds 1 to 48:

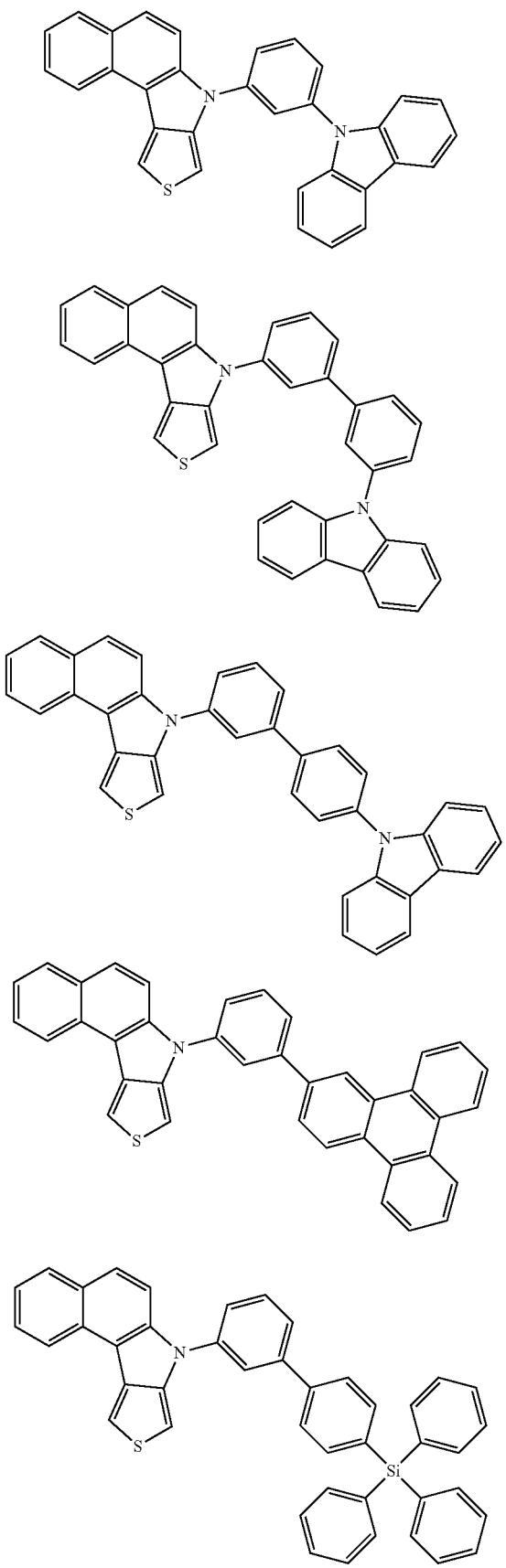

11
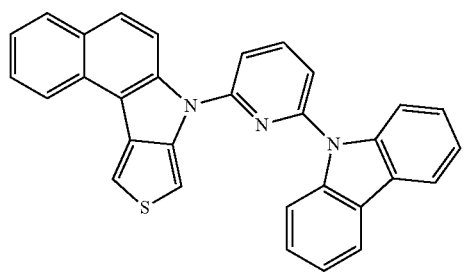
12
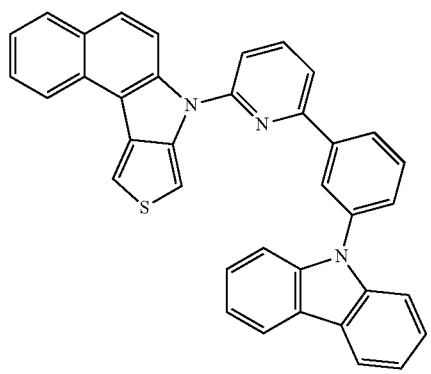
13
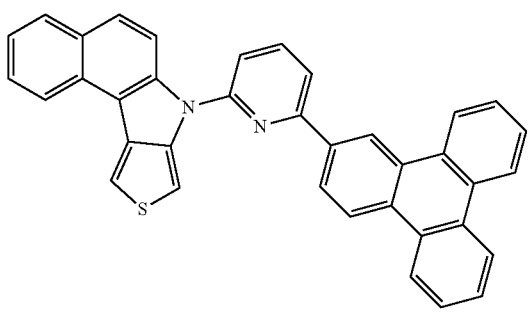
14
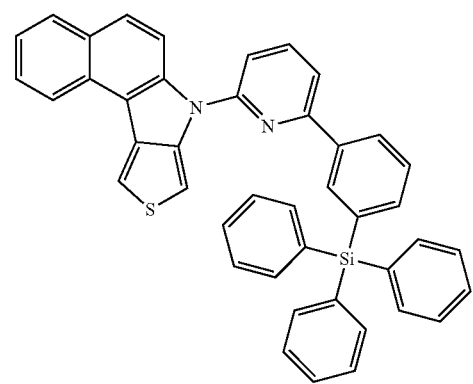
15
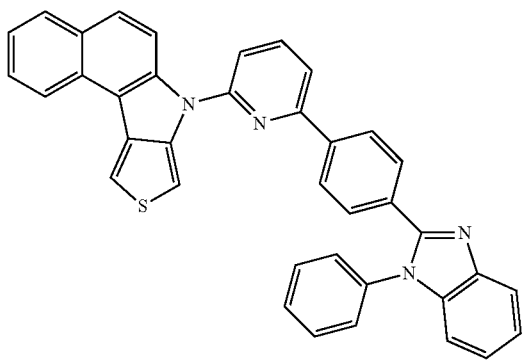
16
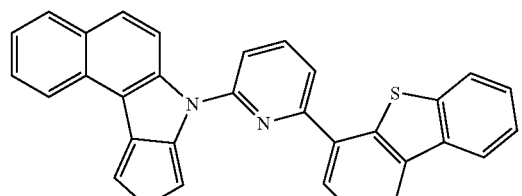
17
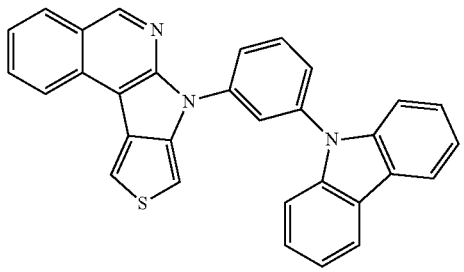
18
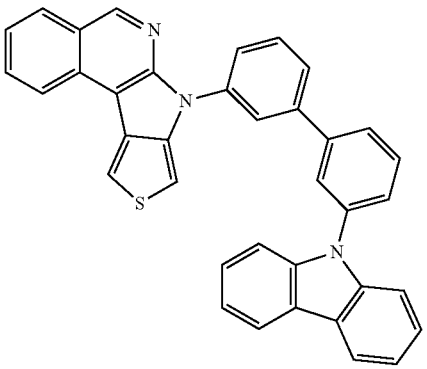
19
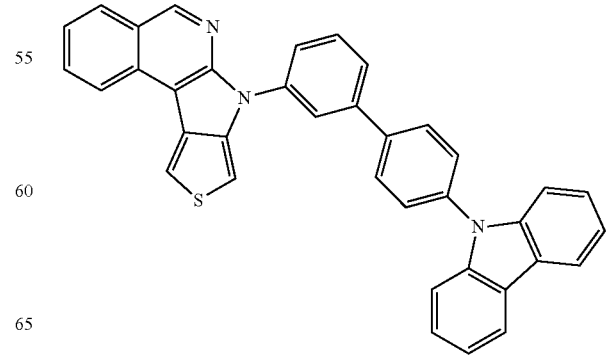

-continued
20
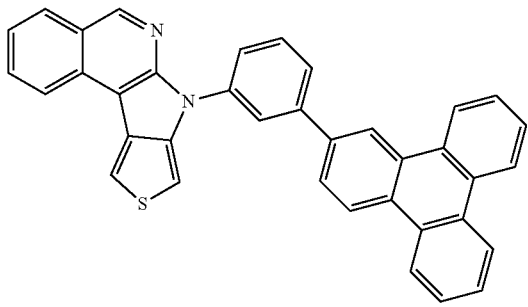
21
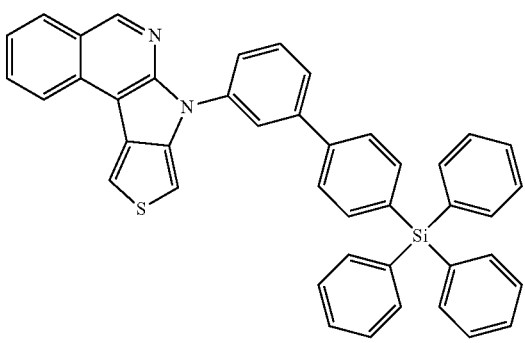
22
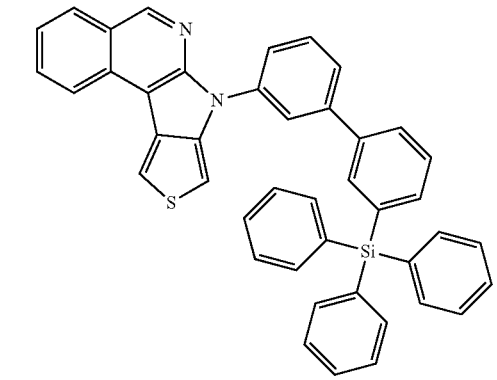
23
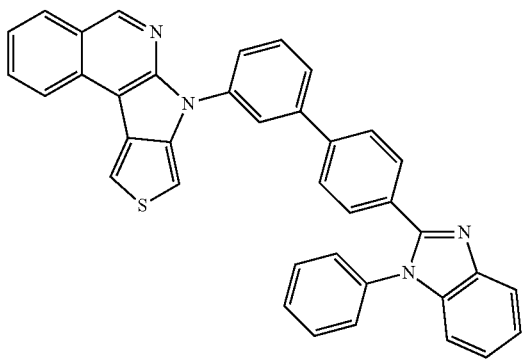
-continued
24
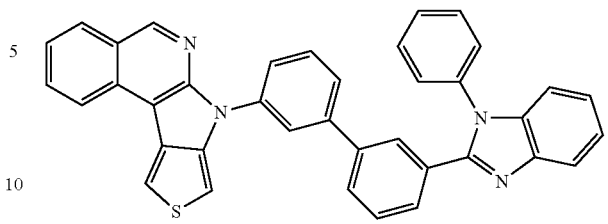
25
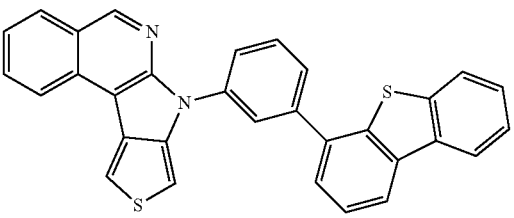
26
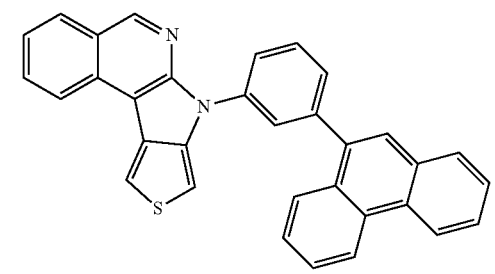
27
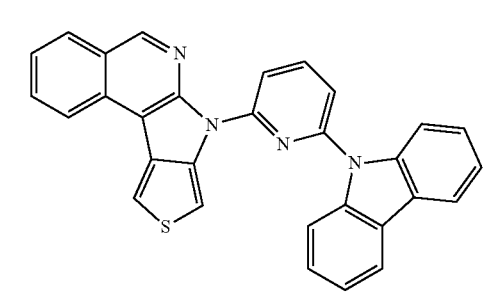
28
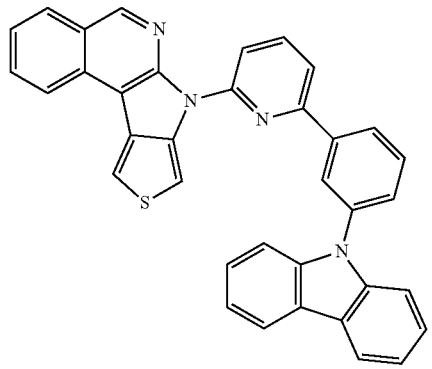

29
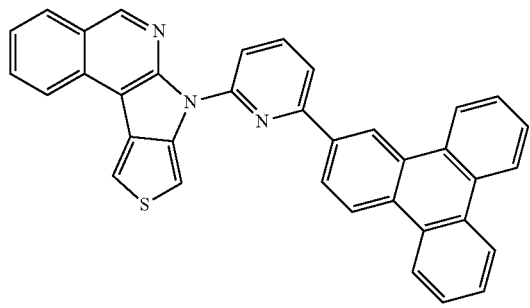
30
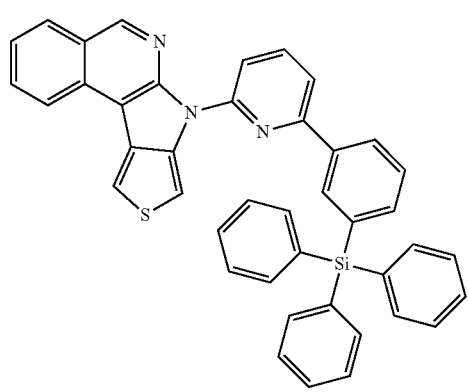
31
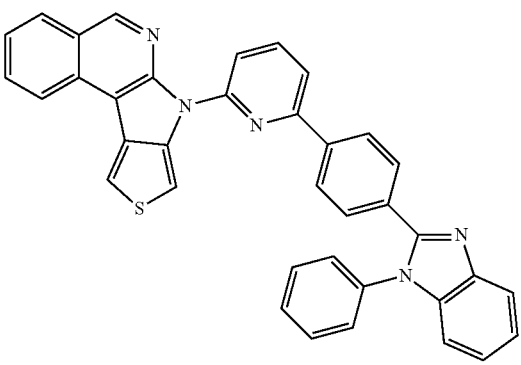
32
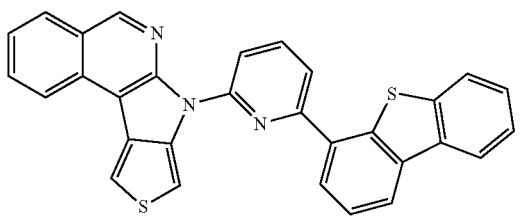
33
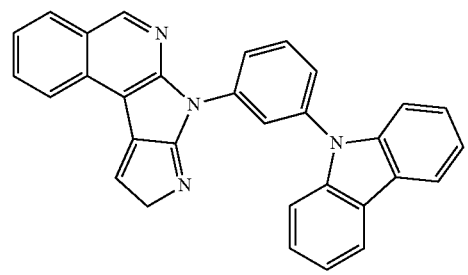
34
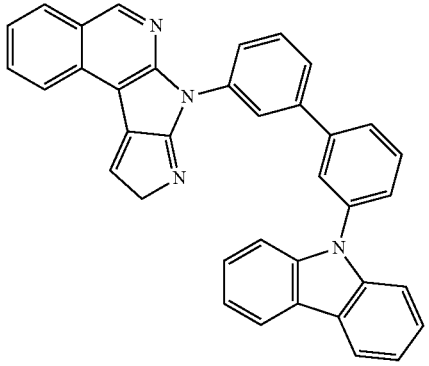
35
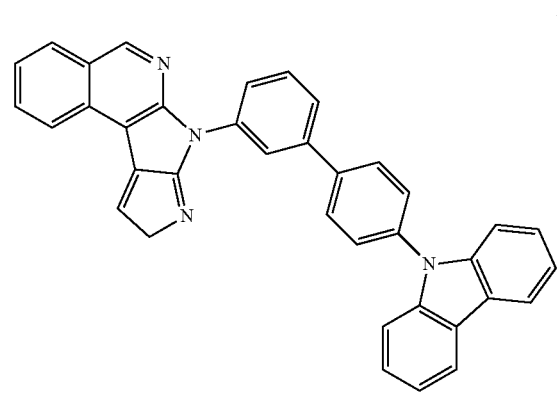
36
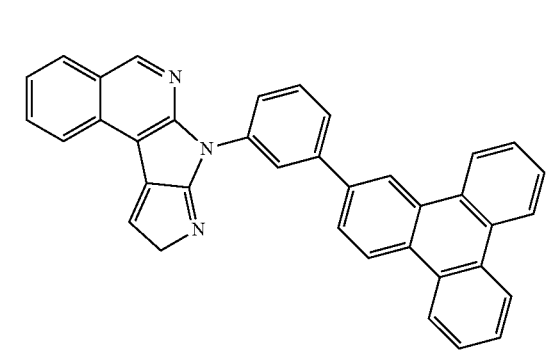
37
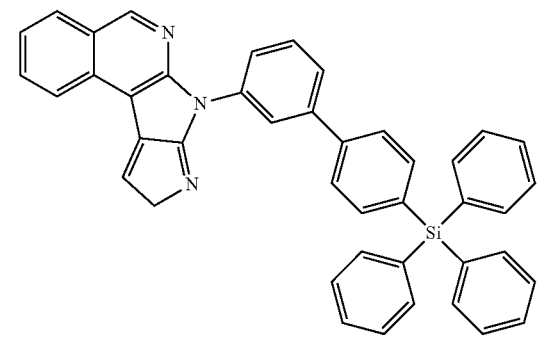

38
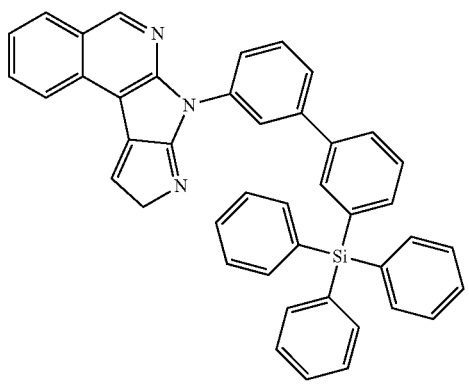
39
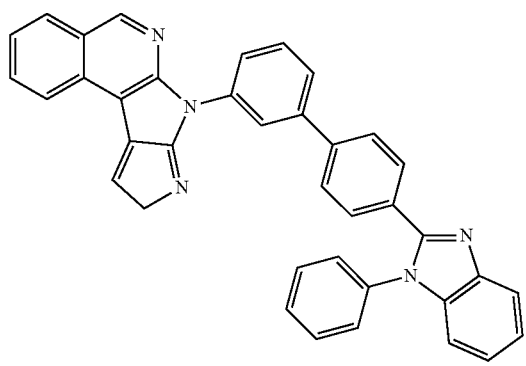
40
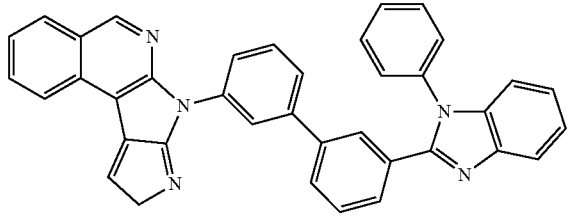
41
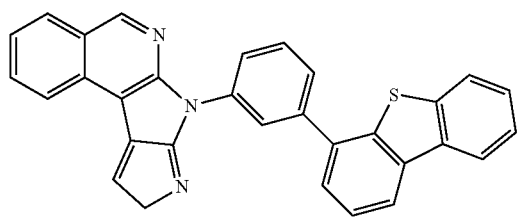
42
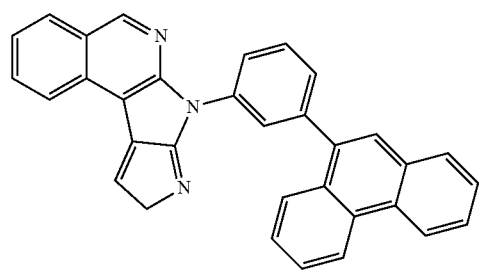
43
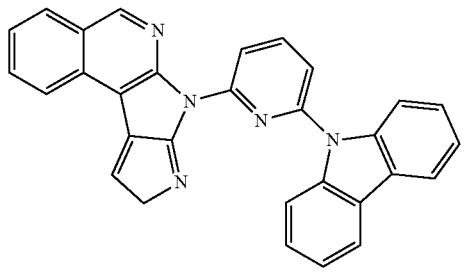
44
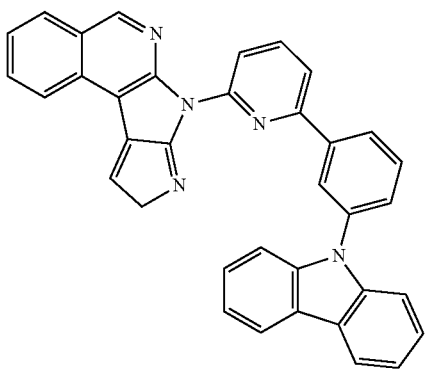
45
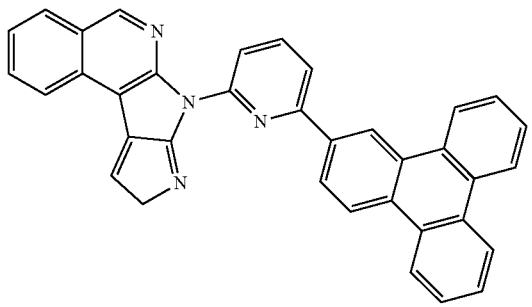
46
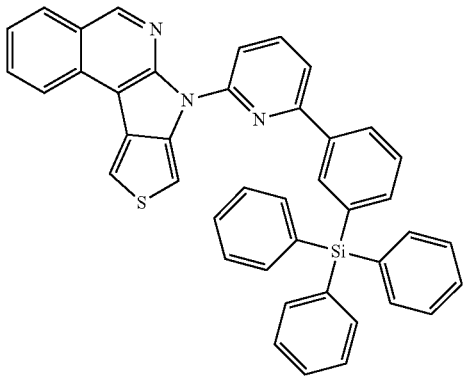

47

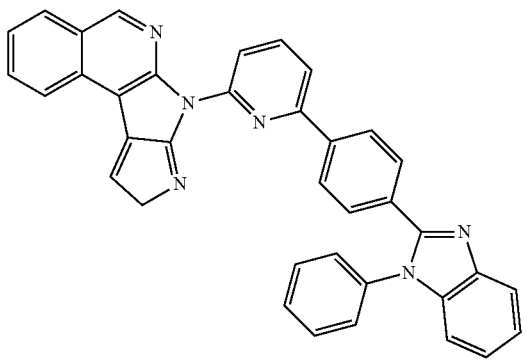

48

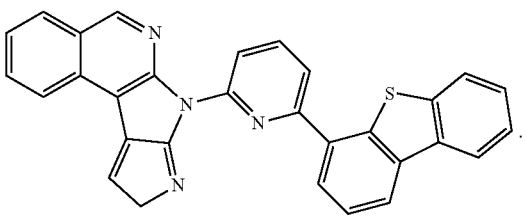

11. The organic light-emitting diode of claim 1, wherein Ar₂ is any one selected from Formulae 10-1 to 10-8:

10-1
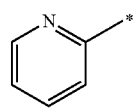

10-2
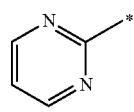

10-3
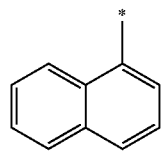

10-4
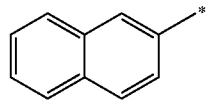

10-5
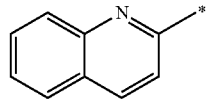

10-6
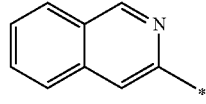

10-7

10-8

12. The organic light-emitting diode of claim 1, wherein $Y_1$ to $Y_8$ are each independently selected from a hydrogen atom and a deuterium atom.

13. The organic light-emitting diode of claim 1, wherein $Y_9$ to $Y_{15}$, $R_{20}$, and $R_{21}$ are each independently selected from a hydrogen atom, a deuterium atom, and a substituted or unsubstituted $C_6$-$C_{60}$ aryl group.

14. The organic light-emitting diode of claim 1, wherein $Y_9$ to $Y_{15}$, $R_{20}$, and $R_{21}$ are each independently selected from a hydrogen atom, a deuterium atom, and a phenyl group.

15. The organic light-emitting diode of claim 1, wherein in Formula 2, a moiety represented by

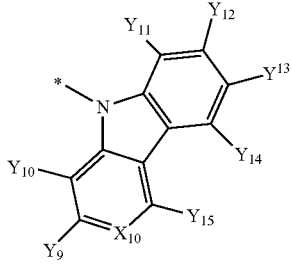

(where, * is a binding site to a ring that comprises $X_7$ to $X_9$) is any one selected from a group represented by Formulae 11-1 to 11-3:

11-1
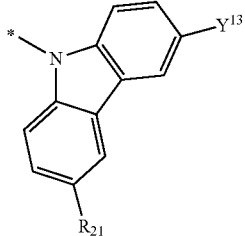

11-2
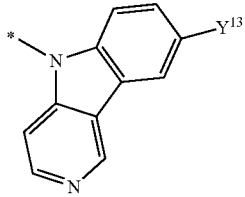

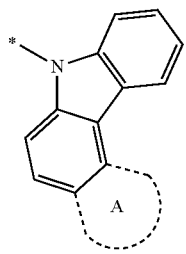

in Formulae 11-1 to 11-3:
$Y_{13}$ and $R_{21}$ are each independently selected from a hydrogen atom, a deuterium atom, and a phenyl group; and ring A is selected from a benzene, a naphthalene, and an anthracene.

16. The organic light-emitting diode of claim 1, wherein the second material is any one selected from a group represented by Formulae 2a to 2d:

<Formula 2a>

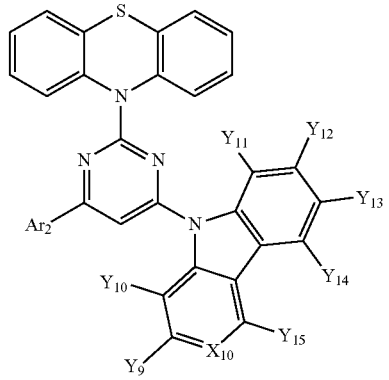

<Formula 2b>

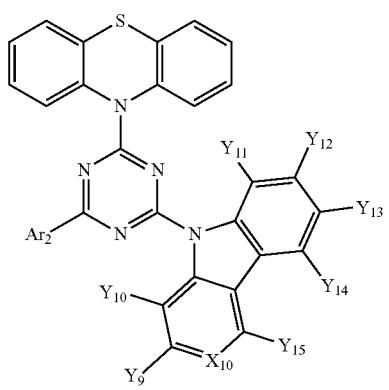

<Formula 2c>

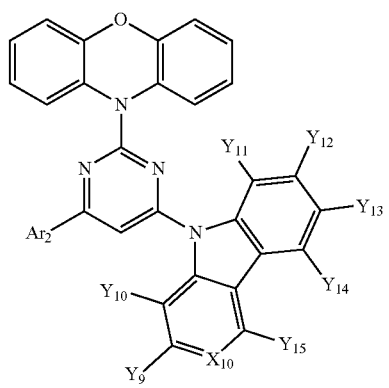

<Formula 2d>

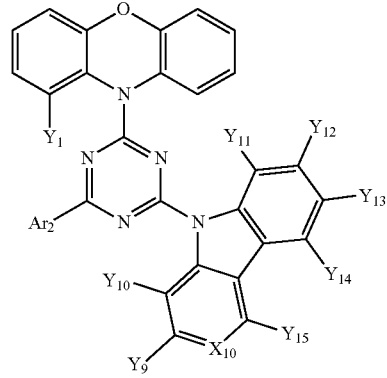

in Formulae 2a to 2d:
Are is any one selected from Formulae 10-1 to 10-8:

10-1
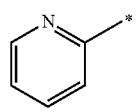

10-2
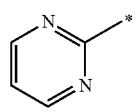

10-3
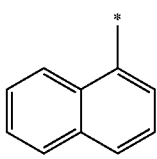

10-4
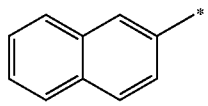

10-5
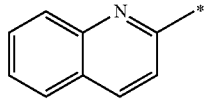

10-6
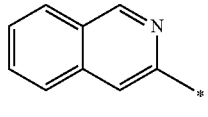

10-7
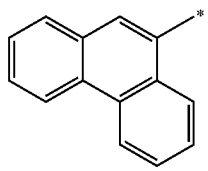

-continued

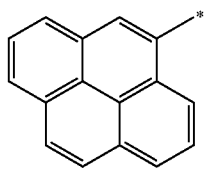
10-8 a moiety represented by

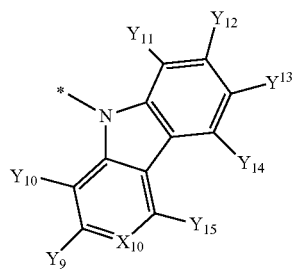

(where * is a binding site to a ring that comprises $X_7$ to $X_9$) is any one selected from Formulae 11-1 to 11-3:

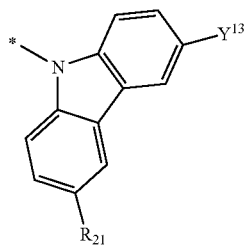
11-1

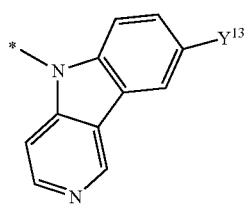
11-2

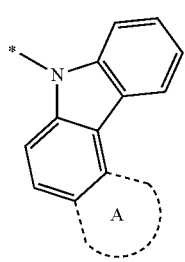
11-3 in Formulae 11-1 to 11-3:
$Y_{13}$ and $R_{21}$ are each independently selected from a hydrogen atom, a deuterium atom, and a phenyl group; and
ring A is selected from a benzene, a naphthalene, and an anthracene.

17. The organic light-emitting diode of claim 1, wherein the second material is any one selected from Compounds 49 to 82:

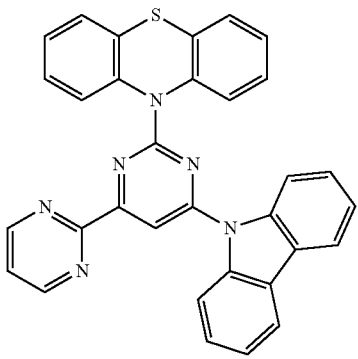
49

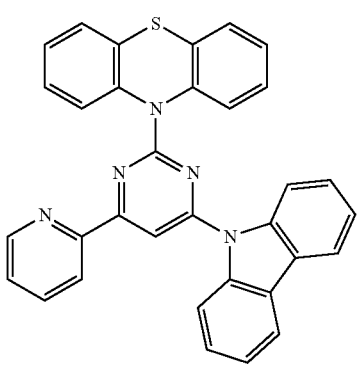
50

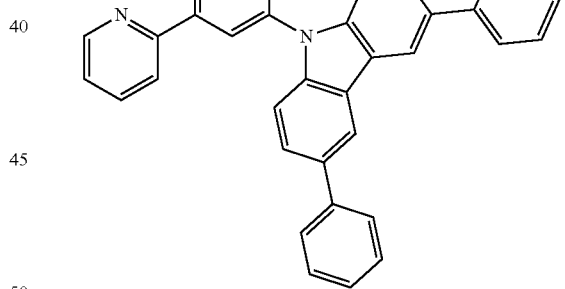
51

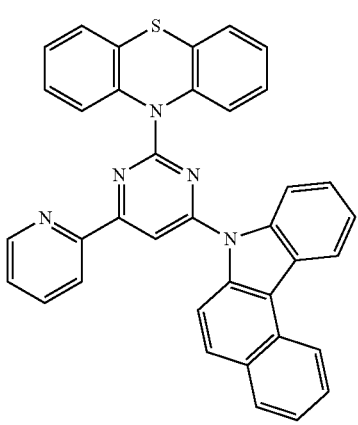
52

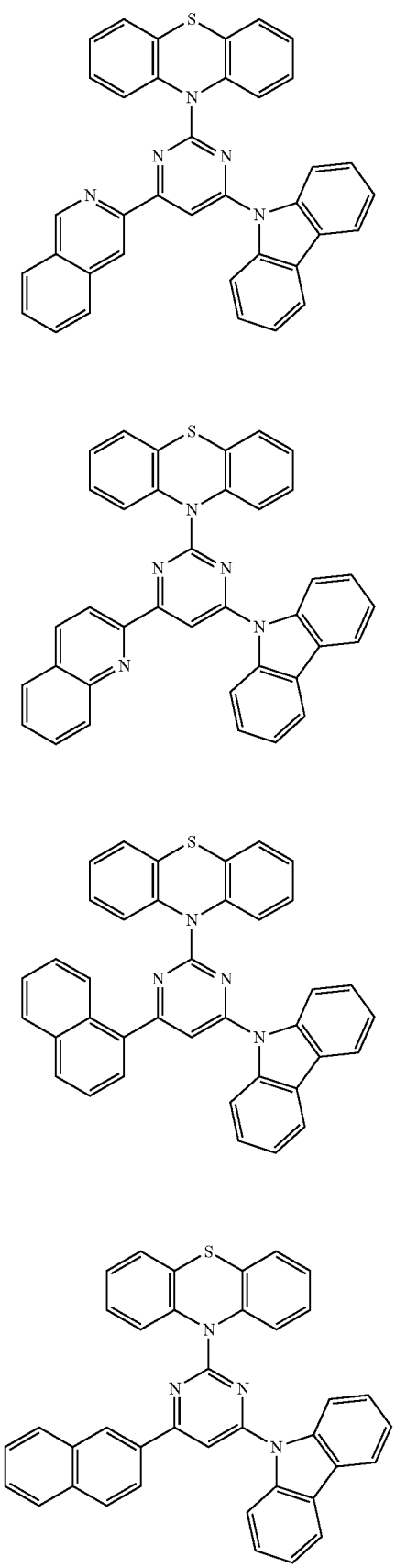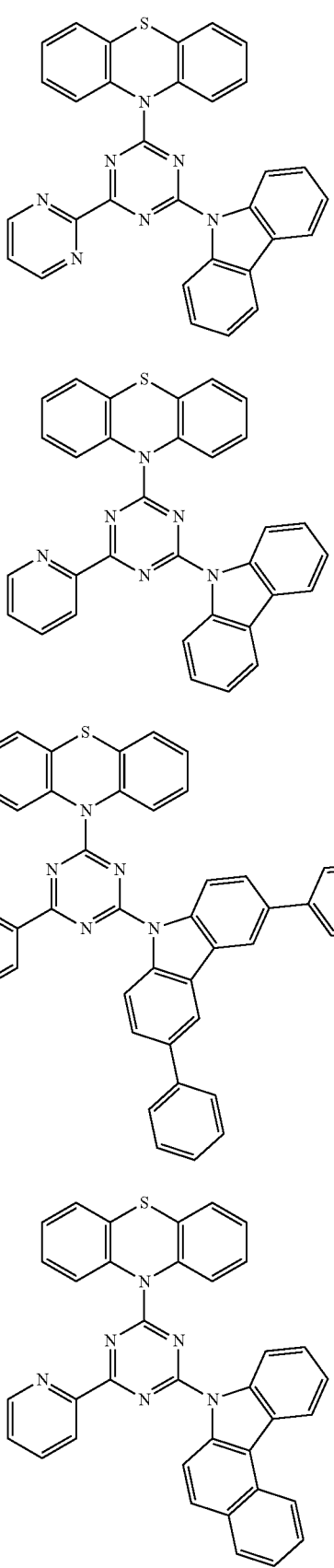

-continued
61
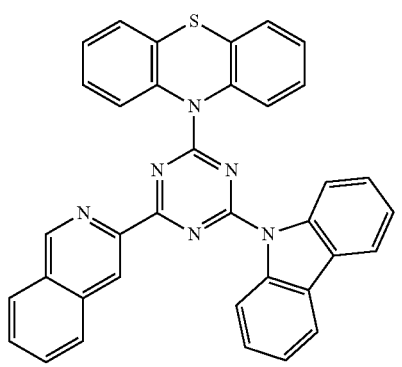
62
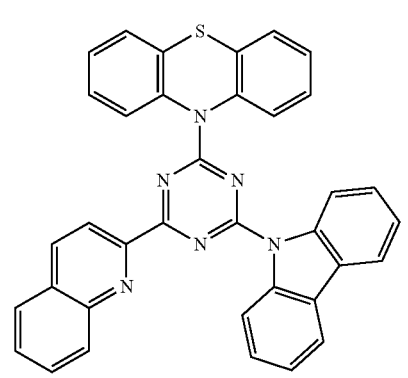
63
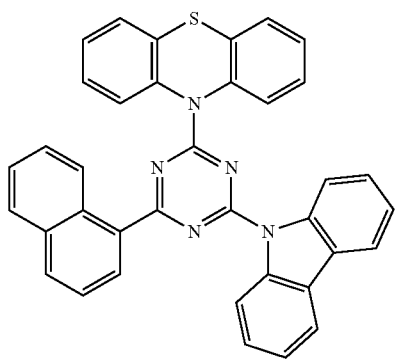
64
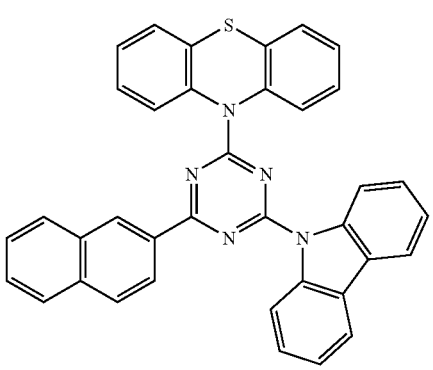
-continued
65
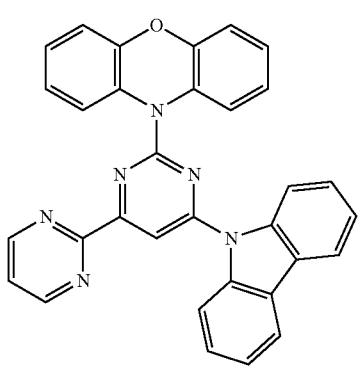
66
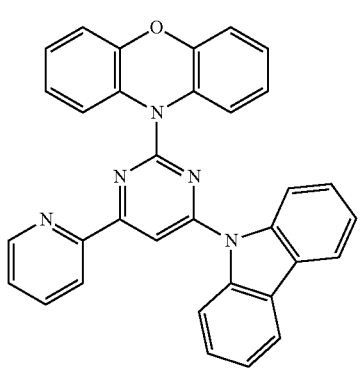
67
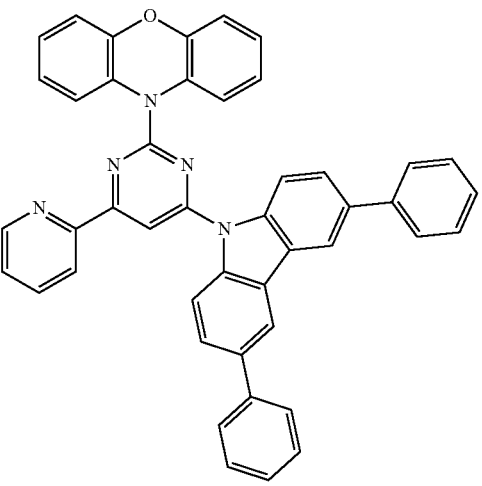
68
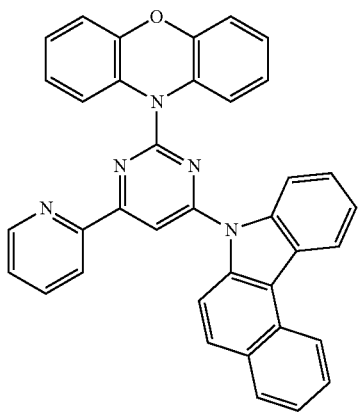

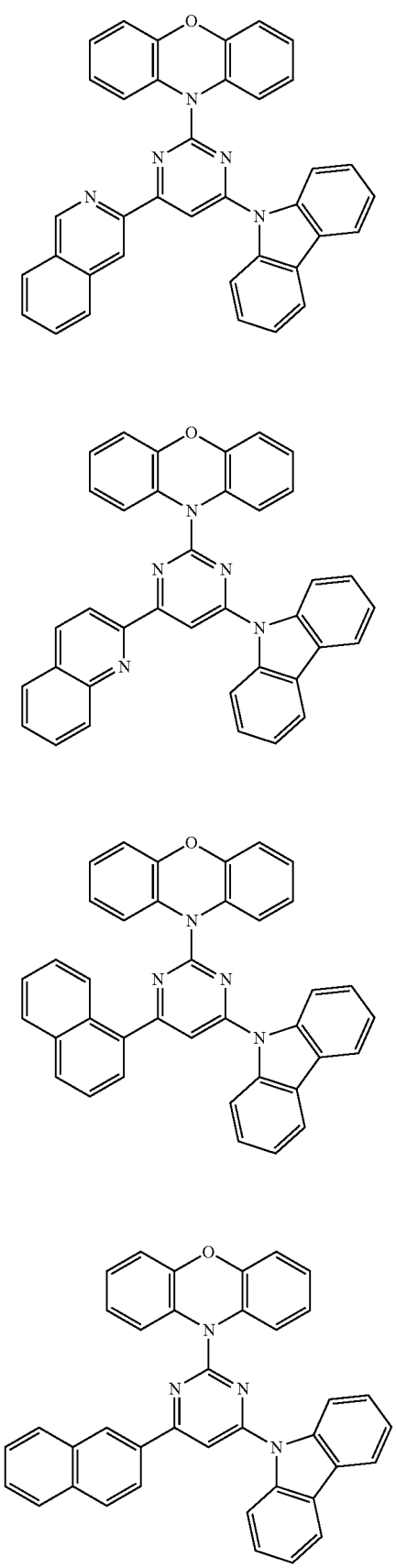
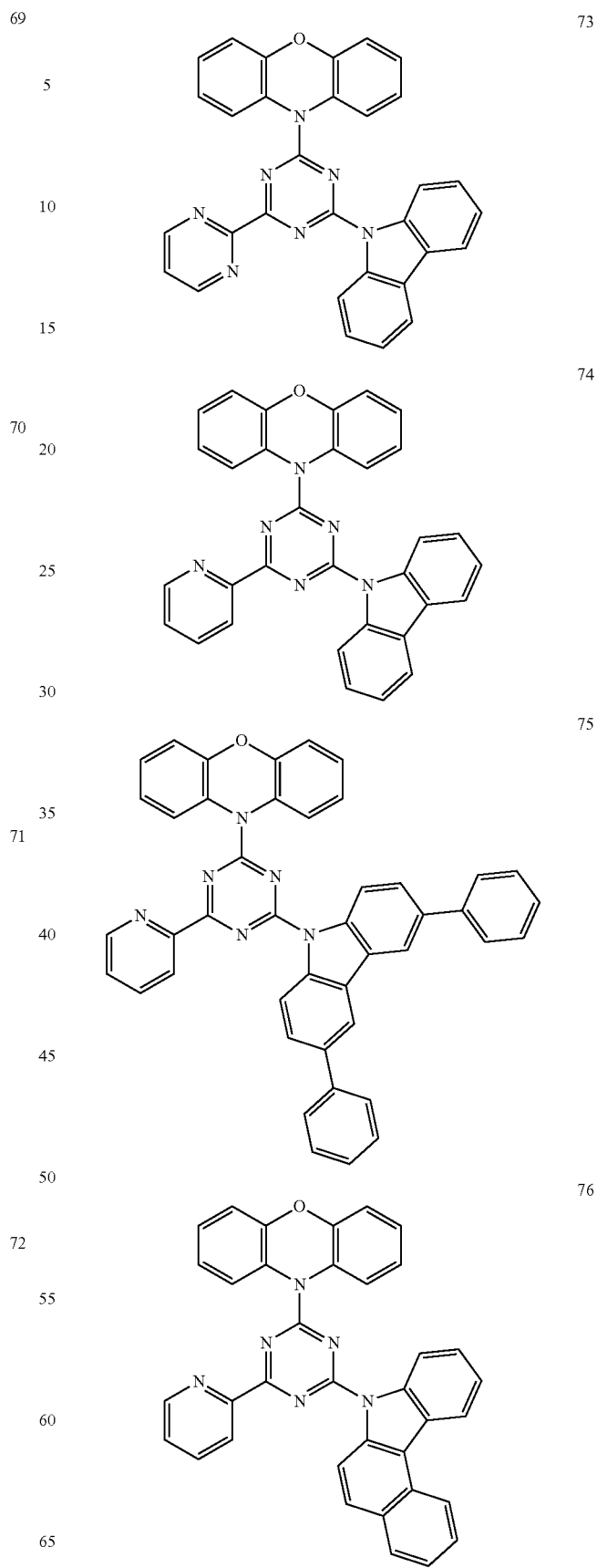

119
-continued

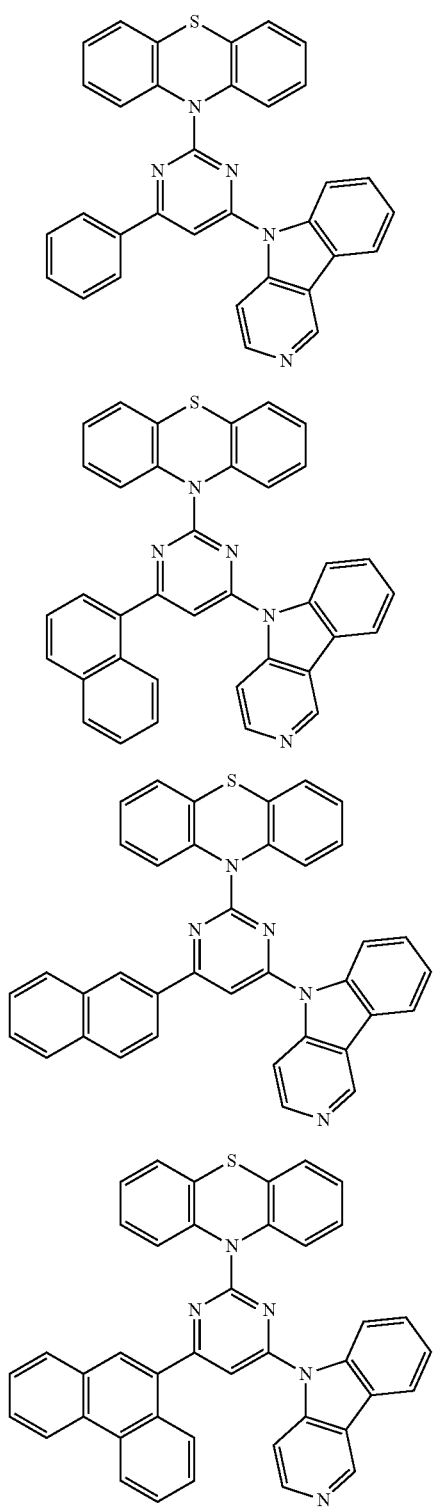

77

78

79

80

120
-continued

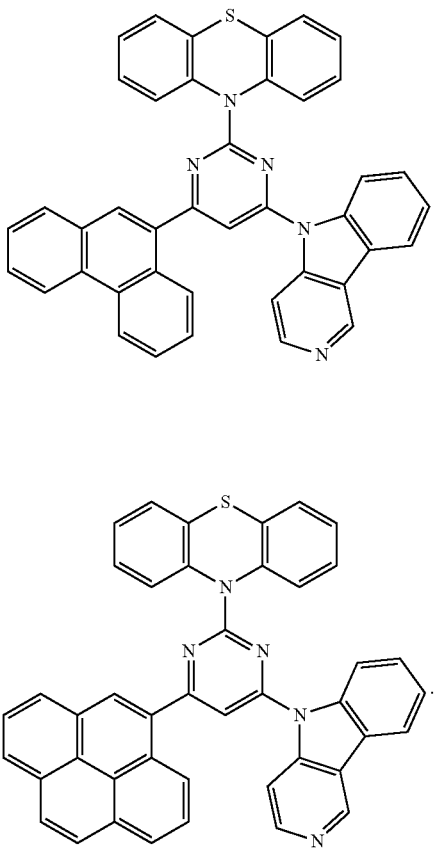

81

82

18. The organic light-emitting diode of claim 1, wherein the organic light-emitting diode comprises at least one layer selected from a hole injection layer, a hole transport layer, a functional layer having both hole injection and hole transport capabilities, a buffer layer, and an electron blocking layer, between the first electrode and an emission layer, and further comprises at least one of a hole blocking layer, an electron transport layer, and an electron injection layer, between the emission layer and the second electrode.

19. The organic light-emitting diode of claim 1, wherein the first material and the second material exist on an emission layer of the organic light-emitting diode.

20. The organic light-emitting diode of claim 19, wherein the first material and the second material are vacuum co-deposited.

* * * * *